(12) United States Patent
Cherian

(10) Patent No.: US 9,459,056 B2
(45) Date of Patent: Oct. 4, 2016

(54) SPRDR—HEAT SPREADER—TAILORABLE, FLEXIBLE, PASSIVE

(76) Inventor: Gabe Cherian, Sun Valley, ID (US)

( * ) Notice: Subject to any disclaimer, the term of this patent is extended or adjusted under 35 U.S.C. 154(b) by 864 days.

(21) Appl. No.: 13/602,156

(22) Filed: Sep. 1, 2012

(65) Prior Publication Data

US 2013/0199770 A1 Aug. 8, 2013

Related U.S. Application Data

(60) Provisional application No. 61/530,930, filed on Sep. 2, 2011.

(51) Int. Cl.

| H01L 23/367 | (2006.01) |
|---|---|
| H01L 23/373 | (2006.01) |
| F28F 3/00 | (2006.01) |
| F28F 3/02 | (2006.01) |
| F28D 15/02 | (2006.01) |
| H01L 23/427 | (2006.01) |

(52) U.S. Cl.
CPC ............. *F28F 3/00* (2013.01); *F28D 15/0275* (2013.01); *F28F 3/02* (2013.01); *F28F 3/022* (2013.01); *H01L 23/367* (2013.01); *H01L 23/427* (2013.01); *F28F 2255/02* (2013.01); *H01L 2224/45147* (2013.01); *H01L 2224/48091* (2013.01); *H01L 2924/01015* (2013.01); *H01L 2924/15311* (2013.01)

(58) Field of Classification Search
CPC . H01L 23/367; H01L 23/373; H01L 23/433; H01L 23/427; H01L 23/3733; H01L 23/3736; H01L 23/3737; H05K 7/2039; H05K 7/20454; F28D 15/0266; F28D 15/0275; F28F 2255/02; F28F 2265/26; F28F 2013/005

USPC ....... 165/80.2, 80.3, 81, 82, 104.21, 104.33, 165/185; 361/702, 709–711, 688

See application file for complete search history.

(56) References Cited

U.S. PATENT DOCUMENTS

| 5,159,531 A * | 10/1992 | Horvath et al. | 361/704 |
|---|---|---|---|
| 5,298,791 A * | 3/1994 | Liberty et al. | 257/707 |
| 6,407,922 B1 * | 6/2002 | Eckblad et al. | 361/704 |
| 6,411,513 B1 * | 6/2002 | Bedard | 361/704 |
| 6,462,952 B1 * | 10/2002 | Ubukata et al. | 361/719 |
| 6,755,240 B2 * | 6/2004 | Werninger | 165/46 |
| 6,774,482 B2 * | 8/2004 | Colgan et al. | 257/712 |
| 6,873,043 B2 * | 3/2005 | Oman | 257/703 |
| 7,085,135 B2 * | 8/2006 | Chu et al. | 361/704 |
| 7,532,475 B2 * | 5/2009 | Michel et al. | 361/704 |
| 7,743,763 B2 * | 6/2010 | Grip et al. | 126/569 |

(Continued)

*Primary Examiner* — Len Tran
*Assistant Examiner* — For K Ling

(57) ABSTRACT

New heat spreaders are proposed to connect high power, high heat generating electronic devices to their downstream heat dissipating cooling components. First, the spreaders distribute the high heat flux over a wider surface area, thus reducing the flux to levels more easily handled by the downstream cooling system. Second, the spreaders incorporate flexible columns or elements to join the electronic devices to the main body of the spreader, so as to negate the undesirable effects of CTE mismatch. Columns with a higher standoff distance between the components are more flexible than a direct flat interface attachment between the heat source and the heat sink, and will have less chance of delaminating. Several embodiments are proposed and can be used in appropriate situations. The heat spreaders can be helpful in harsh environments and in high heat generating applications, such as spacecraft, satellites, as well as land locked high power computer systems.

28 Claims, 81 Drawing Sheets

(56) References Cited

U.S. PATENT DOCUMENTS

Figure 1:
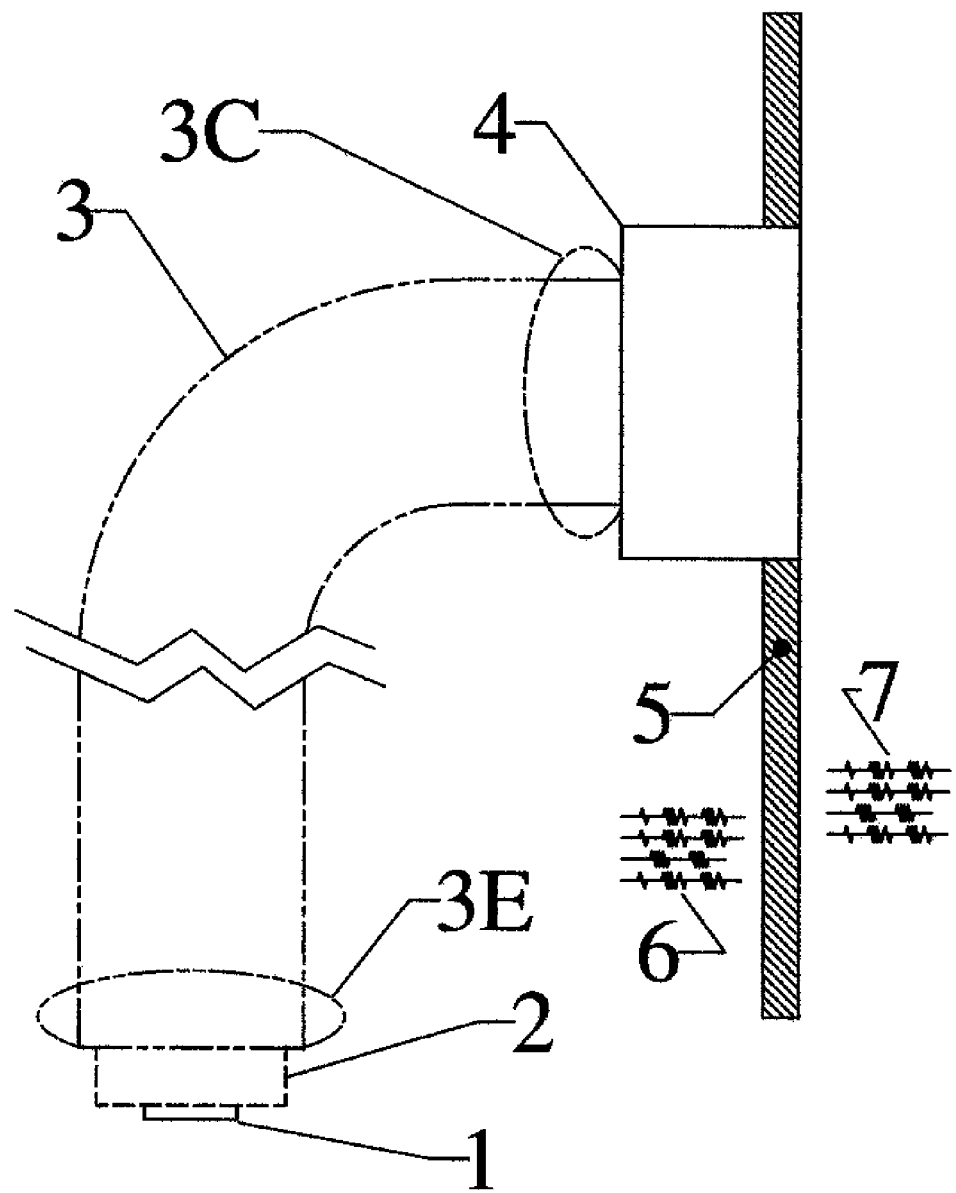

| | | | |
|---|---|---|---|
| 8,221,667 B2 * | 7/2012 | Yao et al. | 264/261 |
| 8,289,712 B2 * | 10/2012 | Holahan et al. | 361/710 |
| 2006/0278901 A1 * | 12/2006 | Dangelo et al. | 257/276 |
| 2009/0039499 A1 * | 2/2009 | Chainer | 257/706 |
| 2009/0244852 A1 * | 10/2009 | Okada et al. | 361/721 |
| 2010/0091463 A1 * | 4/2010 | Buresch et al. | 361/718 |
| 2010/0124025 A1 * | 5/2010 | Yamaguchi et al. | 361/708 |
| 2010/0200208 A1 * | 8/2010 | Cola et al. | 165/185 |
| 2010/0246136 A1 * | 9/2010 | Yu et al. | 361/710 |
| 2012/0106111 A1 * | 5/2012 | Mazzochette et al. | 361/783 |
| 2013/0322019 A1 * | 12/2013 | Gasse et al. | 361/709 |

* cited by examiner

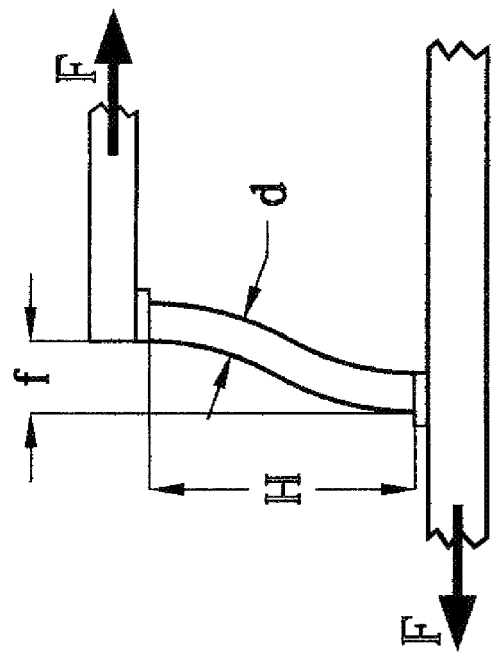
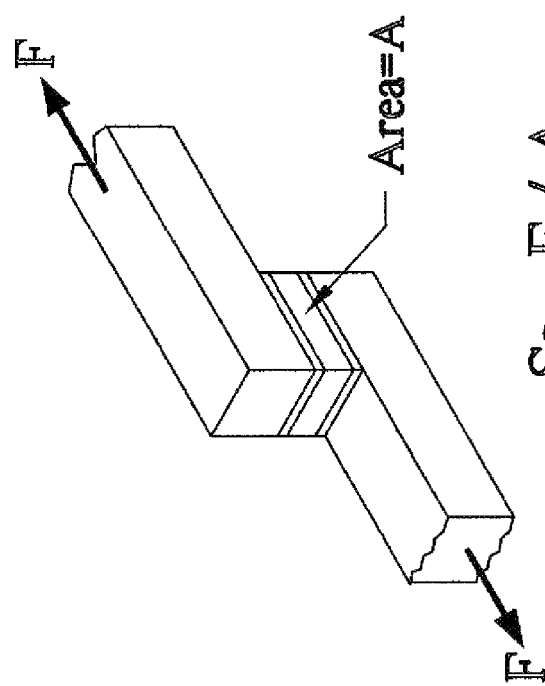
FIG. 7

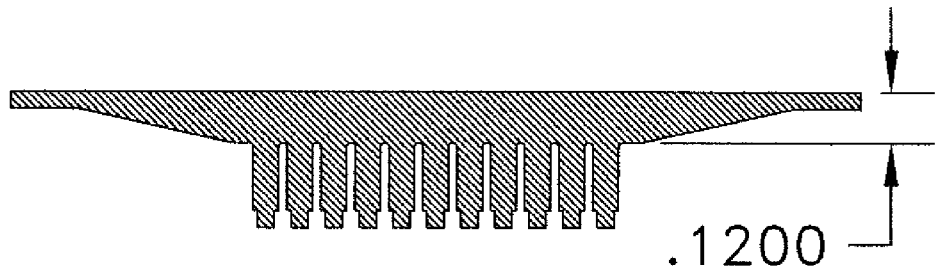
FIG.15-A- NO BELLY
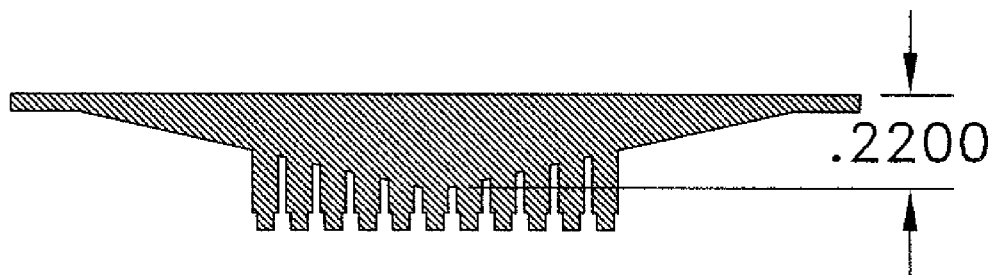
FIG.15-B- SMALL BELLY
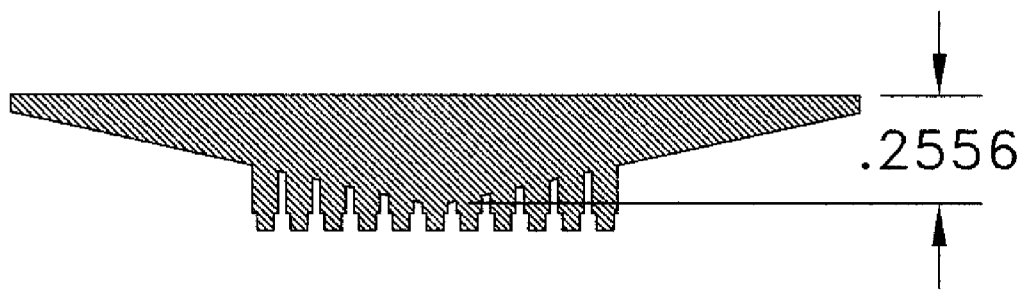
FIG.15-C- BIGGER BELLY
FIG. 15

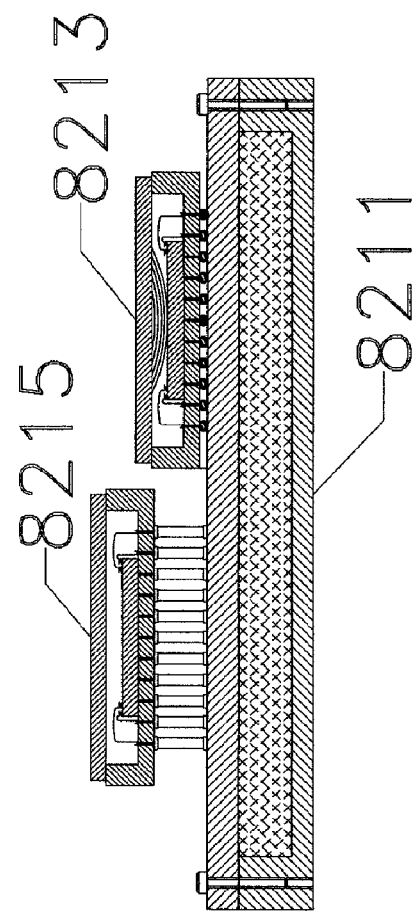
FIG. 82-A
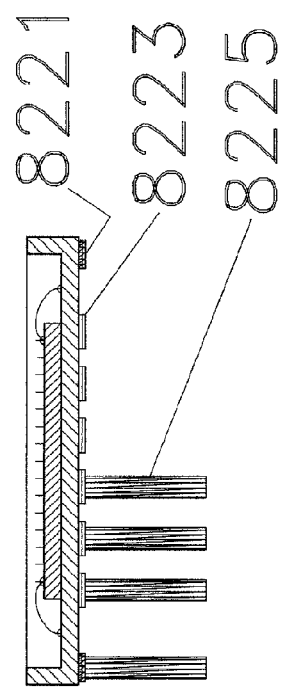
FIG.82-B

SPRDR—HEAT SPREADER—TAILORABLE, FLEXIBLE, PASSIVE

CROSS-REFERENCE TO RELATED APPLICATIONS

This present application is based on Provisional Patent Application Ser. No. 61/530,930, filed on Sep. 2, 2011, title "HEAT SPREADER-TAILORABLE, FLEXIBLE, PASSIVE,", which will be referred to as Ref1, AND this present application claims all the benefits of this Provisional Patent Application No. 61/530,930.

FEDERALLY SPONSORED RESEARCH OR DEVELOPMENT

N/A

1—BACKGROUND 1.1—Technical Field

The inventions herein relate to Cooling Systems, especially to cooling of electronics systems, and especially to cooling of high power electronic packages and components, which generate a lot of heat, which needs to be spread, removed and dissipated.

More particularly, the inventions relate to situations, where the heat flux (heat per unit area) coming out of the heat source is excessive, i.e. higher than what the heat dissipation/cooling system can handle. In such situations, it is recommended to use a so-called "heat spreader" to distribute or spread the heat over a larger surface area, thus reducing the heat flux down to manageable (lower) levels. So, the present inventions relate to such heat spreaders and related devices. This can be interpreted as the "Heating Spreading Problems."

In another particular area, the inventions herein relate to cooling situations, where the components are made of different materials, which have different Coefficients of Thermal Expansion (CTEs), in which case, it is said that the components, especially the heat source and the heat sink, have a CTE mismatch. This CTE mismatch is considered as one of the major Interface Problems in Cooling Systems.

All the above is addressed by the present inventions.

1.2—General Problem 1.2.1—Excessive Heat Flux and Related Heat Spreaders.

In certain cases, the heat flux (heat per unit area) coming out of the heat source, such as an electronic package, is excessive, i.e. higher than what the heat dissipation/cooling system can handle, and can affect the capability of the Cooling System in certain particular situations. A good example, is when the heat flux is in the range of 300 W/cm2. In such situations, it is desirable, if possible, to distribute or spread the heat over a larger surface area, thus reducing the heat flux to manageable levels. This is done sometimes by using "Heat Spreaders".

1.2.2—CTE Mismatch

One of the most frequently used methods for cooling electronic components is to attach a heat sink on top of the component, which we would call the heat source. Also most frequently, the components are made of different materials, having different Coefficients of Thermal Expansion (CTEs). For example, the source of the high amount of heat could be a Chip Carrier (CC), which is most frequently made of Ceramic, which has a CTE of ~6 PPM/K. Then a heat sink is attached to the top of the CC to conduct the heat out from the CC and to dissipate that heat into the surrounding environment or to conduit that heat to some central cooling system. The heat sink could be made of Aluminum (CTE of 23 ppm/K) or of Copper (CTE say 17 ppm/K). After the heat sink is attached to a heat source, we can say that the components, i.e. the heat source and the heat sink, have a CTE mismatch.

If there is a CTE mismatch, as described above, then problems can arise and the cooling effect can be compromised and could fail.

1.2.3—Interfaces, including TIMs

Frequently in situations as those mentioned above, where a heat sink is used to dissipate heat generated from an electronic device, a Thermal Interface Material (TIM) is applied between the source and the sink. TIM can act as a filler, to compensate for irregularities in the surfaces of the source and/or the sink, and can act as a "GLUE", as well.

Sometimes the heat sink is soldered or brazed or otherwise permanently attached to the heat source.

1.2.4—Composite Materials

One of the recent popular trends and approaches to solve the above problems is to use certain "COMPOSITE MATERAILS", which have CTE values that match, as close as possible, the CTE of the heat source and/or the heat sinks. See for example, Section 1.5.5 OTHER RELATED THIRD PARTY REFERENCES: REF. 1—Zweben, C.; "Ultrahigh-thermal-conductivity packaging materials,", further down in this specification. Moreover, if the electronic components and systems in question are to be used in space vehicles, then the weight of the materials becomes another issue to contend with.

1.3—Specific Problem Cases

It seems that the Air Force and NASA have anticipated that they could encounter such situations in the future and they issued two SBIR solicitations, to prepare for any possibilities.

In 2011, the Air Force has issued a solicitation to try to get any interested, capable party to submit proposals to solve certain problems related to the above ones. It was the Air Force SBIR Solicitation Topic Number: AF112-057, Title: Next-Generation Micro-Chip Carrier for Cooling of Satellite Payload Electronics.

A short time later, NASA issued a fairly similar SBIR solicitation, with fairly similar requirements.

After studying the solicitations requirements, I submitted a proposal to the Air Force and then later on, another proposal to NASA, offering almost similar solutions in both cases. I have not received any contract awards to implement the solutions, from neither parties.

Regardless of the contracts, the solicitations acted as a challenge and as an impetus for me and motivated me to come up with some solutions to the problem. The results were that I did come up with most of the inventions described in the present application and specification. And later on, I continued to work on the subject and came up with a thermal analysis, as will be described in the present specification.

I will summarize and paraphrase here below some highlights of, and excerpts from, the Air Force solicitation and requirements, and of my submitted proposal. I will concentrate on the points, which are relevant to the inventions in this application and specification.

1.4—Highlights from the Air Force SBIR Solicitation 1.4.1 The solicitation described the problem basically as follows. [I will paraphrase and re-order some sections and use only relevant excerpts and will leave out certain things that are not technical in nature.

"In order to provide the U.S. warfighter with the most capable satellite communications, payload processing power is expected to grow in density for the foreseeable future, with higher gate counts producing increased levels of waste heat. The anticipated increase in heat flux generated by next-generation electronics components is driving the need for greater heat spreading capability in the carriers to which these high-heat flux chips are mounted.

The specific objectives of the research topic are to take care of the problem below, by satisfying the following requirements:

PROBLEM: Current conduction-based heat spreading devices do not provide adequately high conductance in the x, y, and z directions and an adequate CTE-match to meet the requirements of future electronics components.

REQUIRED: Therefore, the following is required:
1. The proposed carrier should be a two-phase device that allows efficient heat transfer at the evaporator and condenser surfaces. Two-phase micro-loop heat pipe and heat pipe devices should be considered.
2. The design of the spreader should be scalable and would ideally be versatile enough to be applied to a variety of packaging configurations; however, proposers may select a single relevant packaging style if necessary.
3. Proposed solutions must have high-reliability and maintenance-free operation for lifetimes exceeding ten years.
4. The device must also be compatible with the space environment and conform to space-qualification requirements, including high vacuum, microgravity, radiation, atomic oxygen, low outgassing and high launch loads.

1.4.2 The goal of the SBIR research is/was basically the following:

Develop innovative chip carrier cooling solution that efficiently reduces heat flux levels generated by high-power satellite components to levels manageable by the spacecraft's thermal control system.

The ultimate goal of this project is to develop an innovative spreader that maximizes the capacity of the carrier to reduce the heat flux for efficient transport of waste heat to the spacecraft primary thermal management system. This spreader must maintain a sufficient coefficient of thermal expansion (CTE) match with foreseen high-heat flux devices that may be mounted to it.

1.4.3 Technical Objectives:

Technical Objective 1: Spread heat fluxes from >300 W/cm$^2$ (objective) or >100 W/cm$^2$ (threshold) at the chip to (<10 W/cm$^2$) levels manageable by primary thermal control system Technical Objective 2: Minimize the temperature drop between the chip and primary thermal control system.=Minimize chip temperature.

Technical Objective 3: Survive temperatures from −60 C to 60 C; operate in temperatures from −20 C to 50 C.

Technical Objective 4: Require zero input power for operation and control.

Technical Objective 5: Have tailorable CTE from 4-17/C (objective) or a CTE that sufficiently matches foreseen high heat flux devices (~6-8 ppm/C).

1.4.4 My interpretation of the Key Phase I Technical Objective was (REPHRASED):
1. Develop innovative chip carrier cooling solution, that efficiently
2. reduces heat flux levels generated by high-power satellite components
3. to levels
4. manageable by the spacecraft's thermal control system.

Also I visualized that the problem looks more of less as illustrated roughly in FIG. 1

The way I saw it, once we achieve these above goals and objectives, then all the rest of the objectives will be satisfied, almost automatically. I believe that the reader will agree, after you read the rest of my present specification.

1.5 Prior Art 1.5.1 Many solutions to this problem have been invented and patented.

I made an extensive patent search and did not find any solution that is similar to my present inventions or embodiments.

The closest Prior Art that I found is in U.S. Pat. No. 6,935,409 to Parish I V et al. However, Parish prior art does not teach over my present inventions here.

1.5.2 On the other hand, I have prior art myself in certain areas, that can help in solving the present problem. I will utilize some of this prior art, as a spring board, to solve the present problems, and then I will add a few new novel concepts, as well.

1.5.3 Related Prior Art Patents, by Gabe Cherian et al:
1. U.S. Pat. No. 4,664,309, "CHIP MOUNTING DEVICE", May 12, 1987, Gabe Cherian, Co-Inventor, Raychem Corporation, Menlo Park, Calif.
2. U.S. Pat. No. 4,705,205, "CHIP CARRIER MOUNTING DEVICE", Nov. 10, 1987, Gabe Cherian, Co-Inventor, Raychem Corporation, Menlo Park, Calif.
3. U.S. Pat. No. 4,712,721, "SOLDER DELIVERY SYSTEMS", Dec. 15, 1987, Gabe Cherian, Co-Inventor, Raychem Corporation, Menlo Park, Calif.
4. U.S. Pat. No. 6,884,707, Apr. 26, 2005, Title: INTERCONNECTIONS [Non-Wicking Connecting Column(s)], Gabe Cherian, Inventor.
5. U.S. Pat. No. 7,196,402, Mar. 27, 2007, Title: Interconnections [Packages with Oriented Leads], Gabe Cherian, Inventor.
6. U.S. Pat. No. 7,433,201, Oct. 7, 2008, Title: Oriented connections for leadless and leaded packages [Oriented Solder Columns, or Oriented Starved Columns], Gabe Cherian, Inventor.
7. U.S. Pat. No. 7,901,995, Mar. 8, 2011, Title: Interconnections Resistant To Wicking., Gabe Cherian, Inventor.
8. U.S. Pat. No. 7,944,028, May 17, 2011, Title: TFCC™ and SWCC™ Thermal Flex Contact Carriers, Gabe Cherian, Co-Inventor.

1.5.4 Related Reference Papers, by Gabe Cherian et al:
1. Cherian, Gabe, "Use of Discrete Solder Columns to Mount LCCC's on Glass/Epoxy Printed Circuit Boards", Raychem Corporation, Menlo Park, Calif.; 4th Annual International Electronics Packaging Conference, Baltimore, Md., Oct. 29-31, 1984.
2. Cherian, Gabe, "Solder Columns for Surface Mounting of Leadless Ceramic Chip Carriers on Glass/Epoxy Printed Circuit Boards", Raychem Corporation, Menlo Park, Calif.; ISHM '85, 1985 International Symposium on Microelectronics, Anaheim, Calif., Nov. 11-14, 1985.

3. Cherian, Gabe; Wynn, Craig; White, Harry, "New Solder Column Alloy improves Reliability of Chip Carrier Assemblies", Raychem Corporation, Menlo Park, Calif.; 1986 SAMPE, Seattle, Wash., 18th International SAMPE Technical Conference, Oct. 7-9, 1986.
4. Cherian, Gabe, Cherian Enterprises, Sun Valley, Id.; "BGA MOUNTING USING IMPROVED SOLDER COLUMNS", IPC Printed Circuits EXPO 2003, Long Beach Center, Long Beach, Calif., Mar. 23-27, 2003.
5. Gabe Cherian, Cherian Enterprises, Sun Valley, Id., "Higher Reliability Oriented Plastic Packages", IPC ECWC10 Conference, IPC Printed Circuits Expo®, SMEMA Council APEX® and Designers Summit 05, Anaheim, Calif., February 2005.
6. Cherian, Gabe, Cherian LLC, Sun Valley, Id.; "Fighting the Undesirable Effects of Thermal Cycling", IPC APEX EXPO 2010, Las Vegas, Nev., Apr. 8, 2010.

1.5.5 Other Related Third Party References:

REF. 1—Zweben, C.; "Ultrahigh-thermal-conductivity packaging materials," Semiconductor Thermal Measurement and Management Symposium, 2005 IEEE Twenty First Annual IEEE, vol., no., pp. 168-174, 15-17 Mar. 2005.

REF 2 Heat Pipes, Theory, Design and Applications, by David Reay and Peter Kew, BH Butterworth-Heinemann/ Elsevier, Fifth Edition, 2006.

REF 3 Spacecraft Thermal Control Handbook, Volume 1: Fundamental Technologies, by David G. Gilmore, Editor, The Aerospace Press, 2002.

REF 4 Space Mission Analysis And Design, by James R. Wertz and Wiley J. Larson (editors), Space Technology Library, Space Technology Series, Third Edition, Microcosm Press and Springer, 1999.

1.6 Analysis of the Problem and its Sources—Interfaces and Materials 1.6.1 I am including in this specification a number of drawings, which illustrate some of the basic concepts that I would like to propose as solution to the present problem in general, and to the specific problem described in this Air Force Research Topic solicitation. First I will describe the present existing way of assembling the components, and which is really the source of the problem, the way I see it. And then I will describe my proposed solution(s).

First I will describe the present existing way of assembling the components, the way I see it, and which seems to be the major possible source of the problem. And then I will describe my proposed solution(s) in later sections of this specification.

1.6.2 Please refer to FIG. 1. The major existing problem boils down to the fact that it is created by the "interfaces" (2) between the source of heat (1), which is the chip in its chip carrier, and between the heat drain or the heat sink (3), which includes the heat pipes, loop heat pipe, etc (LHP) (3), which then transfers the heat to the satellite prime thermal control system (TCS) (4). It is like a chain link effect.

Usually, the so-called conventional approach includes a component, usually called Thermal Interface Material (2), made of some good thermal conductive material, which gets attached to the top surface of the chip carrier [CC] (1), to take the heat away from it and pass it on to the next transfer device (3), which in this case will most probably be, and seemingly is the preferred method, which is to use some sort of heat pipe, loop heat pipe, or such two-phase heat transfer device. I will refer to the all of those as the Loop Heat Pipe(s) [LHP] (3).

1.6.3 So the chain so far looks like this. We have the CC (link #1), sending the heat to the TIM (link #2), which send it to the LHP (link #3). We could extend the chain to the satellite prime thermal control system (TCS) (4), if we want to, but I will limit the discussion here to these first links only.

1.6.4 Now, we can see that we could have a problem at the interfaces between link #1 and link #2 and between link #2 and link #3, and of course similarly down the line to the TCS, if there are any more interfaces in the TCS system.

1.6.5 Each one of these interfaces can have a number of negative effects.

1. The surfaces of these links in the chain, especially the heat source (1) and the heat sink (3), are not perfectly flat. They usually have some irregularities, hill and valleys, etc. If we try to hold one link against the next, we will have some air gaps, which will hinder the smooth flow of heat from one link to the other. So, the common procedure is to insert a Thermal Interface Material (TIM) (2) in between, where this TIM usually is a relatively soft material, which can conform and fill these gaps to create a more intimate surface to surface contact, so as to improve the transfer of heat. In addition, the TIM is usually chosen to be a good heat conductor, or may contain other materials in it, which in themselves are good heat conductors, and which can transfer the heat more easily. All this is done, so as to hopefully have less thermal resistance to the flow of heat.

2. Now, we have a first interface between the starting (upstream) link (1) and the TIM (2), and then a second interface between the TIM (2) and the second (downstream) link (3).

3. But this way, now we have essentially doubled the number of interfaces. See the effect of that later down below.

4. Now back to the interfaces. At every interface, we "face" [no pun intended] an important problem. Most probably, the materials of the links in the chain are different, and each one of these materials has its own Coefficient of Thermal Expansion CTE. And more often than not, these CTEs have different values. And this is the next critical issue. We know what it is.

5. When the links in the chain get heated or cooled, they will expand or shrink at different rates. So, we will have some differences in their length, along the interface surfaces between them. Let's visualize now the result of such linear differential.

6. Delamination at the interfaces due to excessive shear stresses

I will digress here and try to explain some of the key factors that affect cases, where two components are attached together and the potential problem, mainly the delamination, that can result from that.

When two components are attached to each other, to create a laminate, e.g. an Electronic Integrated Circuit Package (ICP) and a Printed Circuit Board (PCB), or a heat source and its heat sink, where these two attached components are made out of two different materials, and where each one of these two materials have its own respective and different Coefficient of Thermal Expansion (CTE), i.e. where we say that the two components have a CTE mismatch, then we may have problems, when the laminate temperature changes. When we change the temperature of the components, they will expand or contract at different rates. More generically, we can say that they will have different linear deformations, where their length will change, based on the magnitude of the temperature change, and on their individual initial length, on their individual CTE.

Figure 2:
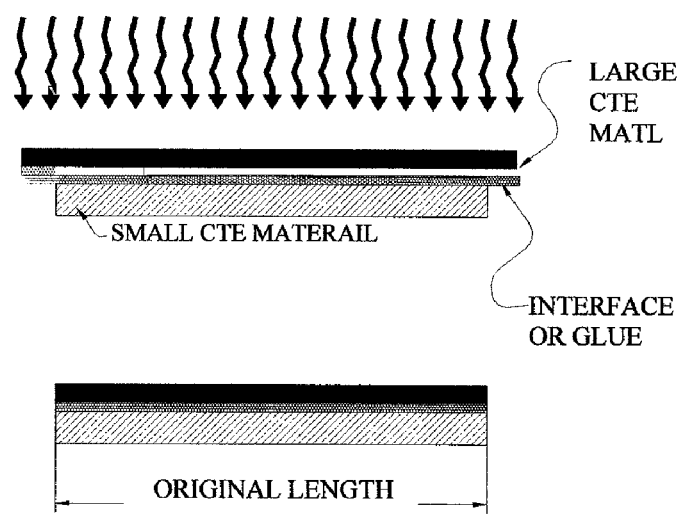

FIG. 2 illustrates such a condition. The lower figure shows a laminate, made out of two slab components, attached together with some sort of glue, applied at their interface. We will assume that the lower slab has a small CTE, while the upper slab has a larger CTE.

The lower figure shows the laminate at a rest condition, say at room temperature, where the two slabs have exactly the same length.

The upper figure shows what would happen if the laminate is heated to some high temperature. Both slabs will expand, but at different rates. The linear deformation of the upper slab will be larger than the linear deformation of lower slab, due to its larger CTE, as can be seen at the outer extremities of the slabs.

However, we have to keep in mind that the linear deformation is proportional to the original length of the components. So, towards the center of the slabs, the linear deformation is relatively small compared to the corresponding linear deformation near the end of the slabs. As a result, the "difference" between the linear deformations of the two slabs, will be small near the center of the slabs, compared to the "difference" near the ends of the slabs.

This "difference" in the linear deformation is very crucial.

When the slabs deform at different rates, then their surfaces along their interface will have to slide with respect to each other. This is true, only if the two slabs are free to slide and if the laminate is not allowed to warp or curl.

But if the two slabs are physically attached together, with a glue or the like, as it is shown in our case here, then this sliding action has to be absorbed by the glue holding the two slabs together. If the amount of sliding can be absorbed by the glue, then everything will be fine. The glue will be stressed, but if the stress is within the stress limit of the glue, then it is OK.

But if the magnitude of this sliding is more than what the glue can withstand, then the glue can rupture, break down, and fail.

In more scientific terms, we can say that the glue gets over-stressed.

And because of the geometry and configuration of the glue at this interface, then this kind of stress is called shear stress, mainly because the thickness of the glue is relatively small.

Figure 3:
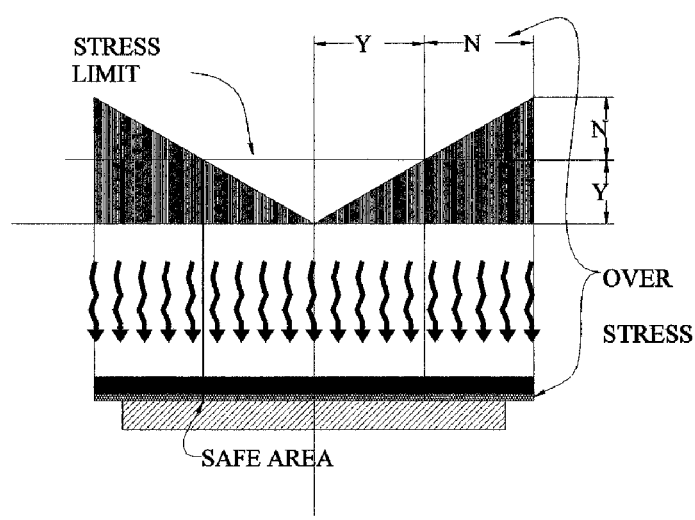

If we analyze the magnitude of the shear stress in the glue, we can find that the value of the shear stress can be represented by the triangular shape shown in FIG. 3.

The shear stress starts with a zero value at the exact center of the slabs. The shear stress will increase, linearly, as we go away from the center, in any direction, as represented by the graph, which in this case, looks like two triangles, with their smallest value being at the center of the slabs and which increases as we go out towards the edges of the slabs. So, at one point we will reach a stress level that corresponds to the max stress that the glue can withstand. Beyond that point, we should expect that the glue would break down, crack open and we would get some kind of failure, which ultimately will end up with a separation between the two slabs. The graph in FIG. 3 shows the good, safe range or zone as the areas marked "Y" for "YES" or safe, and the bad, dangerous area or zone as the areas marked "N" for "NO" or dangerous or overstressed.

Figure 4:
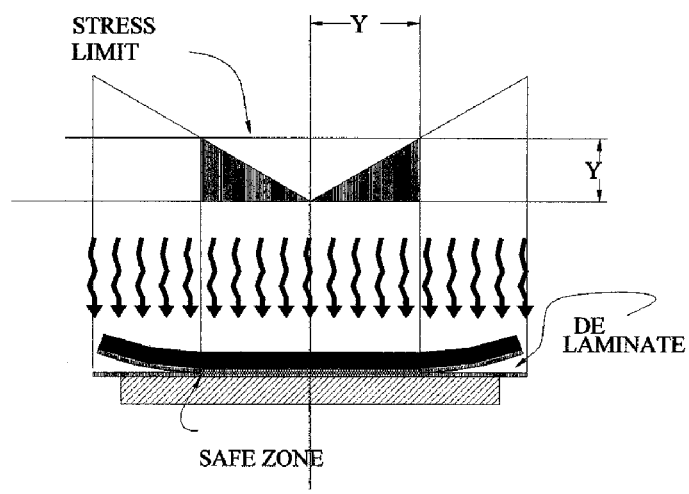

The most probable end result is illustrated in FIG. 4. The areas that were in the "N" zones in FIG. 3 will fail and eventually would delaminate. Those areas of the joint between the slabs may separate, may even curl up away from each other, and we could see that the slabs may pull away from each other, and may ultimately delaminate.

If we are relying on a set up like this to transfer heat from one of the components to the other, then with such a delamination, we will not get as much heat transfer as we would expect before such delamination.

7. Now, let's apply the above analysis to our present problem. Let's say, that the CC is made of Ceramic, CTE around 6 ppm/K, and that the HS right above it is made of Copper, CTE say 17 ppm/K. See FIG. 6 for a similar situation between a BGA and a PCB. This means that if their temperatures rise by one degree, the Copper HS will expand 17 ppm of its original length, while the ceramic CC will expand only 6 ppm of its same original length. This means that the copper will expand approx 3 times as much as the Ceramic CC. This means that the linear difference between the parts will be=17−6=11 ppm/K of the actual original length.

8. If the dimension of these two links is small, this 3-fold linear differential could be so minute, that it would hardly have any consequence. See the middle portion of the laminate in FIG. 3. But if we have a CC that is, say, over 1 cm on the side and if the temperature rises by, say, 50 C or 100 C, then we can start to see that the resulting linear differential can become more crucial. Why? Because one link will start to "slide" along their interface surfaces, with respect to the adjacent link, especially near the extremities of their length.

All this is true, assuming that the laminate is rigid enough, so that it would not "bend" or "warp", or that it is forcefully maintained in a straight line.

But, if the laminate is fairly thin and/or if it is allowed to flex, bend and/or warp, then it would curl upward or downward, according to the changes in temperature. It would act in a similar fashion as the sensing element in, say a room temperature controller.

So for our own present application, we will continue our analysis, assuming that the laminate will not flex or curl, but it will maintain its "straight" shape.

9. Near the center of the interface area, say within 2, 3, or even 4 mm, the sliding amount may still be small enough to be inconsequential, but once we go beyond that, it can start to create some problems. Of course, this would depend on the magnitude of the temp change, etc.

10. If the two links are, say, soldered together, and usually the thickness of the solder layer is fairly small, thin, then the solder "joint" can get overstressed. And bear in mind that the stresses in this case, i.e. the thin solder joint layer, are predominantly "shear" stresses. And the thinner the joint, the higher the shear stresses. See the left hand side figure of FIG. 7.

11. If the shear stress exceeds the ultimate limit, then we would get cracks in the solder joints and possibly would get open gaps. Hence, the heat flow and the heat transfer will decrease. Analogous to the conditions shown in FIGS. 3 and 4.

12. Also, if the stress is not that high, but if this condition gets repeated often and we get frequent thermal cycling, then the effect of such cumulative high shear stresses can reach a point, where the joint would exceed its fatigue limit, and the joint would fail. This means that the solder joint would now crack and create some gap(s) between the two links. And we get delamination between the two links, at least near the outside areas of the joint, where the shear stresses have exceeded the limits. And we're back to where we started, with gaps between the two links, which will affect/reduce the heat flow, etc, and the bad results will get worse.

13. So, another conventional way to overcome this potential problem situation is to insert the above mentioned TIM between the two links. And more often than not, the TIM works very well, and it reduces the air gaps, plus it can also act as a "glue" as well, besides being just a gap filler. But again, with large size CCs and with large thermal swings, we can get almost the same kind of cracks and delamination as explained earlier, but now they will be between the individual links and the TIM itself.

14. So, another way to overcome the general problem is to try to use materials for the two links, which have similar CTEs, or where the adjoining materials have CTE values that are as close to each other as possible. And this is the main effort and thrust of a lot of present research work, trying to find such materials, which first need to be good thermal conductors and at the same time, which would have CTEs that match closely the CTEs of the heat source, which is most frequently made of ceramic, and obviously, the CTEs—of the heat sink as well, which may have a different CTE. And in addition, if these materials are intended to be used in space applications, then their weight would be another big factor to consider.

15. So, experts, like Dr. Carl Zweben, the author of one of the referenced papers, see Ref #1 listed in section 1.5.5 "OTHER RELATED THIRD PARTY REFERENCES", above in the present specification and one of my intended consultants for the SBIR proposal, apply their efforts to find such materials. Fortunately, they did find quite a few of such materials, as listed in Dr. Zweben's papers and in so many other papers and articles on the subject. I can still use these materials in my proposed solutions, and they can enhance the advantages of my solutions, as will be seen down below.

16. Now, we ought to consider one more small potential source of problem, even with these special materials. Say, we make the HS out of Invar, which has a CTE of 6.5, practically identical to the ceramic's CTE of 6. We will still have an interface between it and the CC. This interface will have a certain thermal resistance, which will result in a temperature differential, say "Delta T" or DT. The effect of this DT is that the two links will be at a different temperature, hence they will expand or contract by a different amount. Here, somebody could say that I am splitting hairs. I know that I am. This is quite true, if the heat flux is relatively mild. But when we start to talk about a heat flux of 300 W/cm2 and over, then the difference in temperatures can start to be appreciable. And we could end up with similar delamination etc.

17. This above analysis will help us in finding the possible solutions. Please see down below.

1.7 Prior Art Work Related to CTE and Interface Problems.

1.7.1 Again, before I get into my proposed solution, let me described what I have done, over 25 years ago, to solve another problem, which is very much similar to the present one. Actually, it is identical to the present problem, except that it is "on the other side" of the Chip Carrier. It is BELOW the chip carrier instead of being above it.

1.7.2 Let's look at the general way we assemble such chip carriers (CCs) onto Printed Circuit Boards (PCBs). Please see FIGS. 5 and 6. Please refer also to the References, covering the CCMD papers and patents. Most probably, the CCs are like the BGAs, FIG. 5, which are the popular packages nowadays. Or they can be like the old Leadless Ceramic Chip Carriers (LCCCs), which were popular some 25-30 years ago. In both cases, when such a CC gets attached to a PCB, they get attached together with solder joints. These joints can start as solder paste, solder cream, applied to the pads of the PCB, or as solder balls, applied to the CC, as in FIG. 5, hence its name BGA, Ball Grid Array Package. Now, when the CC gets attached to the PCB, the resulting solder joints are usually short and stubby, as in the middle figure of FIG. 6. This is point #1 to keep in mind. Short and stubby.

Figure 6:
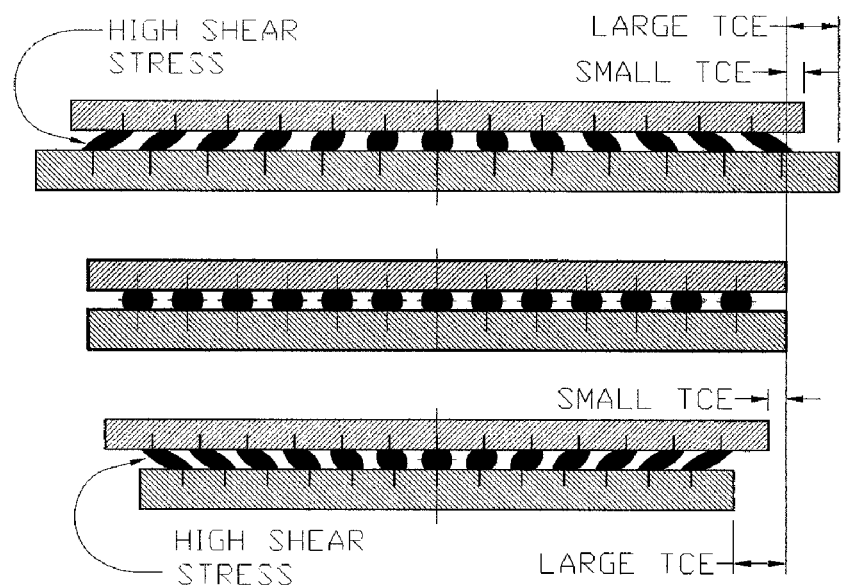

We also realize that the BGAs are usually made of ceramic, CTE around 6 ppm/K, while the PCBs are usually FR4 or the like, CTE around 18-24 ppm/K. This means that the PCB will expand or contract some 3-times to 4-times as much as the BGA, when their temperature would rise or fall. This is illustrated in FIG. 6. This is point #2 to keep in mind. Three to four time CTE mismatch.

1.7.3 So, what is the result of these two important points?

1.7.4 When such an assembly gets hot, as in the top figure FIG. 6, the PCB expands more than the BGA and the solder joints at the extreme ends of the row of joints will be deformed as shown. We will call this condition, the hot stress deformation, where the solder joints are deformed or pulled outwards.

When the assembly gets cold, the reverse happens, as in the bottom figure of FIG. 6, the PCB contracts/shrinks more than the BGA and the solder joints at the extreme ends of the row of joints will be deformed as shown. We will call this condition, the cold stress deformation, where the solder joints are deformed or pulled inwards, i.e. in the opposite direction of the hot stress deformation.

As the temperature cycles from hot to cold, the solder joints keep on getting stressed outwards and inwards, or pushed and pulled, at every temperature cycle. After a certain number of such temperature/thermal cycles, the cumulative stresses in the solder joints could reach, and eventually exceed, the ultimate fatigue stress of the material, and as a result, the joints fail 1.7.5 This is very similar to the present problem that we are facing with the Heat Sinks, which are ABOVE the Chip Carrier. The solder joints, BELOW the Chip Carriers, would get overstressed and ultimately could fail due to fatigue under shear. The interface between the Chip Carriers and the Heat Sink, ABOVE the Chip Carrier, would also get overstressed and ultimately could fail due to a similar fatigue under shear.

1.7.6 Very similar to the problem that we are facing with the Heat Sinks, ABOVE the Chip Carrier. The solder joints, BELOW the Chip Carriers, would get overstressed and ultimately could fail due to fatigue under shear, when they get thermally cycled.

1.8 Summary and Recap of Analysis Observation

So, now we can summarize what we have observed and learned so far:

The problem that we are facing is affected primarily by the three following facts, which we knew since the beginning anyway:

1. Interfaces; keep them to a minimum.
2. CTE mismatches; keep in mind their undesirable effect.
3. Material characteristics, including CTE, as stated above, plus their thermal conductivity and their mechanical physical characteristics.

1.9 Related Prior Art Success Story/Accomplishment:

1.9.1 Around 1980-82-84, while working at Raychem Corporation, Menlo Park, Calif., I invented and developed a solution to this LCCC on PCB problem, which existed already since that time and earlier before.

1.9.2 Please see items 1, 2, and 3 in Section 1.5.3 and items 1, 2, and 3 in section 1.5.4. Please refer to the papers #1-4 and #6 listed under "RELATED PRIOR ART" section, further down below in this present specification, as well as the patents #7, 8 and 9.

1.9.3 We called my solution, CCMD, for "Chip Carrier Mounting Device".

Figure 5:
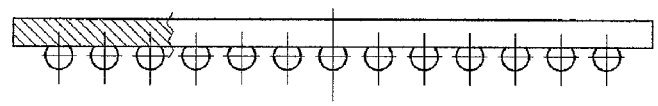

1.9.4 Please see FIG. 5.

1.9.5 Later, it was called "Solder Columns".

1.9.6 The "column" concept was known earlier. IBM solder columns had paved the way, but with my CCMDs, I have introduced an additional "twist" onto the columns and CCMD became successful and popular. Again, see the figures in the References.

1.9.7 CCMDs were very successful and have sold in the multi-million Dollars range. An early order for the product was for $4.8 Million Dollars, from ITT for the Army SINCGARS radio, around 1983-84.

Later on, the same columns were used to attach BGAs on top of PCBs.

In 1996, Winslow Automation, San Jose, Calif. acquired the Solder Columns business from Raychem. Winslow has further developed the Solder Columns and is marketing them to this date.

1.10 Main Reasons for the Success

The reason for the success of the CCMD/Solder Columns is the use of columns themselves, which were used as the joints between the two devices.

Please look at right hand side (RHS) figure in FIG. 7.

When we place a column between the BGA and the PCB, and the temperature changes, the PCB stretches and shrinks at a higher rate than the BGA. The column absorbs the dimensional differences. The column gets strained in a way that induces bending stresses in the column.

Now here we have more control on these bending stresses, than in the case of when we have shear stresses.

Now, let's look at the RHS figure in FIG. 7, which shows the formula for the bending stresses in the column. We can see that we can reduce the bending stress, Sb, by at least two ways. One, we can reduce the diameter, "d", of the column. Two, we can increase the height of the column, "H". Actually, we can do BOTH, if we want to. Also bear in mind that the effect of changing the height is to the square power. None of these options is available, if the joint is under shear stress as on the LHS of FIG. 7.

A pretty extensive and lengthy, and good, MATHEMATICAL ANALYSIS was given in U.S. Pat. No. 4,664,309, see Reference #1, under Section 1.5.3, "RELATED PRIOR ART PATENTS . . . " of this specification. Please refer to its drawings, FIGS. 1, 2, 3A and 3B. Refer also to the written analysis in the body of the patent specification, starting at Column 6, line 47 and ending at Column 9, line 28.

1.11 Related Work Success Story Still Continues

Recently, Goddard Technical Standard # GSFC-STD-6001, Approved: Feb. 22, 2011, Title: Ceramic Column Grid Array Design and Manufacturing Rules for Flight Hardware, was published and it talks about these Solder Columns, and states: "This standard establishes requirements which apply to all uses on flight hardware of ceramic-packaged electronic parts which are solder-attached to printed circuit boards with solder columns (ceramic column grid array attachments or CCGAs)."

These solder columns are the "descendents" of my original CCMDs.

More recently, I developed certain additional improvements to the original Solder Columns, which I call now "NO-WICK"™ Solder Columns, as can be seen in Cherian Related Papers, #4; in Section 1.5.4, and Cherian Related Patent #6,884,707, reference #4, in Section 1.5.2; also under PRIOR ART, listed above.

1.12 Reasoning and Logic for the Proposed Solution

So, what comes to mind now is this. Why don't we use a similar approach ABOVE the chip carrier as well? Why limit this kind of helpful solution to be used only BELOW the chip carrier? Why don't we use it also ABOVE the chip carrier, or even both under and above the CC?

Actually, above the chip carrier, the problem is less "problematic", and can be solved with a slightly easier solution. I will describe it further down below.

2. BRIEF SUMMARY OF THE INVENTION 2.1 Object of the Invention

To provide a collection of solutions, which can be used to address and to solve the problems listed in the above section "1—BACKGROUND", and especially to satisfy the requirements and goals and objectives listed in sections 1.4.1 through 1.4.4.

More specifically, to provide the solutions and features listed in the next section, 2.2.

2.2—Solutions to the Problems and the Advantages of the Inventions

I am proposing solutions, which will satisfy the two following stated needs: 1) Overcome the high heat flux problem, reduce it to lower levels that are manageable by the spacecraft thermal control system; and 2) Reduce or eliminate the undesirable effect of the CTE Mismatch.

I will do that, by placing a "tailorable, flexible, passive heat spreader" between the upstream high heat flux heat source and the downstream heat sink or cooling system.

This spreader will have at least the two following features:

First, it will provide an enlarged platform between the heat source and the heat sink, such that the platform will have a large surface area, adjacent to the heat sink, so as to spread the heat over its larger surface area, thus reducing the heat flux, from its high value at the narrow surface area of the upstream heat source, to a lower value at the larger surface area of the platform near the downstream heat sink. This will reduce the magnitude of the heat flux, to lower levels, i.e. to levels that can be manageable by the downstream thermal control system of the spacecraft or the satellite.

Second, the spreader will also provide columns or column-like elements between the Heat Source (Chip Carrier or the like) and the Heat Sink, almost similar to the columns used to attach the Chip Carrier to the Printed Circuit Board, but with certain differences. The main objective of these columns is to provide some flexibility between the heat source and the heat sink, to absorb the effect of the CTE Mismatch. We may have two sets of these columns. One set of columns will be between the heat source and the platform of the spreader and a second set between the platform and the heat sink.

2.3—The above proposed solutions will take care of the heat Flux density problem, as well as the CTE Mismatch and the Interface Problem. These will satisfy all the needs of the Air Force, which were spelled out in their SBIR Solicitation and which were mentioned earlier above.

These solutions will be clear when I describe the drawings further down below. Also the advantages of the solutions will also be clearer at that time.

3. BRIEF DESCRIPTION OF THE SEVERAL VIEWS OF THE DRAWINGS

Figure 8:
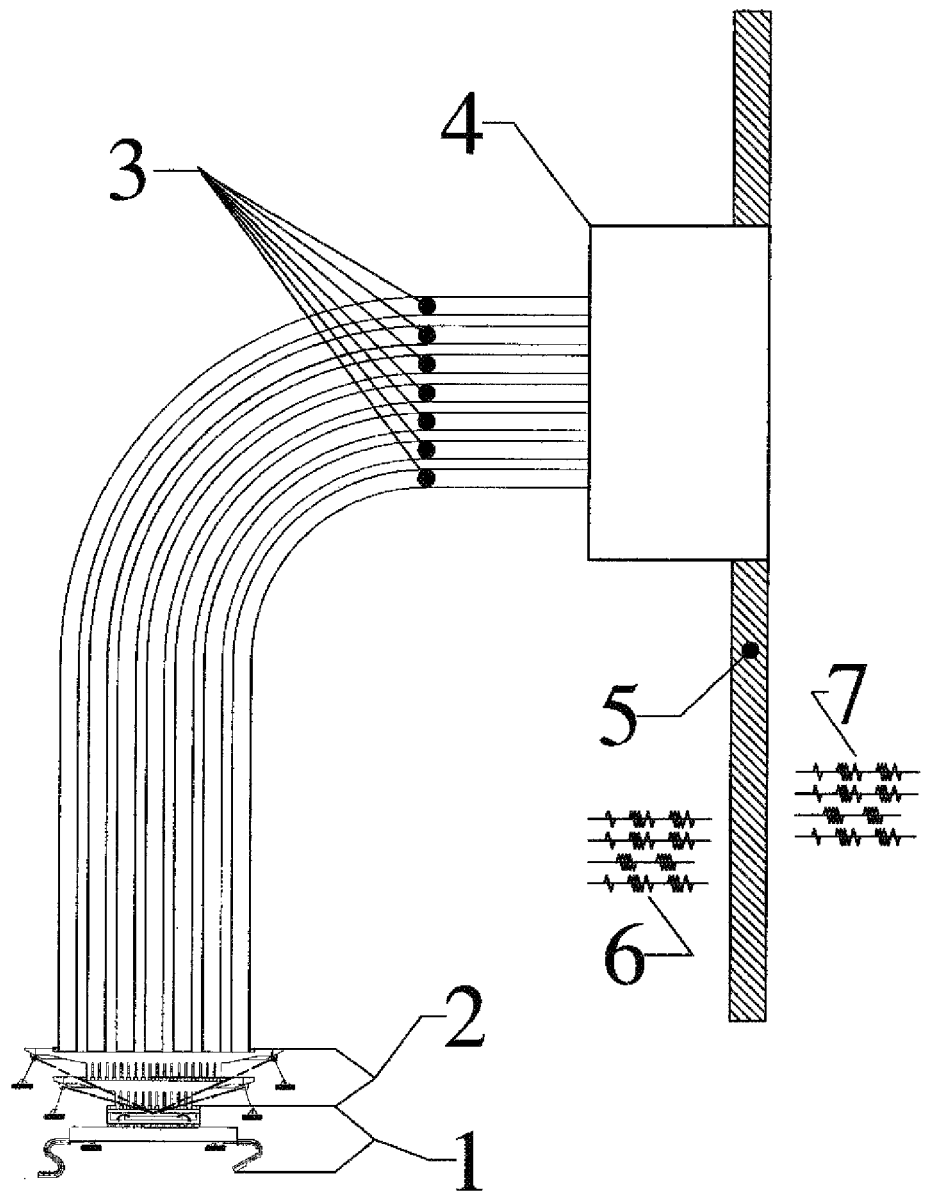

1. FIGS. 1 and 8 show the general overview, the way I perceived it, of the whole thermal control system, in a satellite or a spacecraft, or even of a general land based high power electronic system. The heat flow starts at the Chip Carrier, which is the source of heat (1), then the heat flows to and through the proposed Heat Spreader (2)*r*, which is as per present inventions, then goes to the immediate Heat Sink (3), which could be the shown Loop Heat Pipes, and then finally goes to the spacecraft or satellite Prime Thermal Control System (4).

2. FIG. 1 shows my perception of the situation, and FIG. 8 shows my proposed solution, which is mainly the heat spreader, item (2).

3. FIGS. 2 through 6 show the undesirable effects of Temp changes and of CTE Mismatch in assemblies comprising a BGA and a PCB.

4. FIG. 7 shows the difference in the stresses if a system is under shear stress vs. bending stress.

Figure 9:
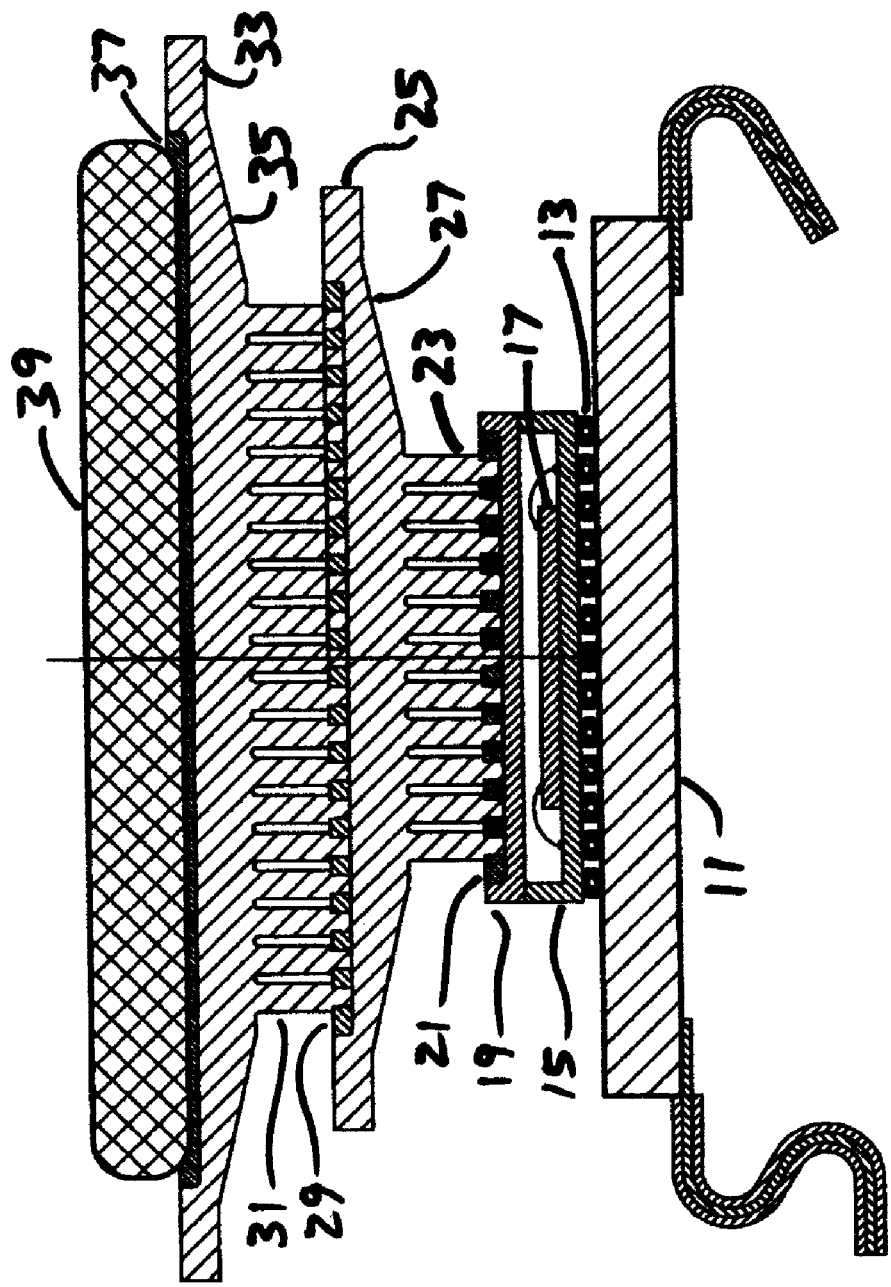
Figure 10:
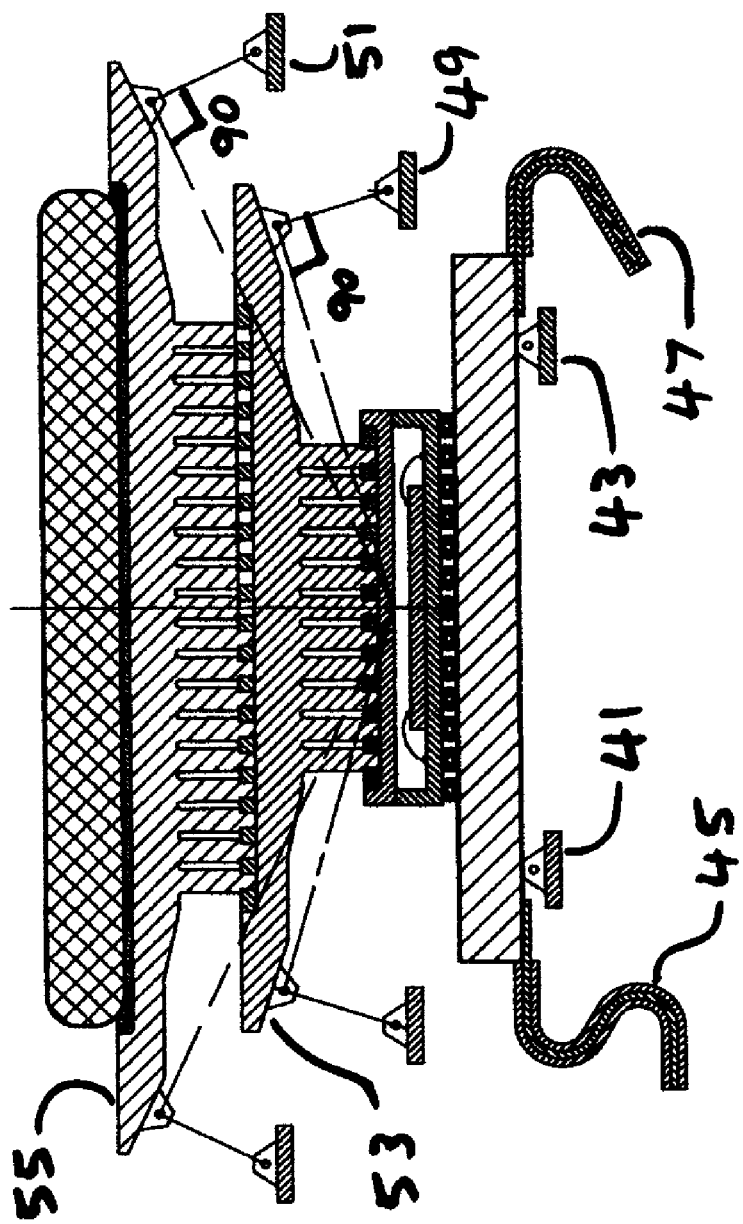

5. FIGS. 9 and 10 show the main typical proposed Heat Spreader, and the reference characters for the various typical elements of such spreaders. These elements are listed down below, at the end of Group 3, and should be considered my "DEFINITIONS" for this specification.

6. Please note that the columns in all the figures, from FIGS. 9 through 13 are vertical, i.e. they are generally perpendicular to the platform and are generally parallel to each other.

Figure 11:
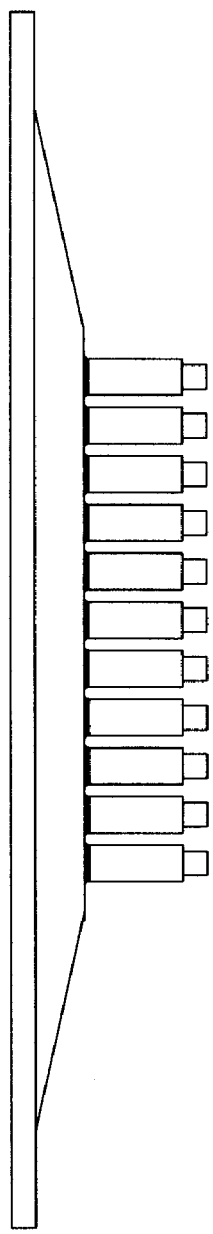
Figure 12:
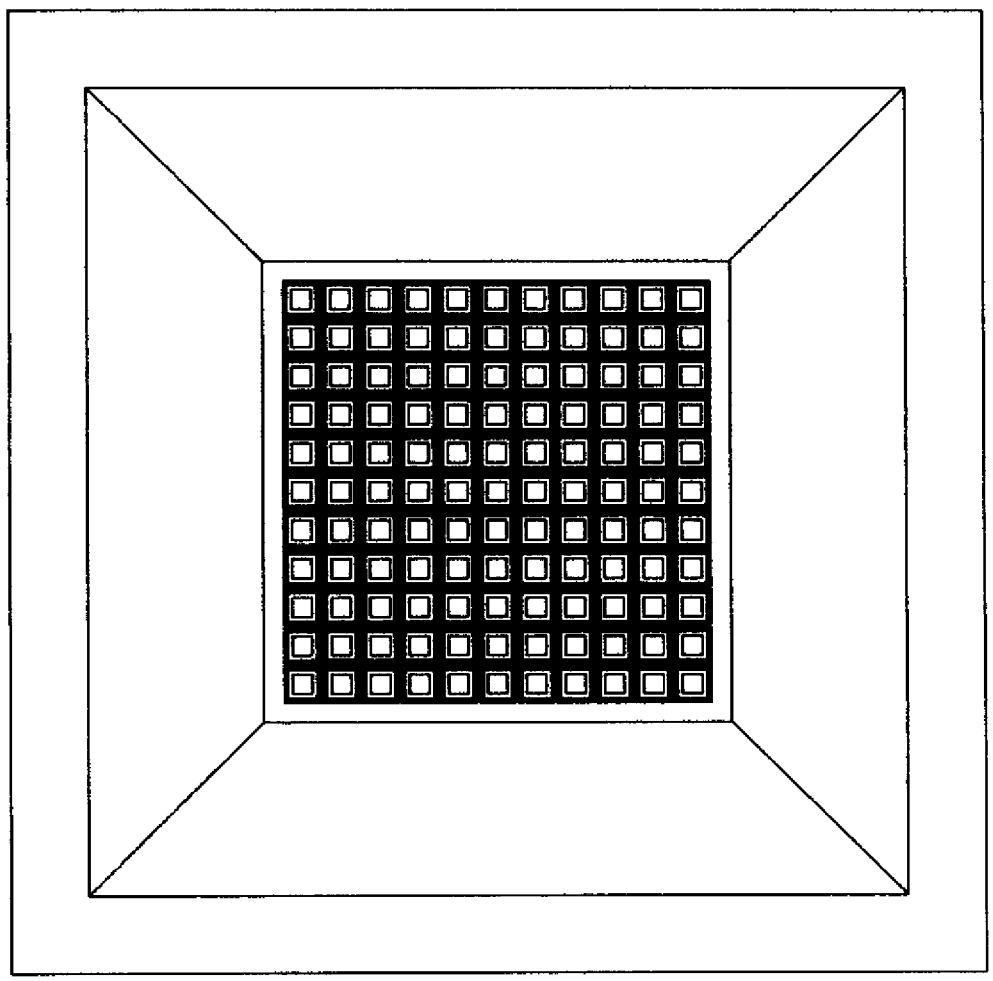
Figure 13:
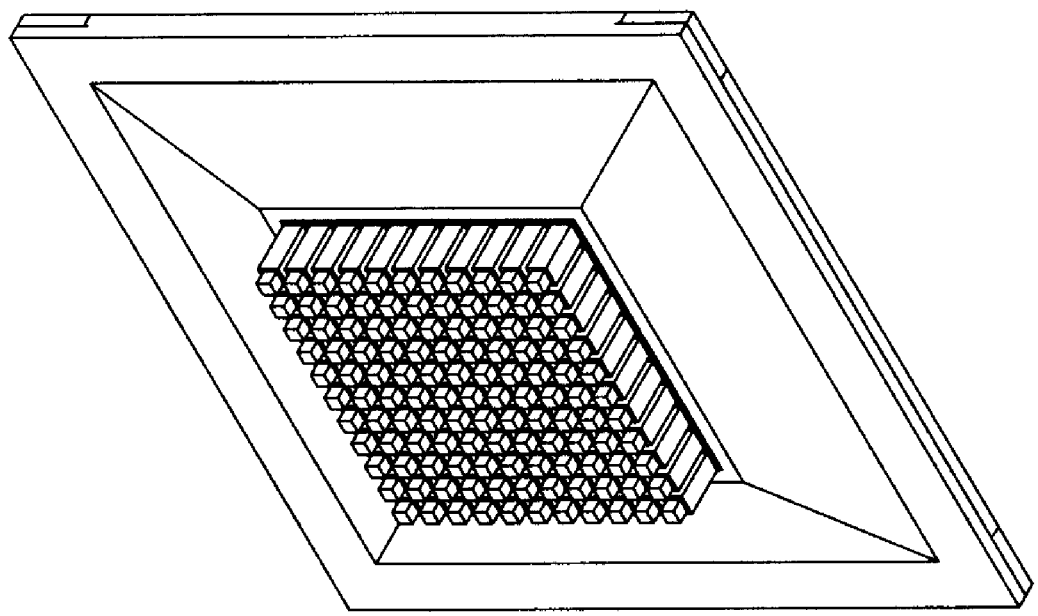

7. FIGS. 11 through 13 show various views of the first stage of the heat spreader shown earlier above. The second stage would look fairly similar, except that it will be larger, i.e. it will have a larger platform, i.e. with a larger surface area, as shown in FIGS. 9 and 10.

Figure 14:
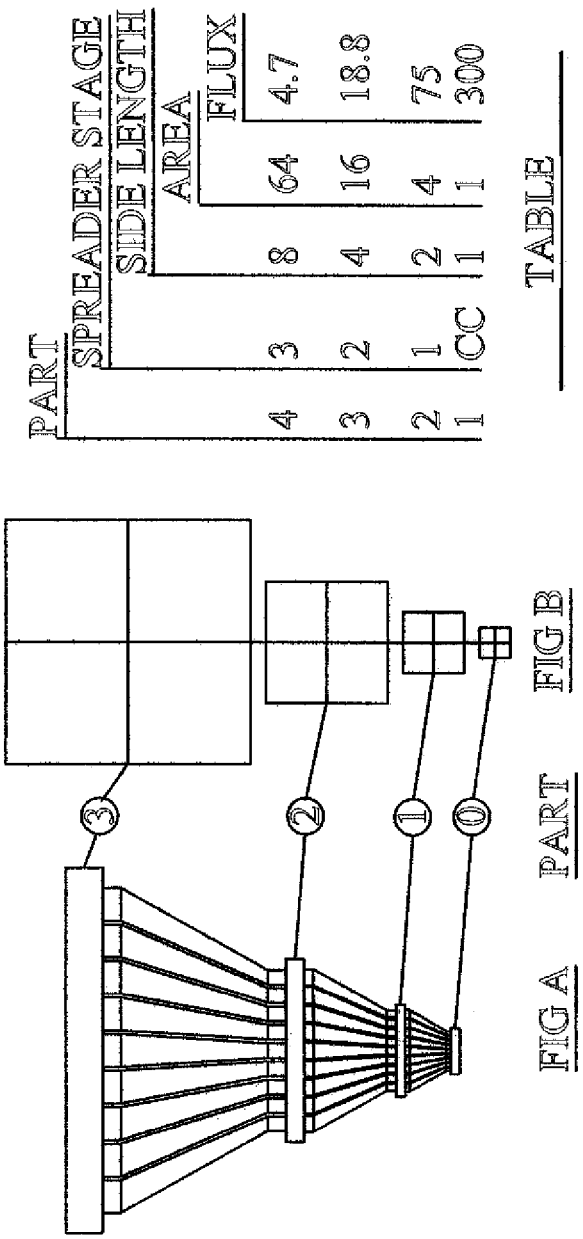

8. FIG. 14 explains the effect of enlarging the heat transfer platform on reducing the value of the heat flux.

9. FIG. 15 shows three cross sectional views of a spreader with vertical columns. The same thinking will apply to the other spreaders described elsewhere in this specification. The views highlight some possible shapes of the spreader's belly.

Figure 16:
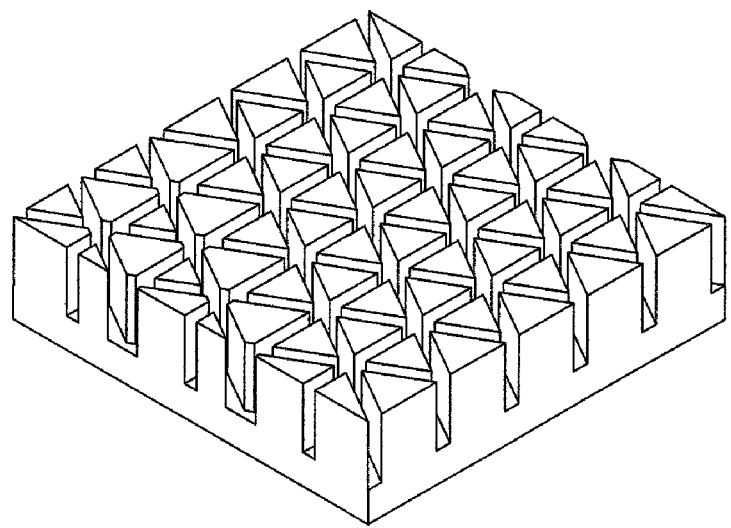
Figure 17:
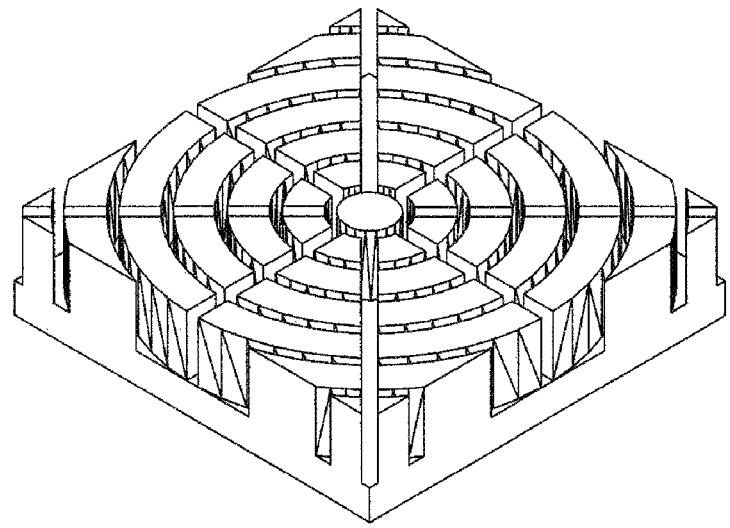

10. FIGS. 16 and 17 show different shapes of the columns under the spreader's platform.

Figure 18:
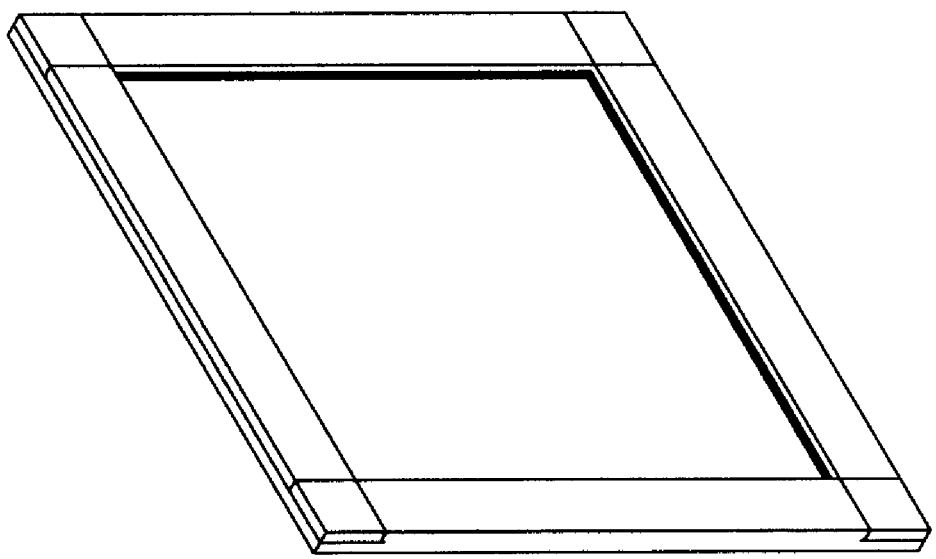

11. FIG. 18 shows a spreader platform with a rim along the edges of the platform, to help in containing any molten solder or other attachment material, if the next stage or the Heat Sink will be soldered, or glued, etc., to this platform.

Figure 19:
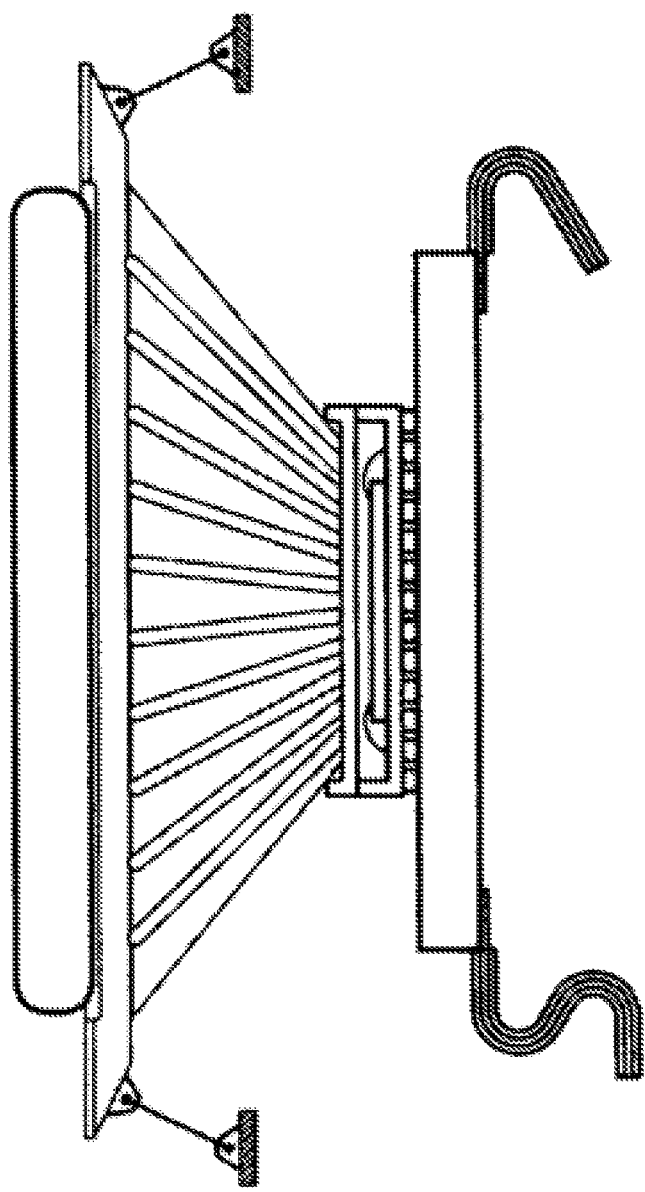
Figure 20:
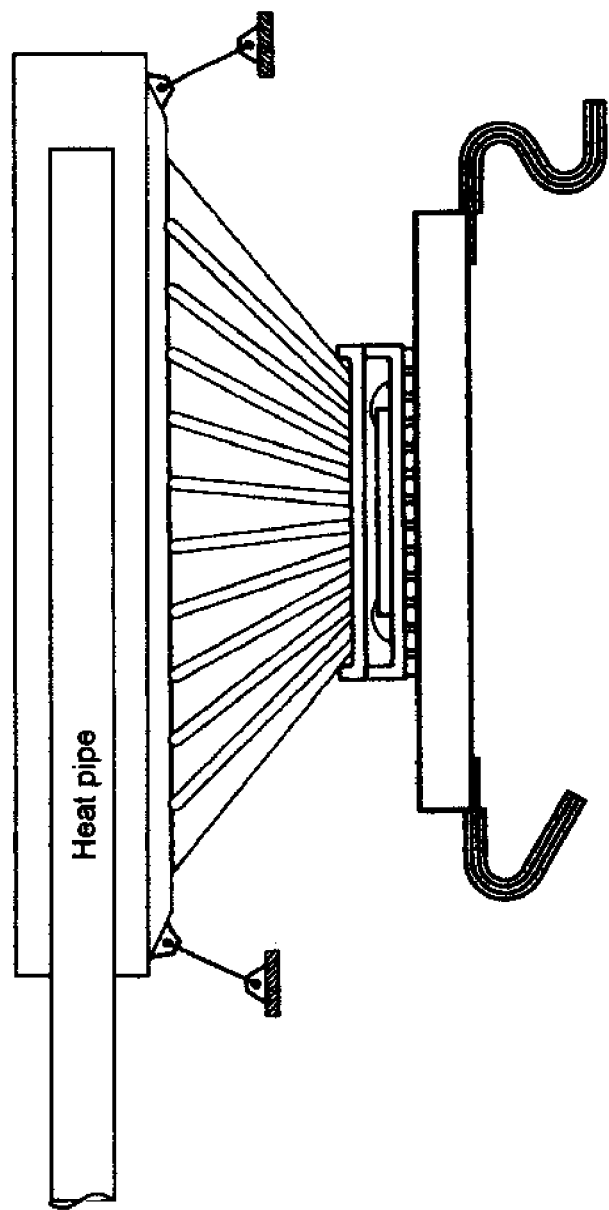

12. FIGS. 19 and 20 show spreaders, that are basically similar to the previous ones, but here the columns are not vertical or parallel, but they fan out from the narrow end at the bottom, near the chip carrier or the heat source, to the wider platform, at the top, i.e. at the heat dissipating end. They also show various possible heat sinks attached to, or embedded in, the platform.

Figure 21:
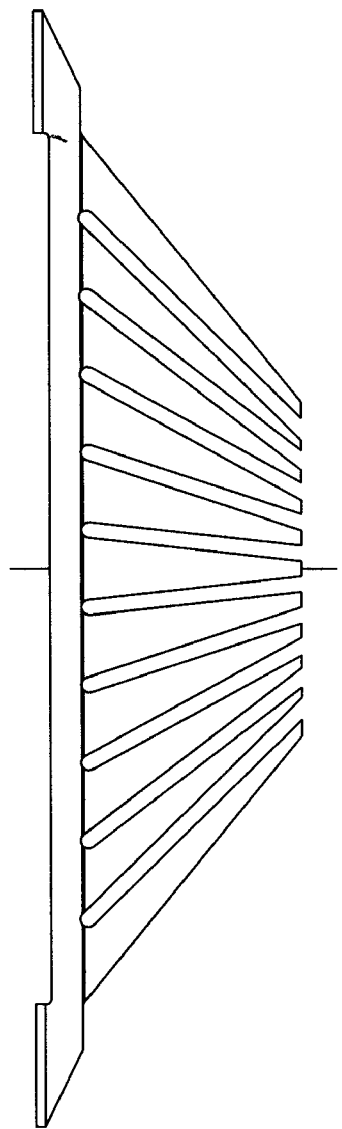
Figure 22:
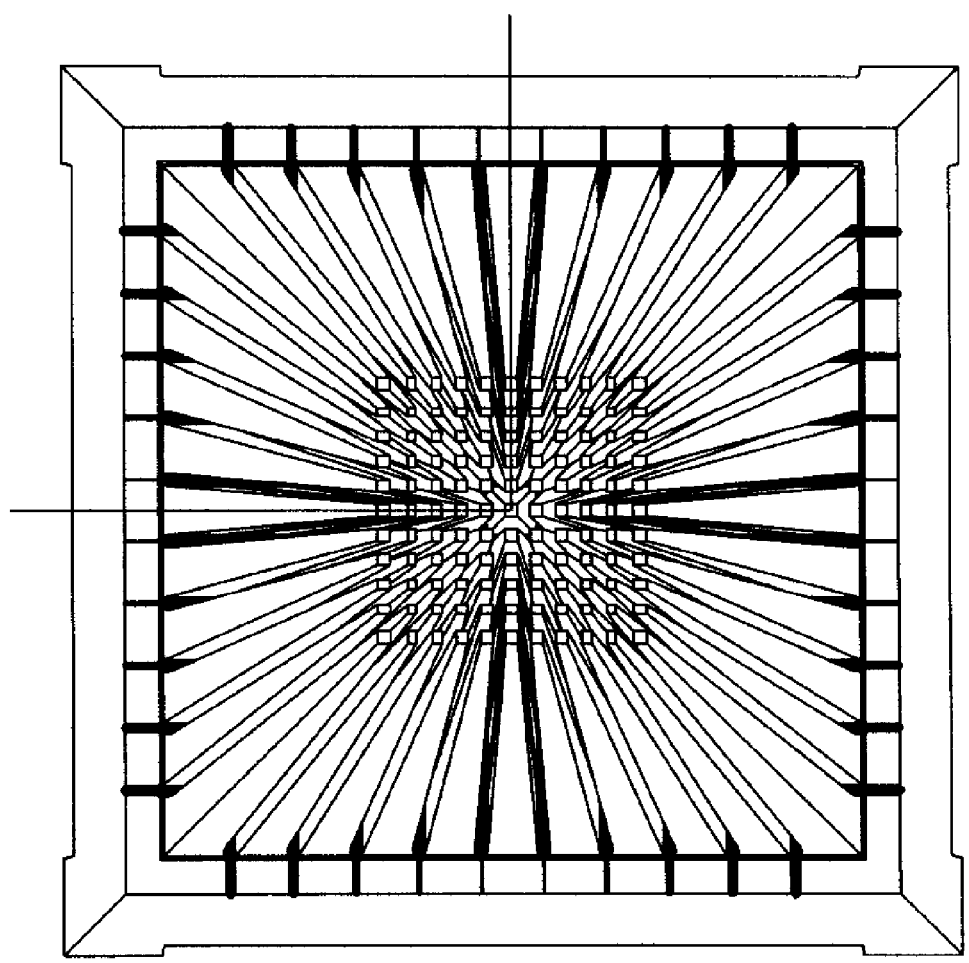
Figure 23:
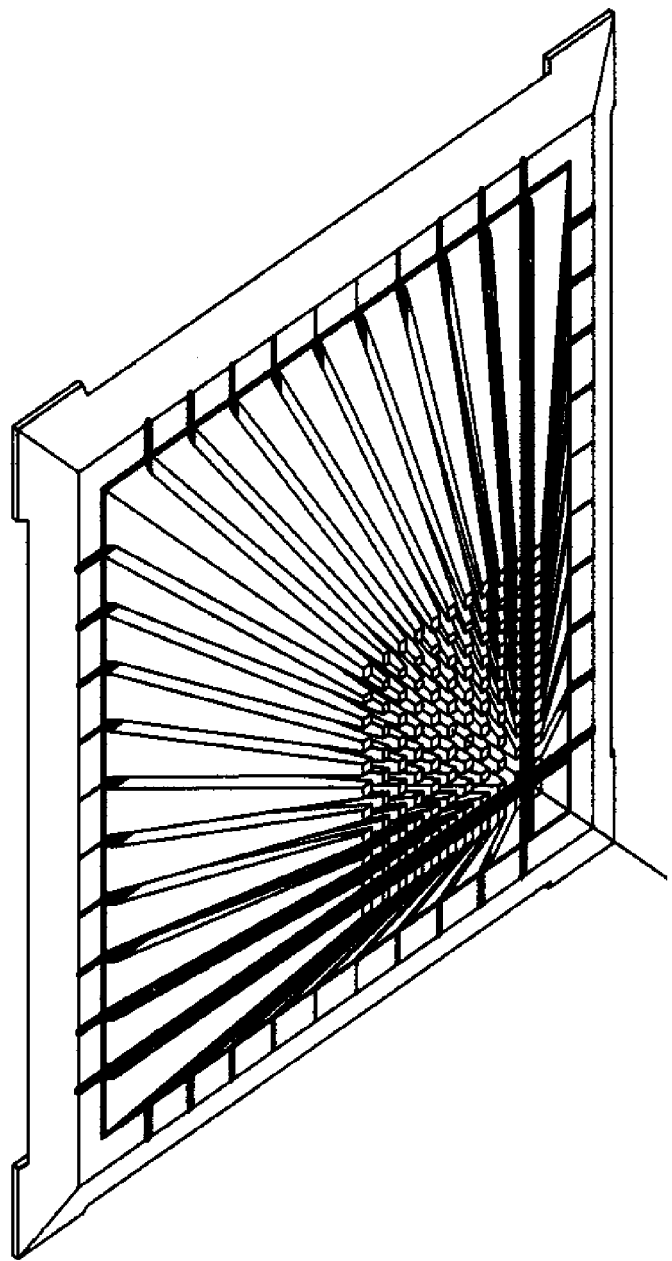

13. FIGS. 21 through 23 show different views of one style of the fanning columns and their platform.

Figure 24:
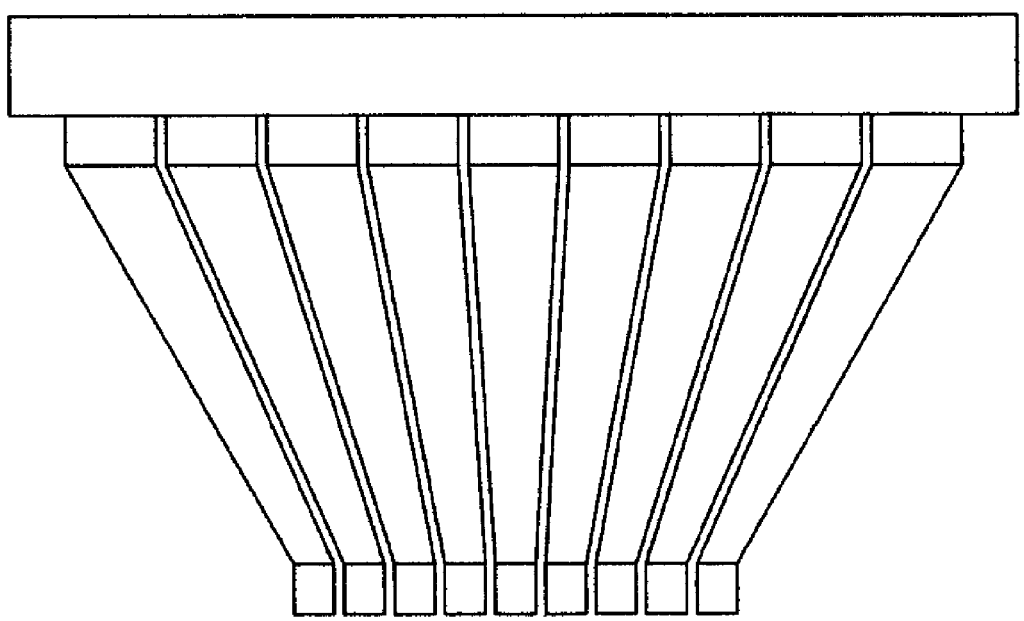
Figure 25:
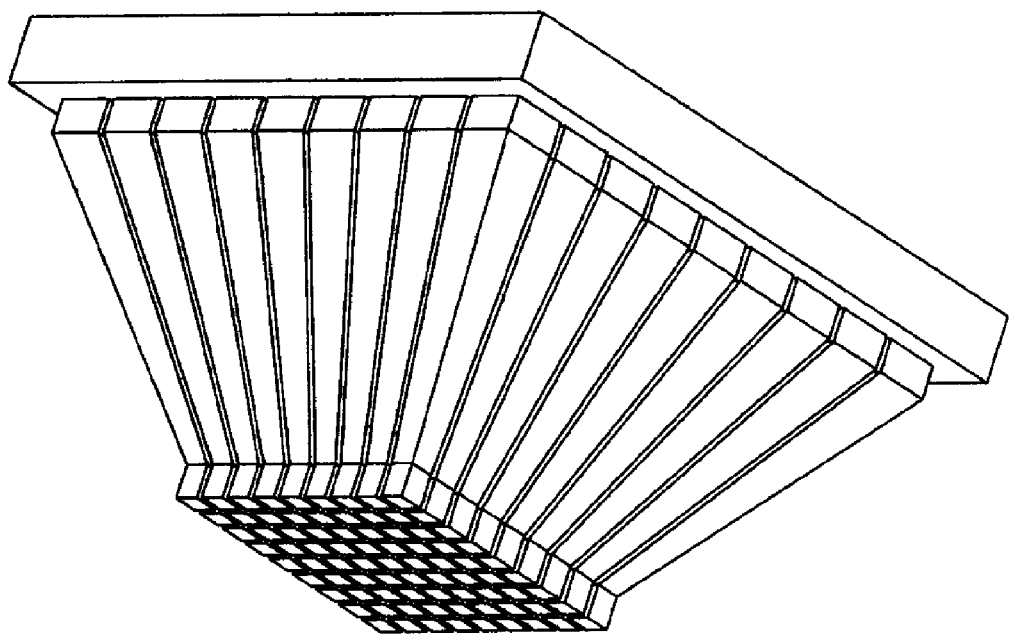
Figure 26:
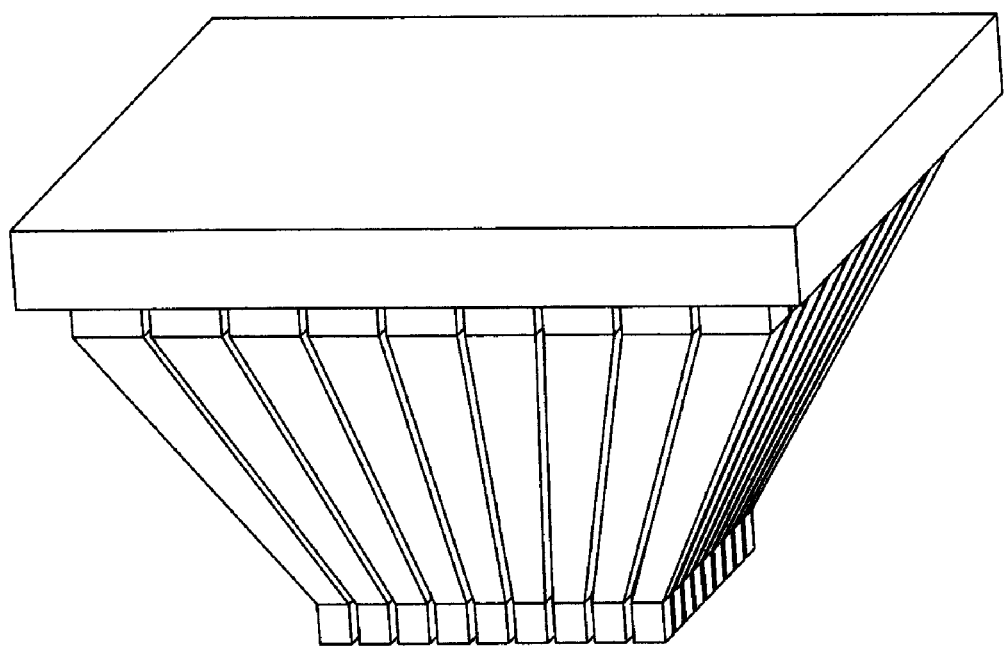

14. FIGS. 24 through 26 show a slightly different design of the fanning columns and their platform.

15. FIGS. 27 through 32 show another group of spreaders with fanning columns, as described before, but with some differences. The part below the platform can be practically identical to the earlier figures, but here we see an additional part above the platform.

Figure 27:
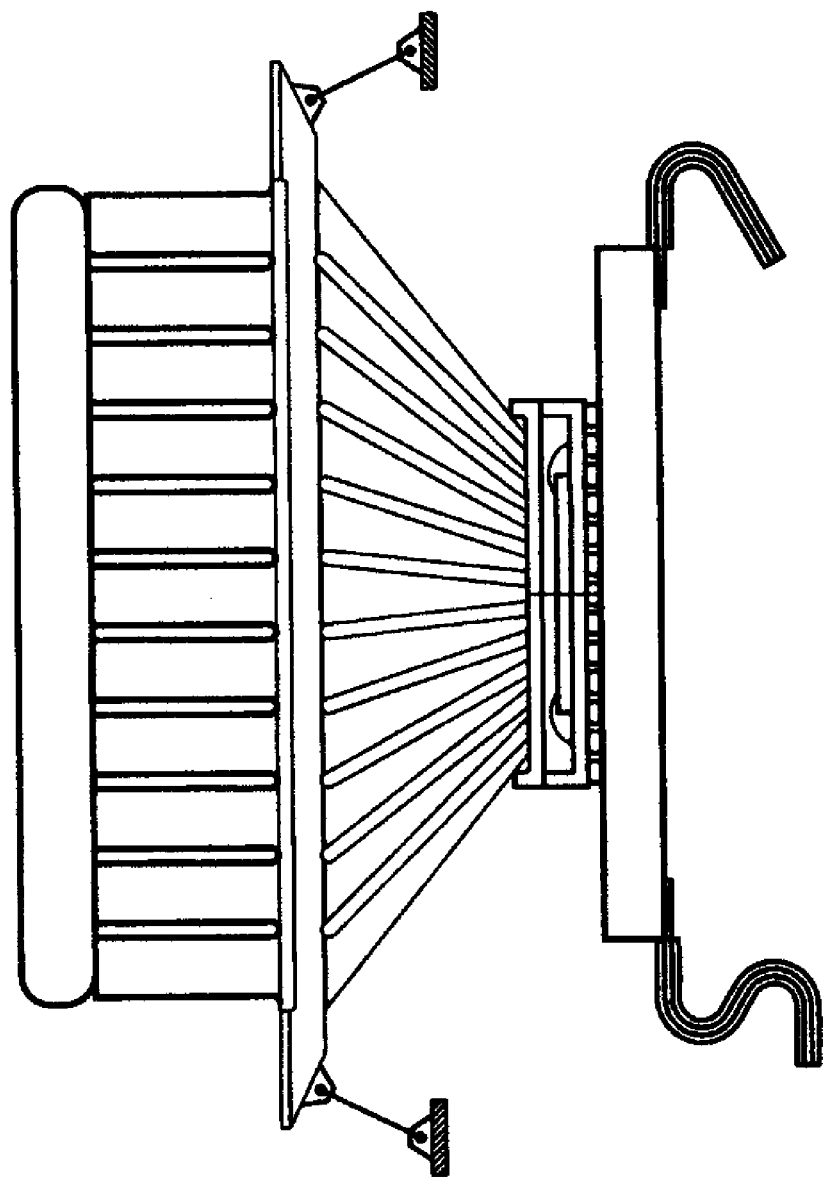

16. FIG. 27 shows that we have a second group of columns above the platform, i.e. between the platform and the heat sink or the second stage spreader. These columns may be desirable to have, in case we have another CTE mismatch between the material of the spreader/platform and the heat sink itself or any other components above the platform.

Figure 28:
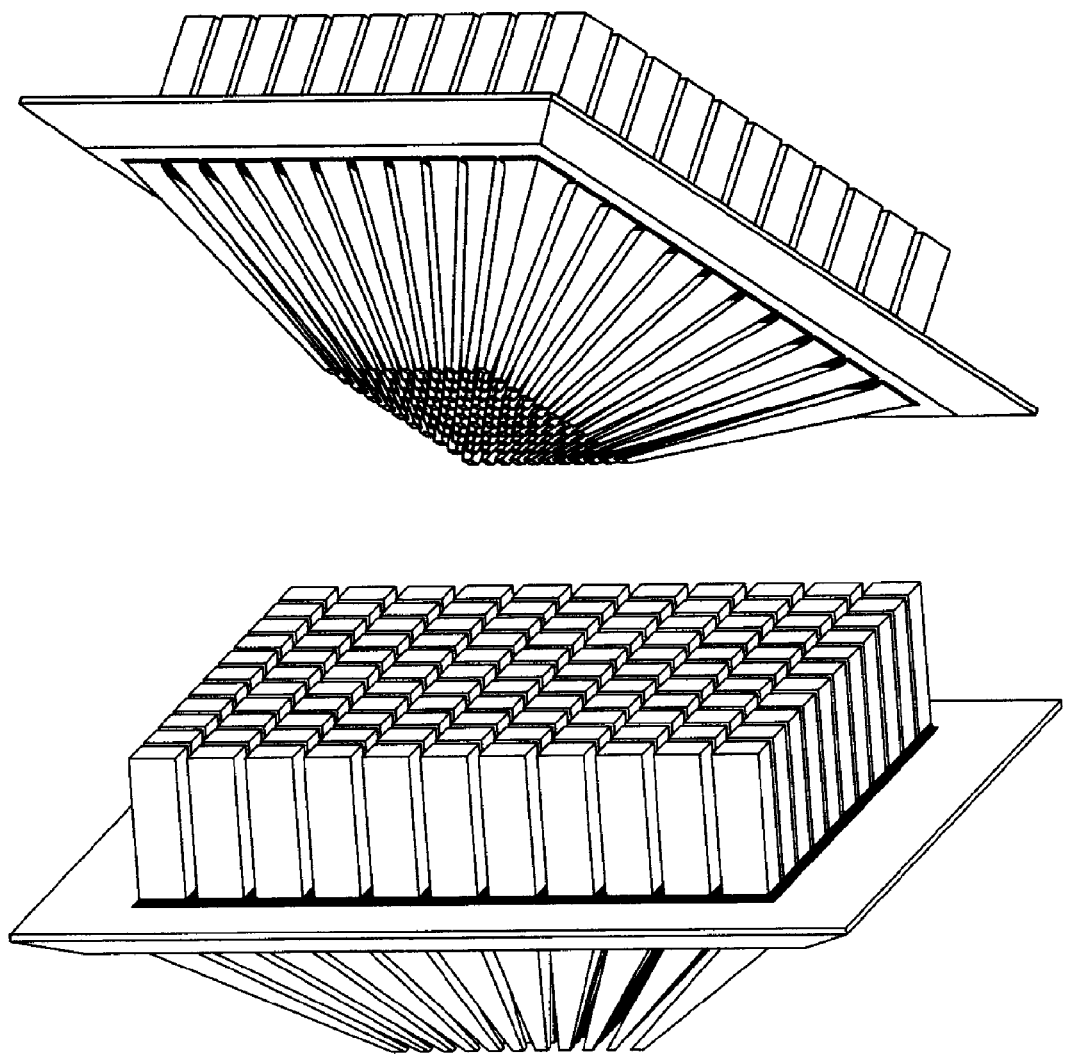
Figure 29:
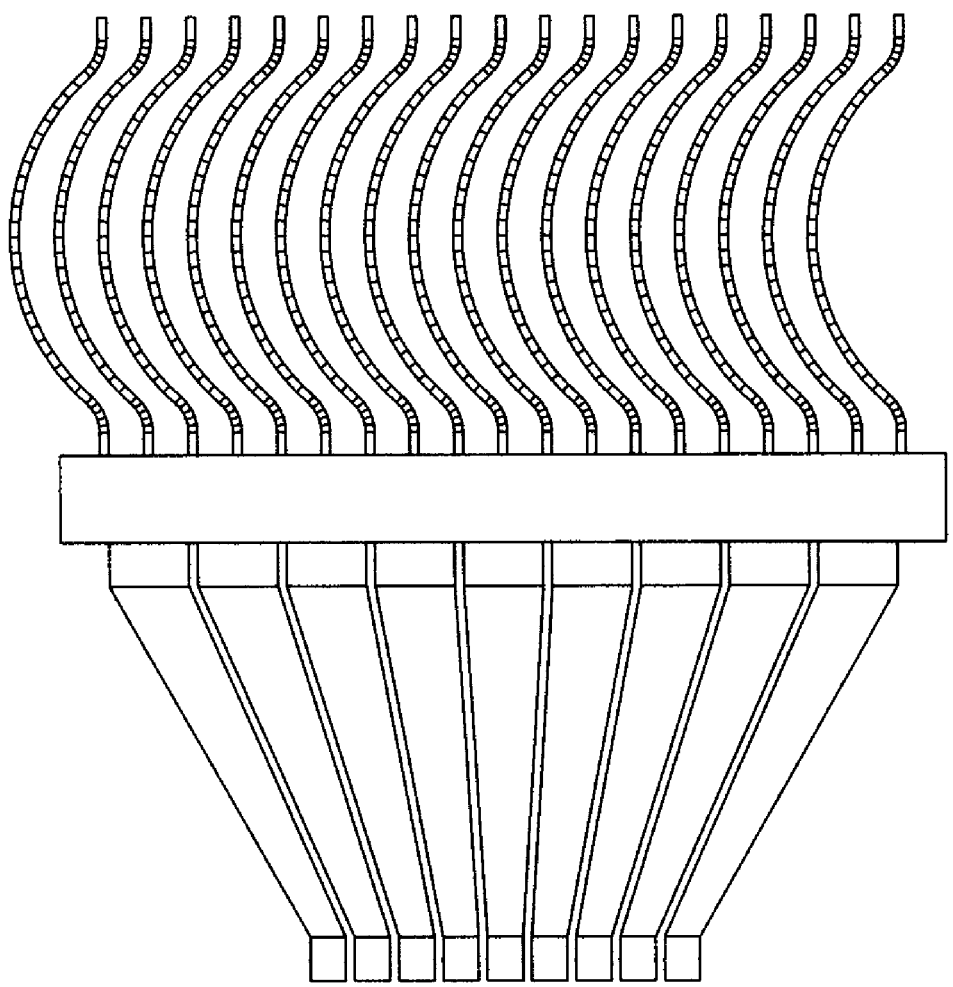
Figure 30:
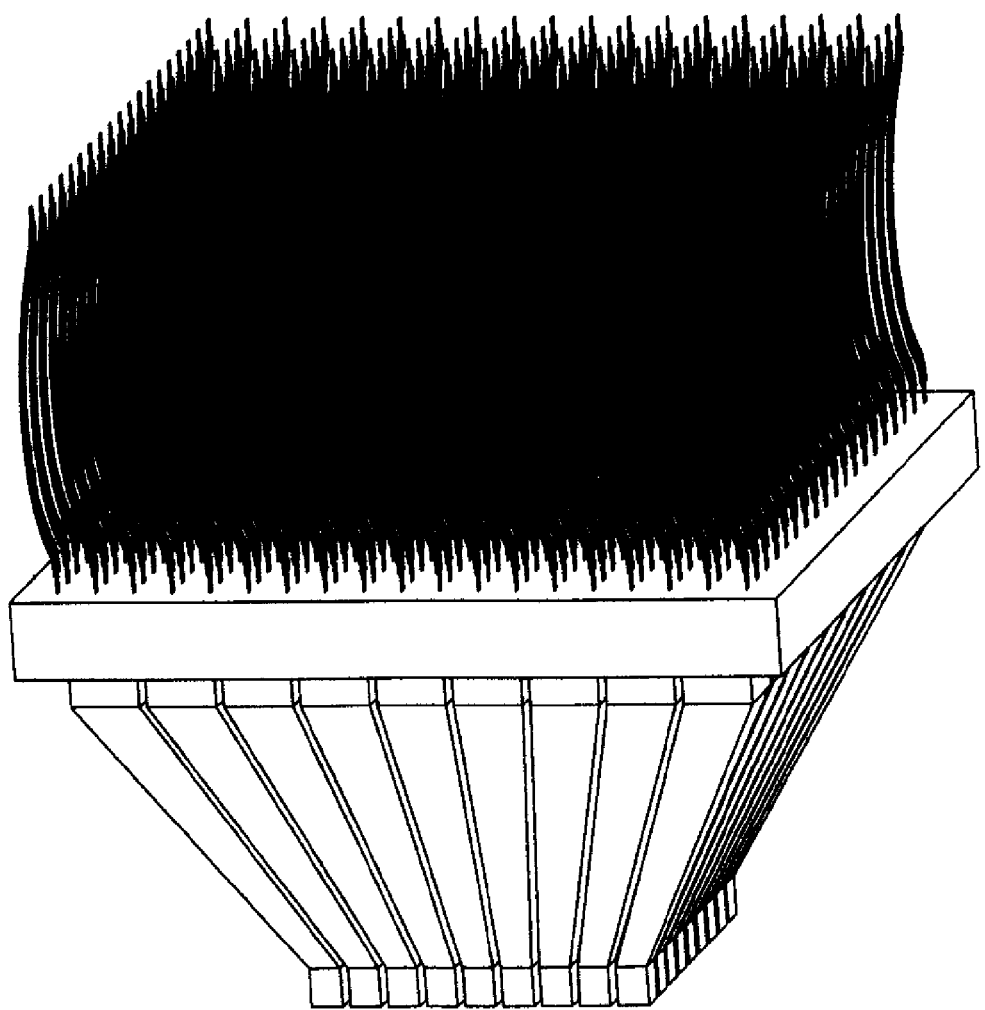

17. FIG. 28 shows these top columns as vertical, parallel columns, with substantial size and cross-sections.

18. FIGS. 29 through 32 show the top columns, with a different shape. They rather look like curved beams or wires, and they could be parallel nested. These will have more flexibility and could be shorter than the columns in FIGS. 27 and 28.

19. FIGS. 33 through 36 show one IC/Chip Carrier at the bottom, with one spreader on top of it. However, the top platform of this spreader is much larger, i.e. wider, and it extends in different directions as shown. Then on top of each one of these extensions, we place another spreader, each having its own platform to accept additional individual heat sinks, with their own Loop Heat Pipes or the like.

Figure 37:
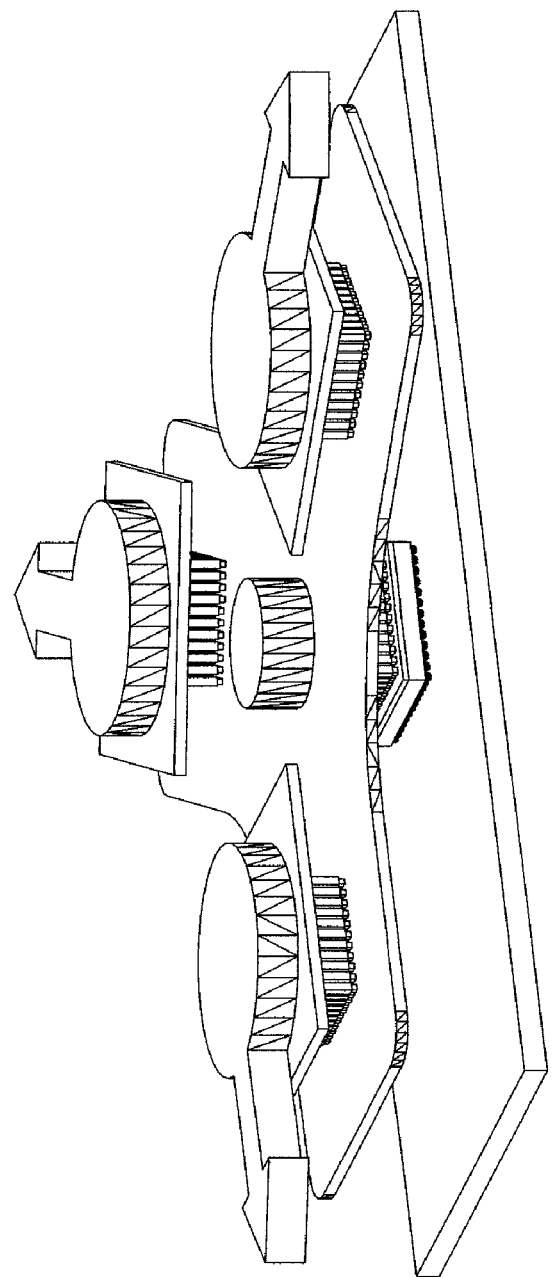
Figure 38:
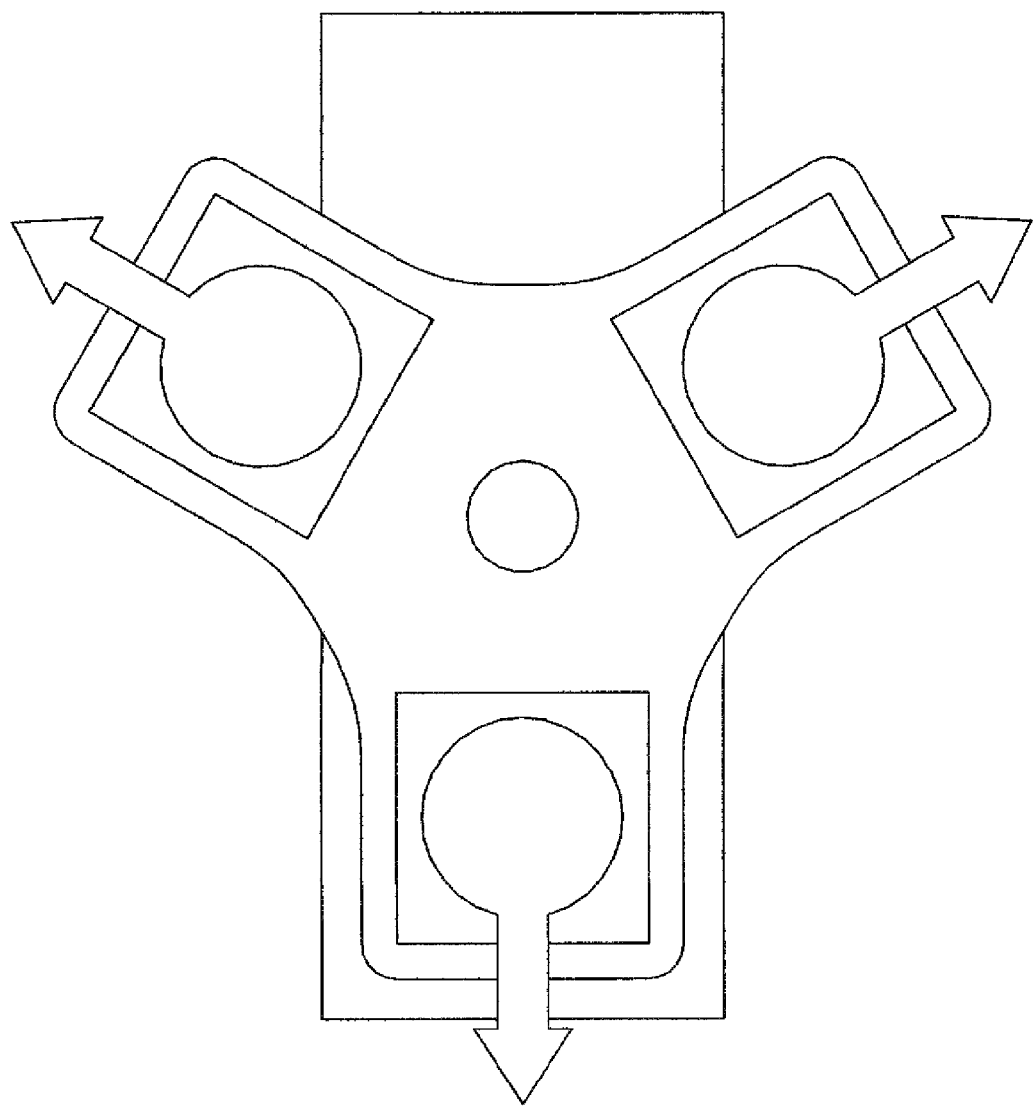

20. FIGS. 37 and 38 show another embodiment, where the second level heat sinks can be mounted horizontally, like Vapor Chambers for example, extending in one or more directions, e.g. towards North South East West or similar directions, while some other heat sinks can be mounted vertically, like the ones shown in FIG. 8, extending in a perpendicular direction to the platform of the lower spreader.

Figure 39:
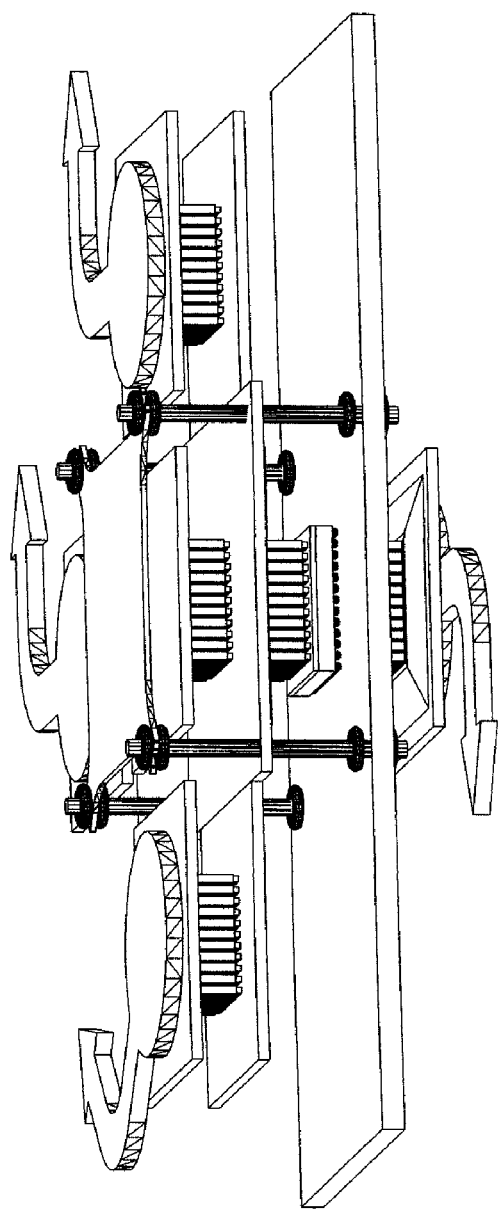
Figure 40:
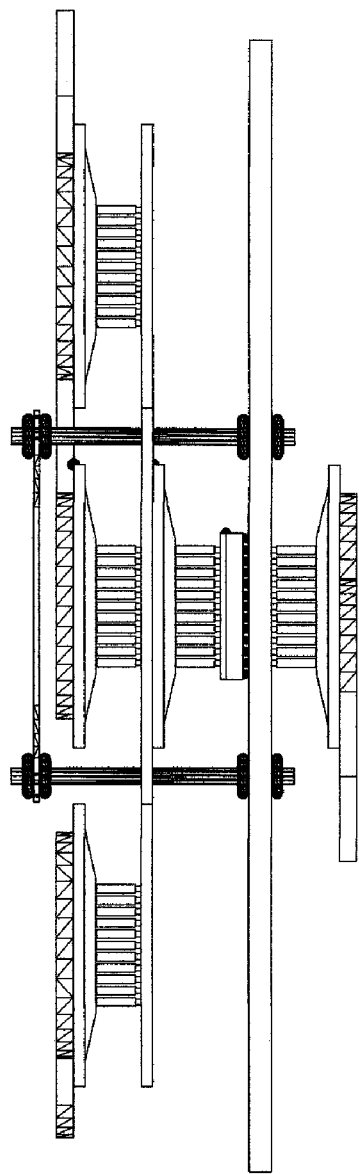
Figure 41:
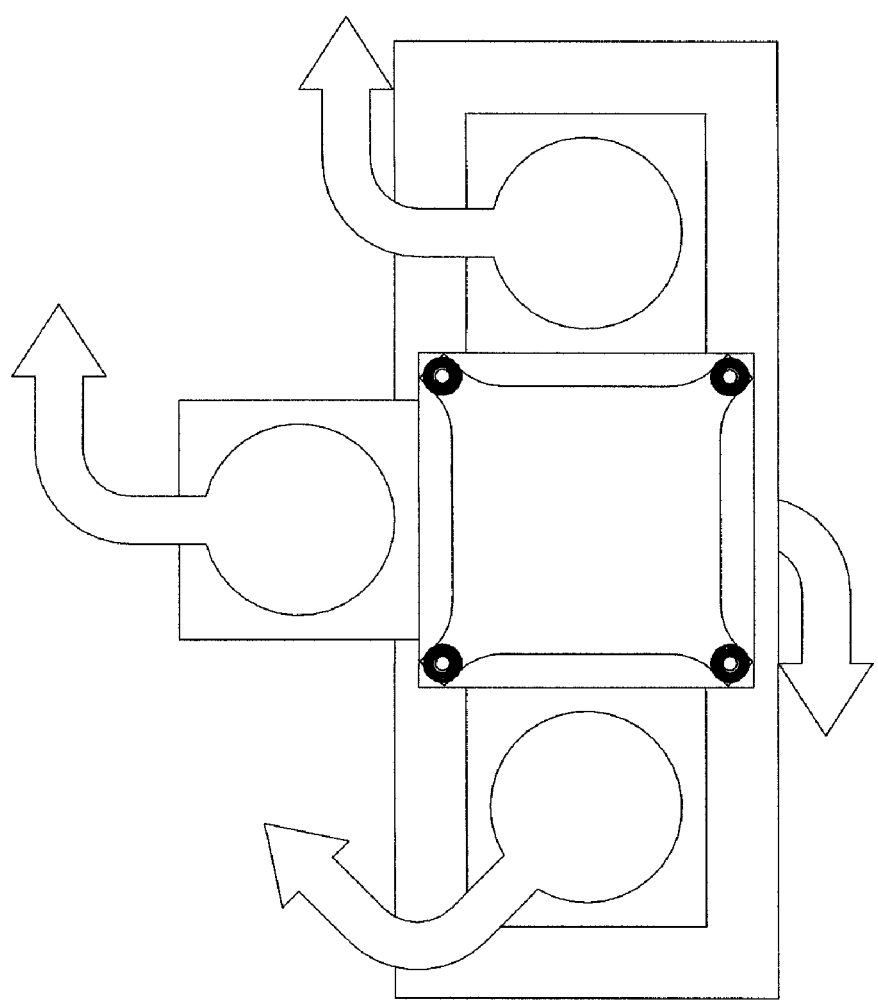

21. FIGS. 39 through 41 show a similar embodiment, but with some additional options. For example, we can add some mechanical stabilizers as shown, and we can add another Loop Heat Pipe sink below the PCB as well, if the PCB has adequate copper vias or copper planes to conduct heat through them down to the lower LHP. See also FIG. 82-B.

Figure 42:
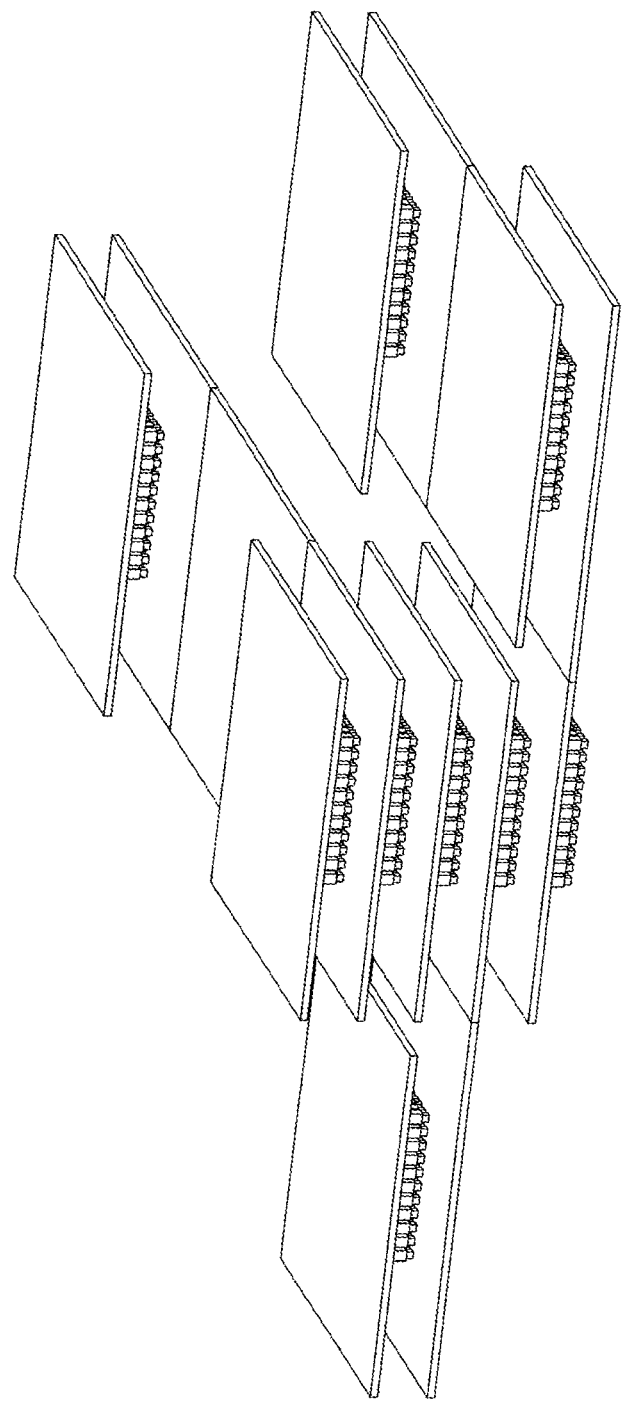

22. FIG. 42 shows another arrangement, with multi levels in multi directions, branching out in every possible direction.

Figure 43:
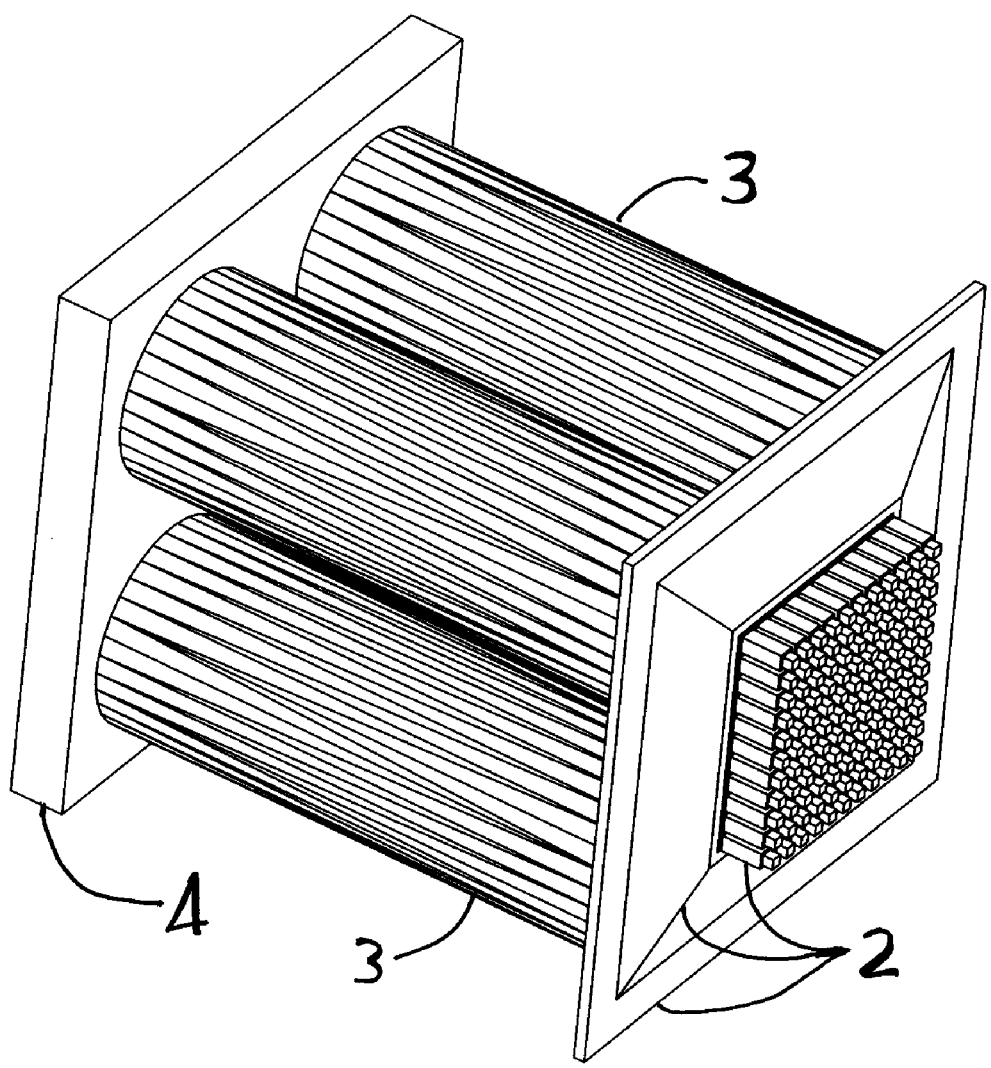
Figure 44:
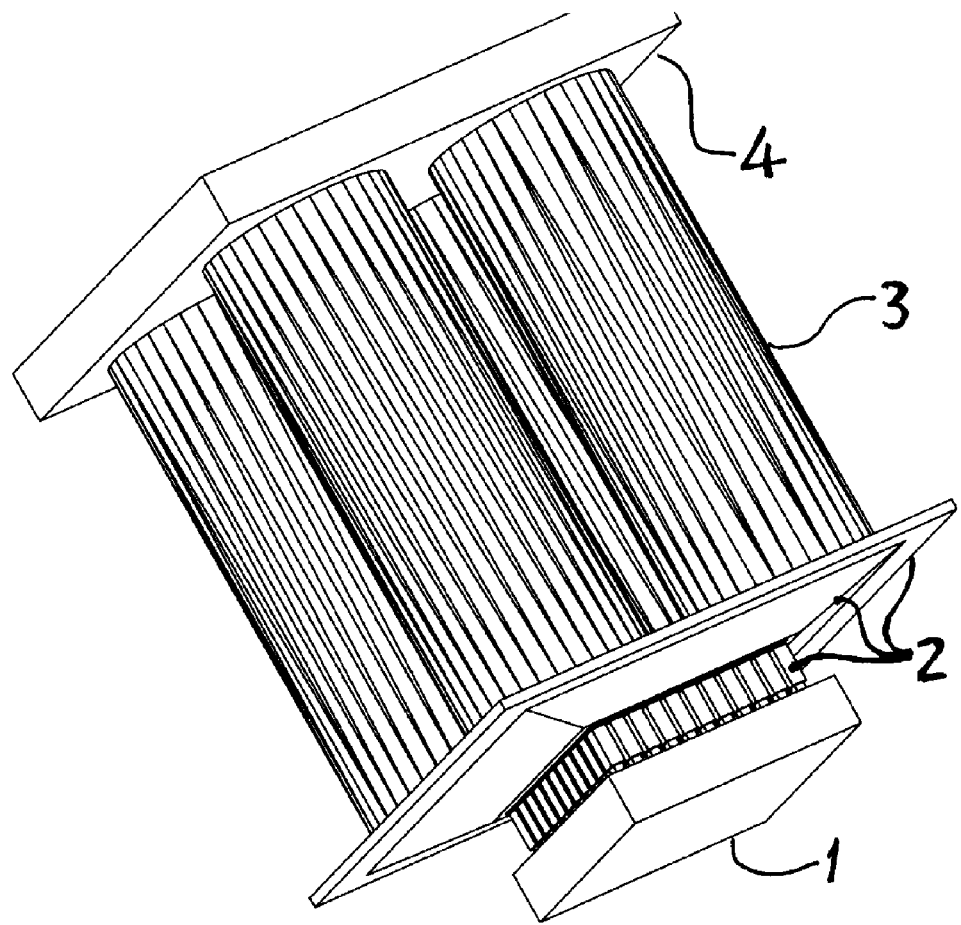
Figure 45:
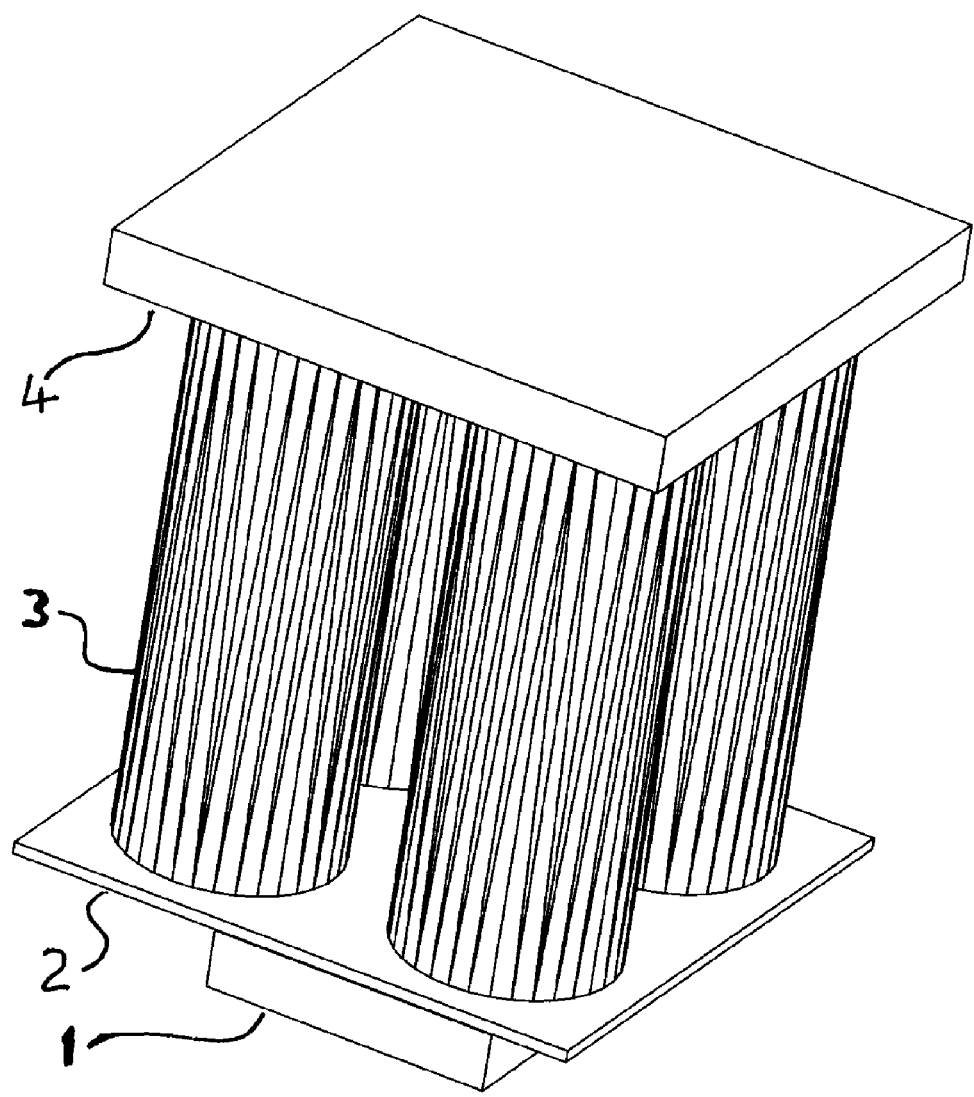

23. FIGS. 43 through 45 show a model of the proposed spreader (2), which incorporates VERTICAL columns, and a wide platform. A number of short segments of heat pipes (3) are shown mounted on top of the spreader platform and then a COLD PLATE (4) is mounted at the other end of the heat pipes. The cold plate simulates the Prime Thermal Control System, which is supposed to keep the temp at the end of the heat pipes at a specific desired low temperature level.

Figure 46:
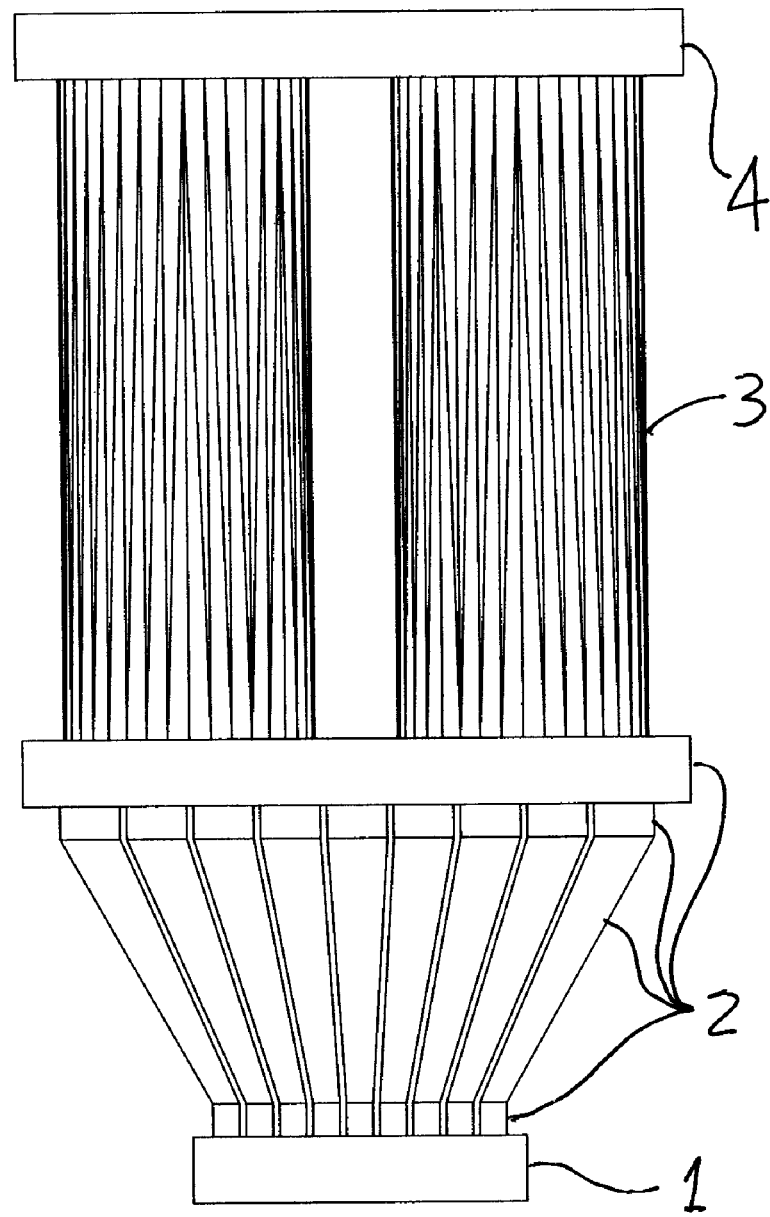
Figure 47:
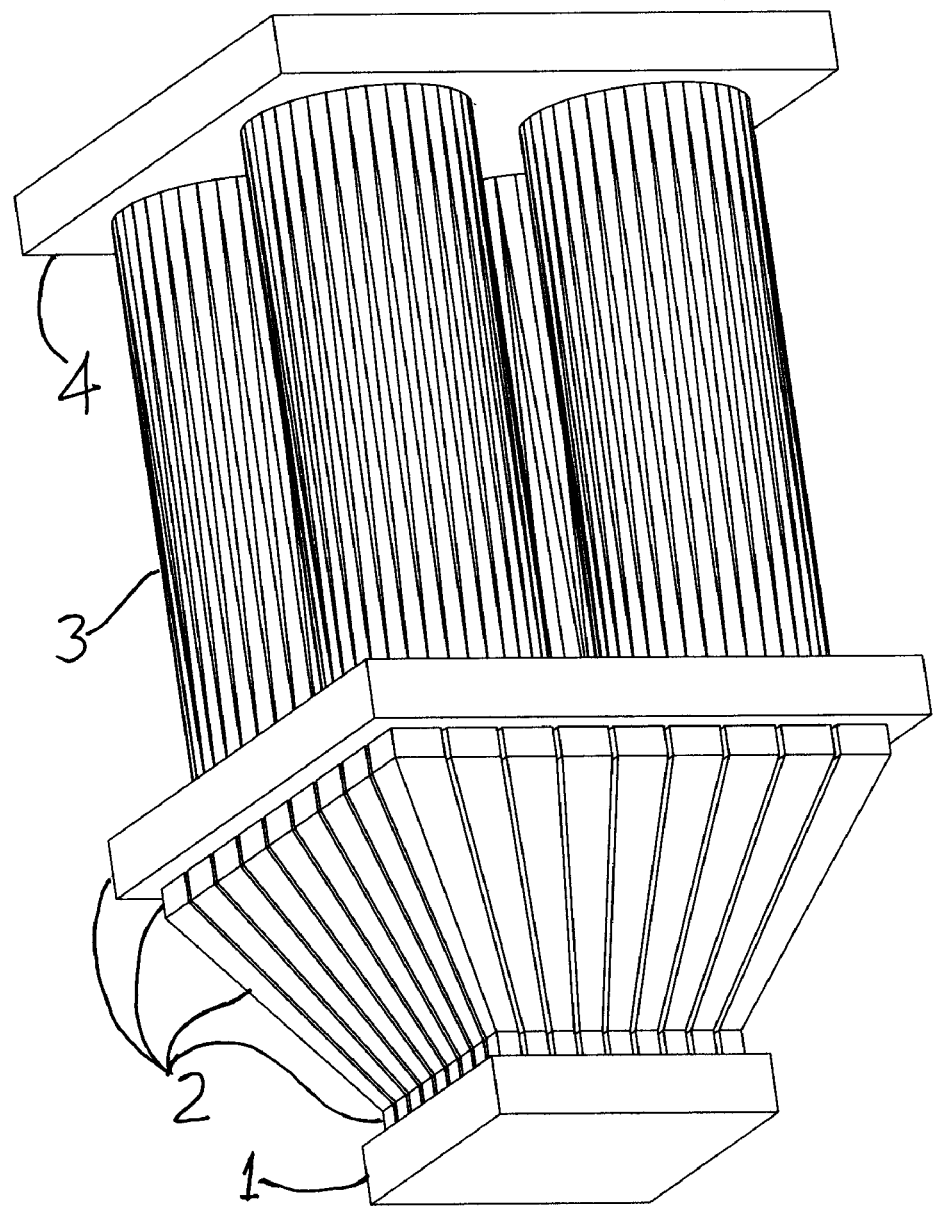
Figure 48:
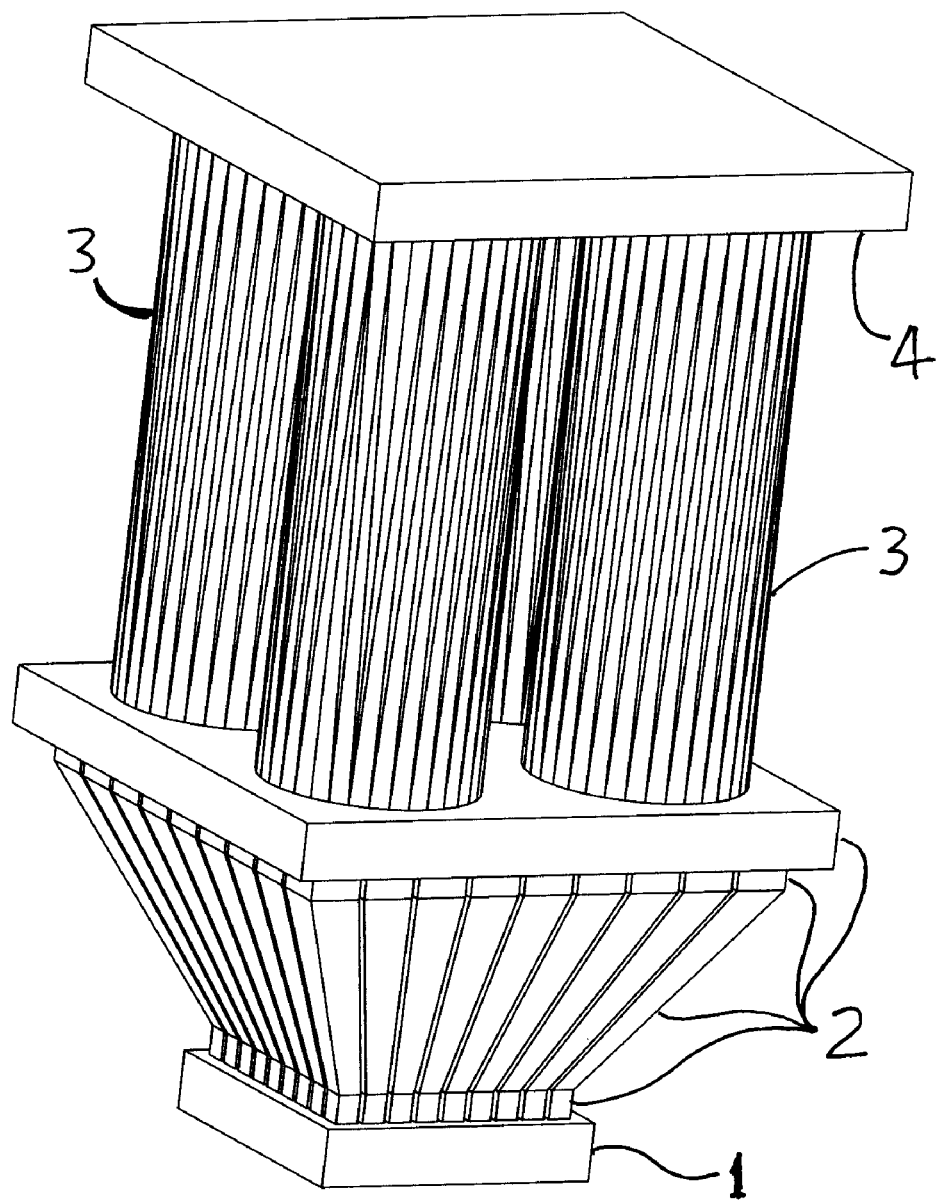

24. FIGS. 46 through 48 show a similar arrangement as in FIGS. 43 through 45, except that the spreader (2) in this case here does not have vertical columns. Instead, the columns here fan out, from the narrow area at the top of the Chip Carrier, i.e. the heat source (1) to the wider platform of the spreader at the top of the columns.

Figure 49:
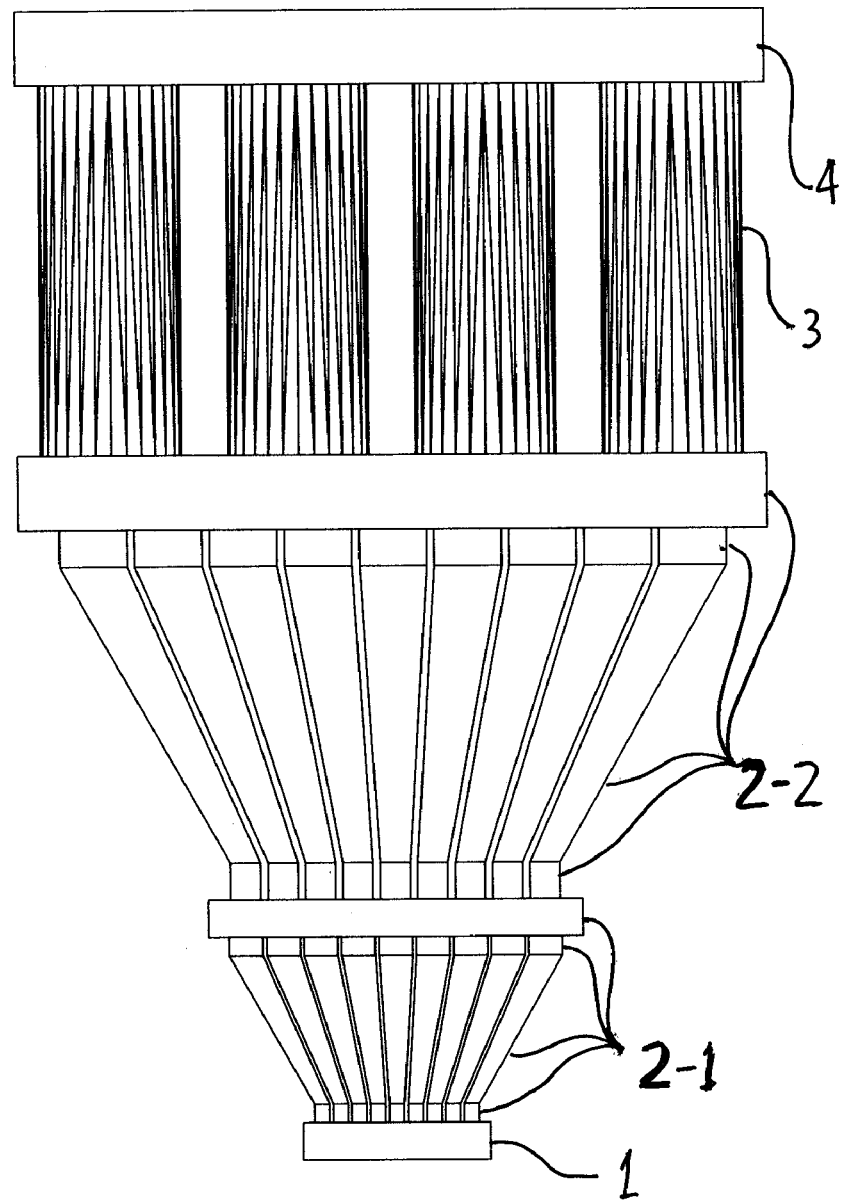
Figure 50:
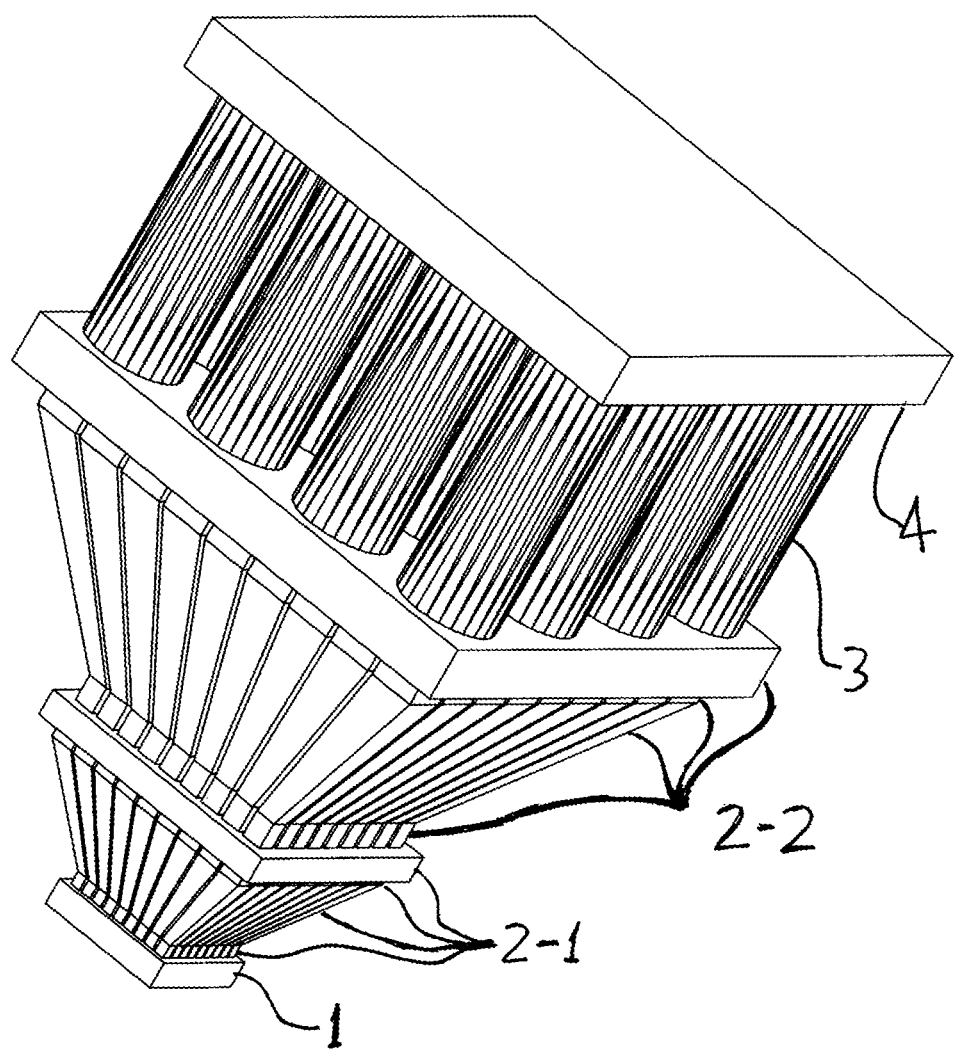
Figure 51:
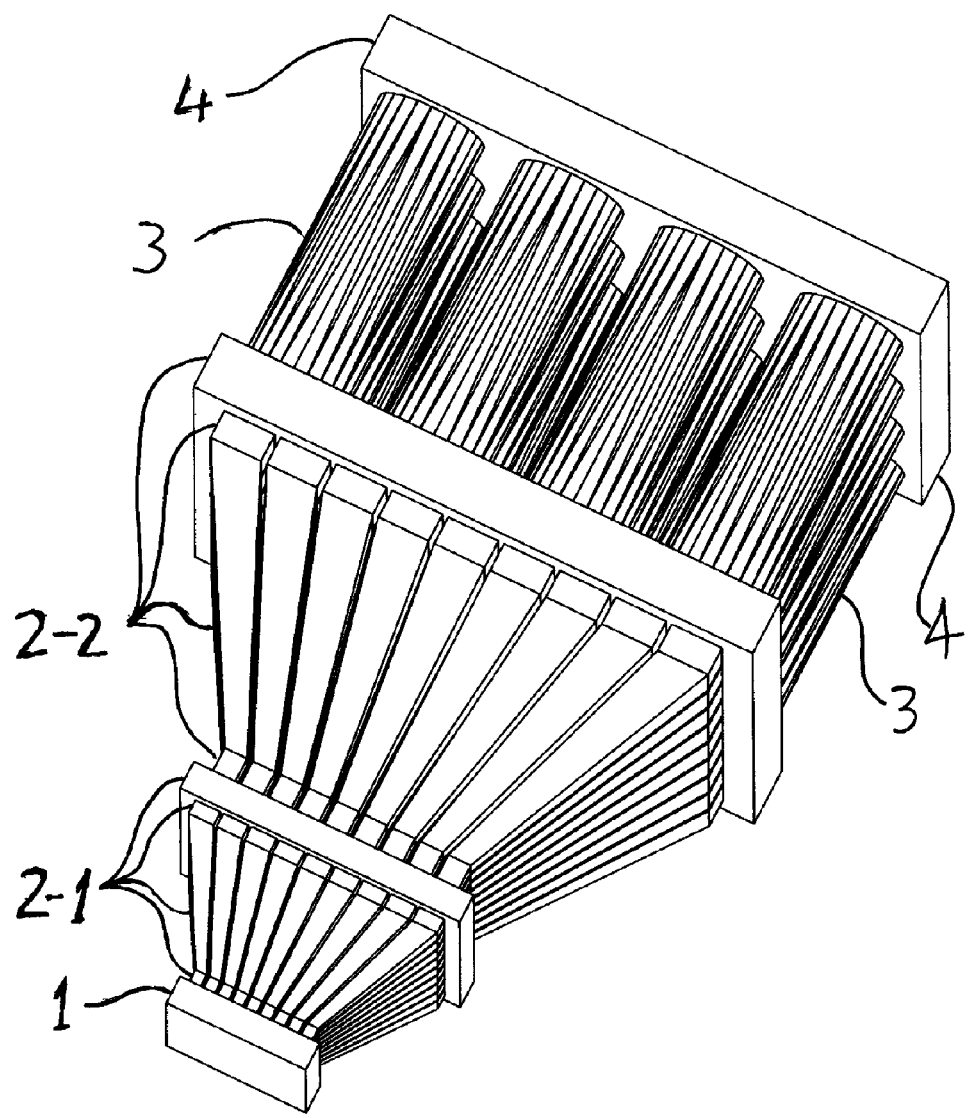

25. FIGS. 49 through 51 show a TWO-STAGE spreader, with fanning columns. Of course, we can have 2-stage spreaders with vertical columns, but they are not shown in this figure.

Figure 52:
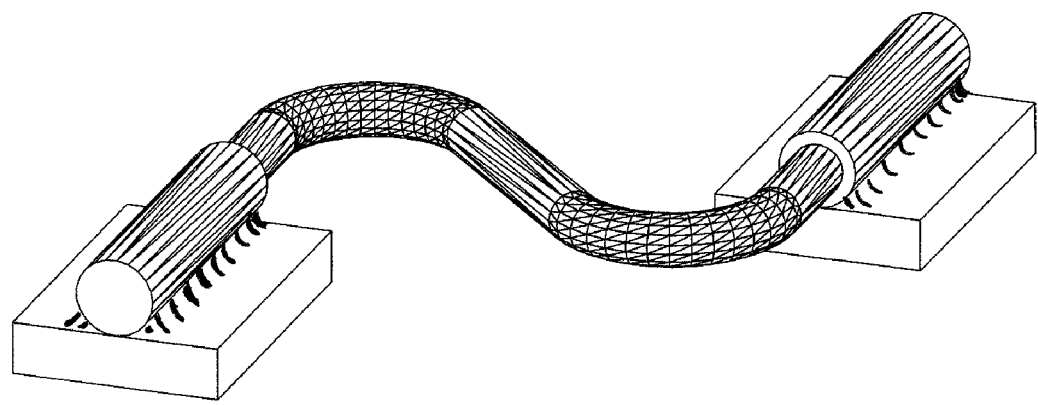
Figure 53:
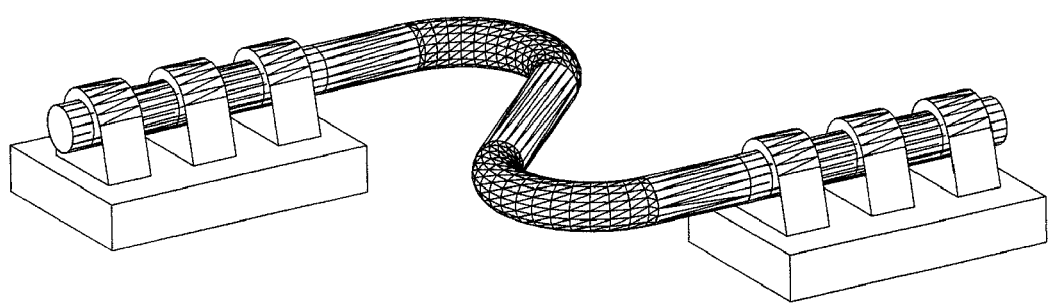

26. FIGS. 52 and 53 show some embodiments for attaching the platform to either the heat source and/or to the heat sink. The loop heat pipe here is shown as a flexible round tube.

Figure 54:
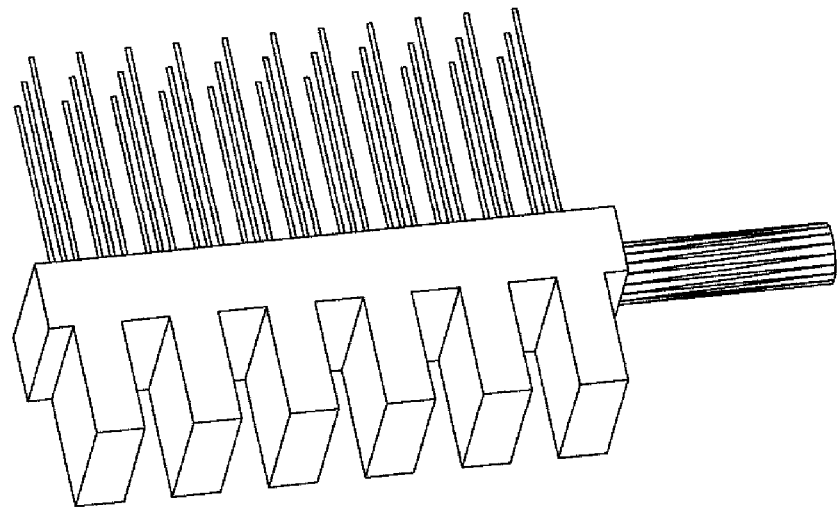
Figure 55:
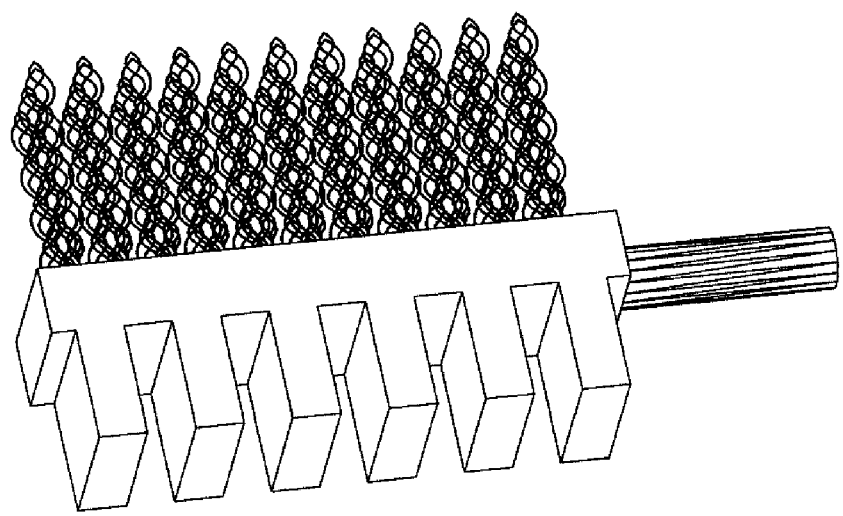

27. FIGS. 54 and 55 show an elongated end of the LHP, arranged to have some columns, which look like teeth or like a toothbrush at the interface surface, which will attach to the device at one side and to an optional cooling medium at the other side.

Figure 56:
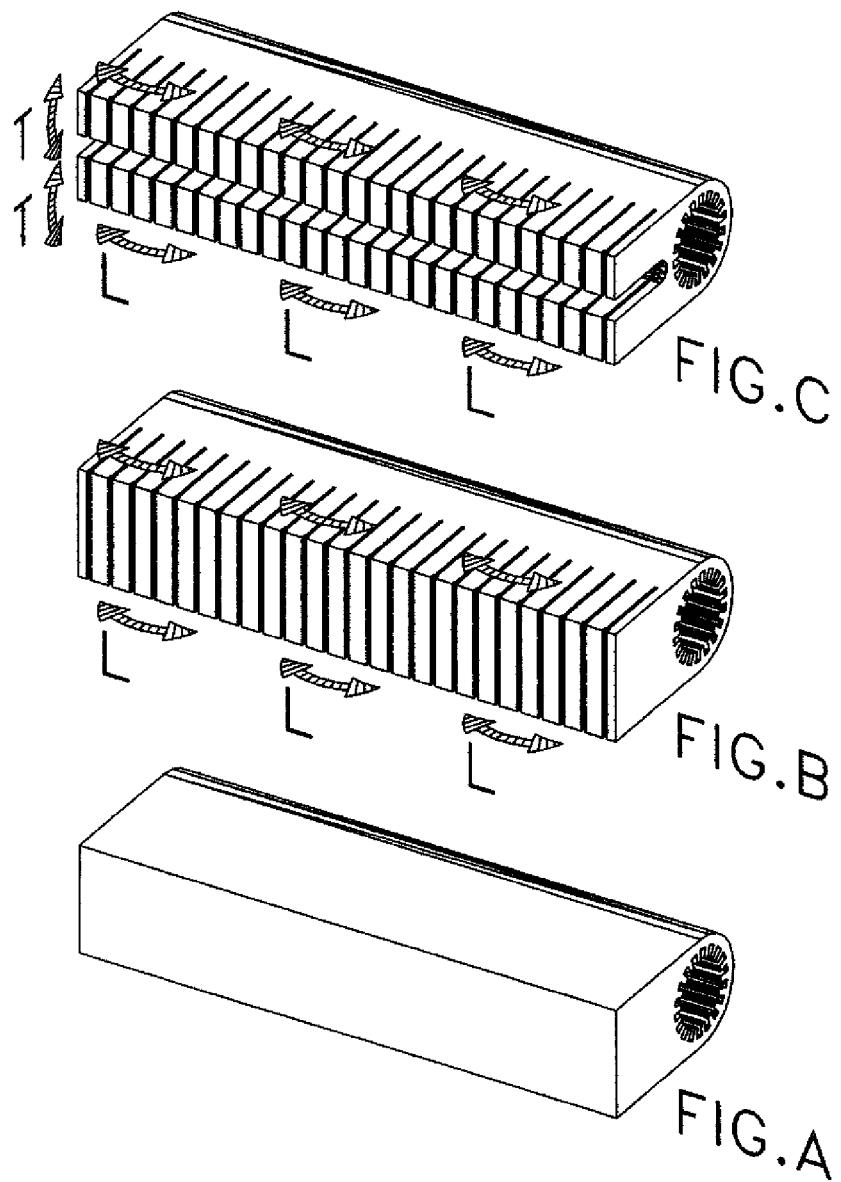

28. FIG. 56 shows three such "ends" of a LHP. Fig. A shows a solid "heel", and can be used when the conditions are not severe enough and do not warrant any flexible joints. Fig. B shows the teeth/columns which can flex in the axial/longitudinal (L) direction and Fig. C shows a slit along the middle, to allow the columns to flex in both the longitudinal (L) as well as the transverse direction (T), if needed. It can also have more than one slit, as will be seen later.

Figure 57:
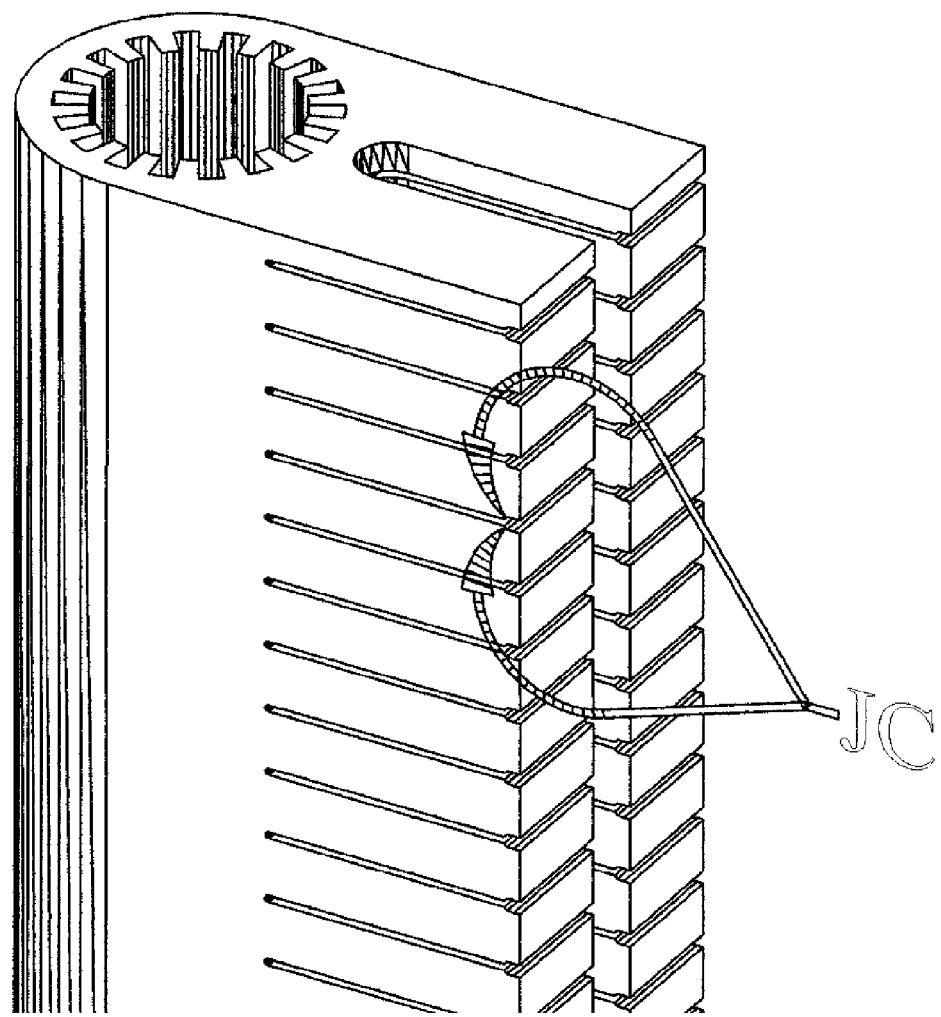

29. FIG. 57 shows an enlarged view of the end of Fig. C in the above drawing. It also highlights the chamfers provided at the tip of the columns, to help in the soldering/attachment process, if necessary.

Figure 58:
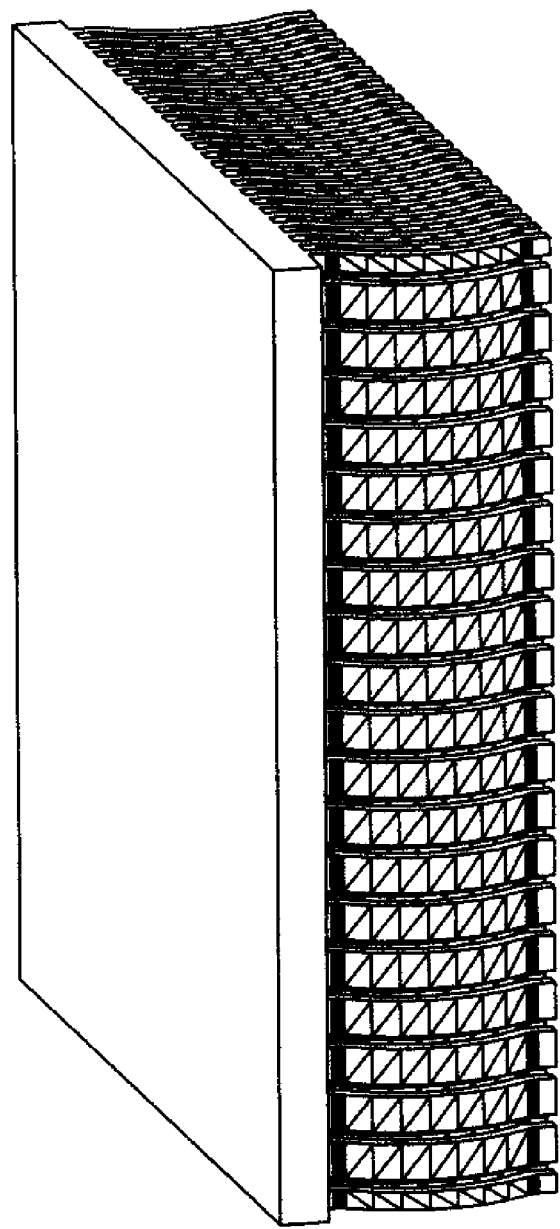
Figure 59:
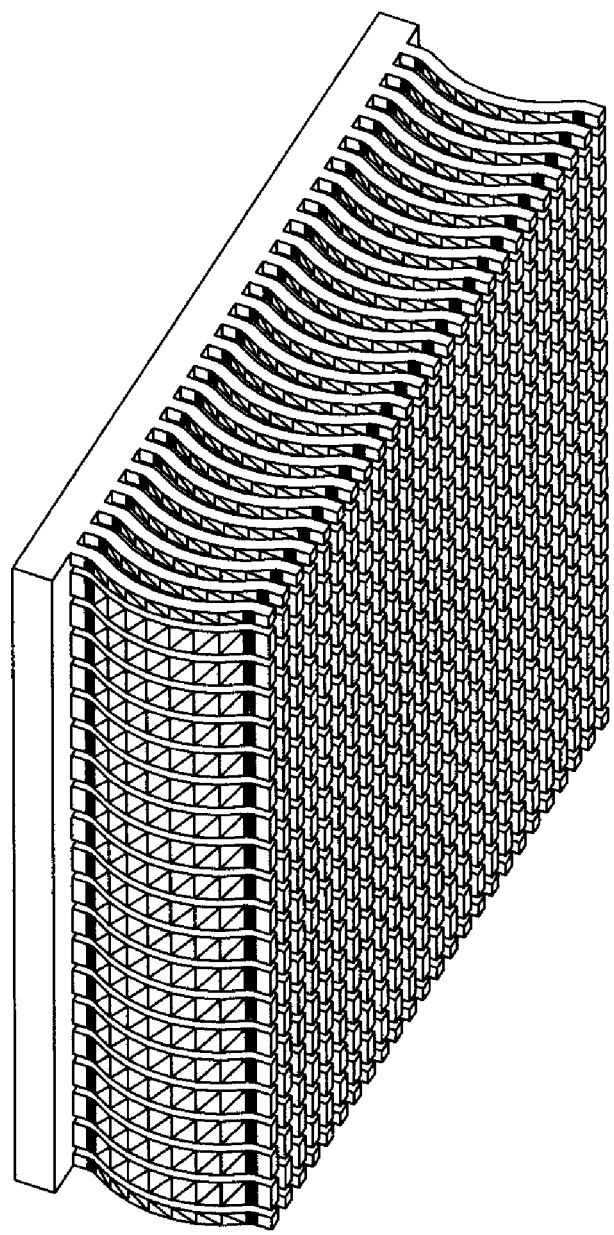

30. FIGS. 58 and 59 show an elaborate way to provide flexible columns, with two degrees of freedom, to absorb CTE mismatches. It may seem as an overkill, but it is available, if and when needed. The important thing to notice is that the columns are curvilinear and are parallel nested at least in one direction. They can be curvilinear in both directions, if needed.

Figure 60:
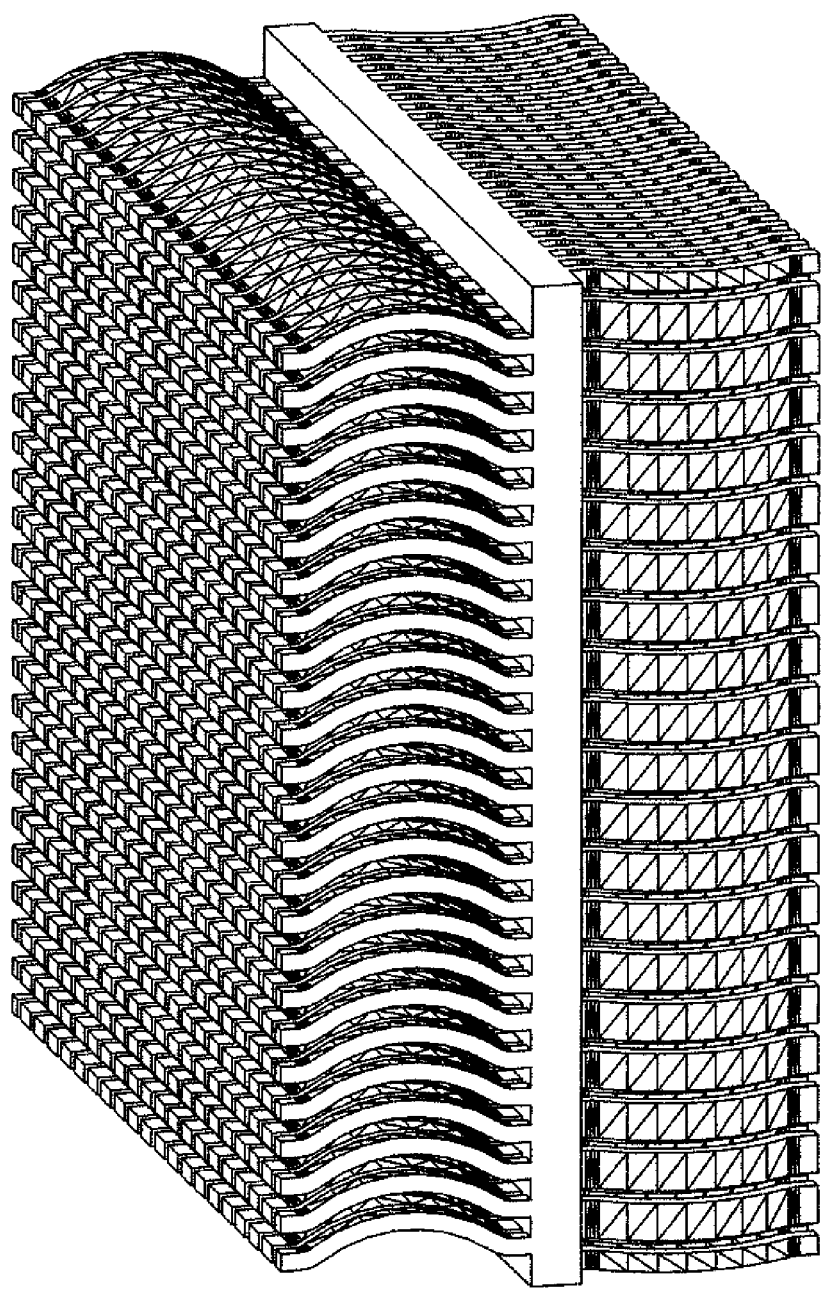
Figure 61:
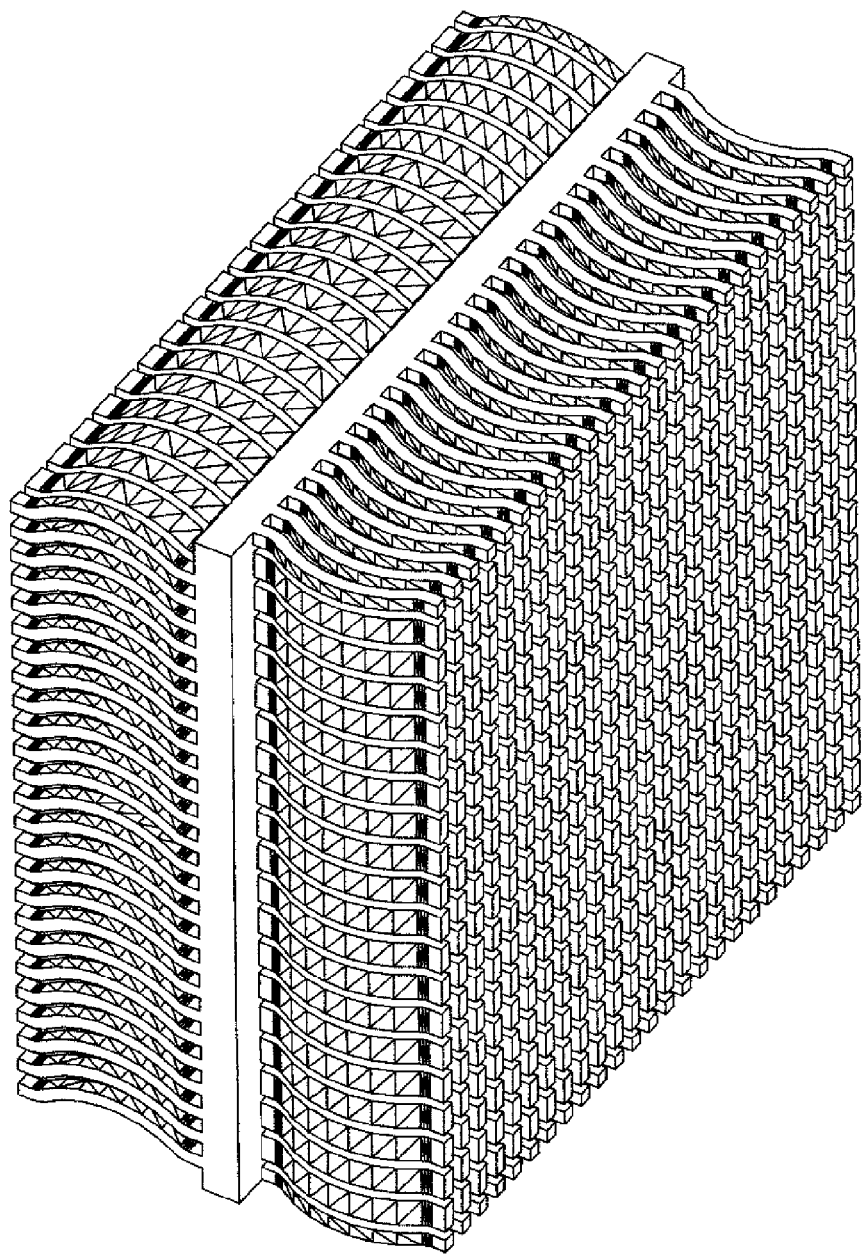
Figure 62:
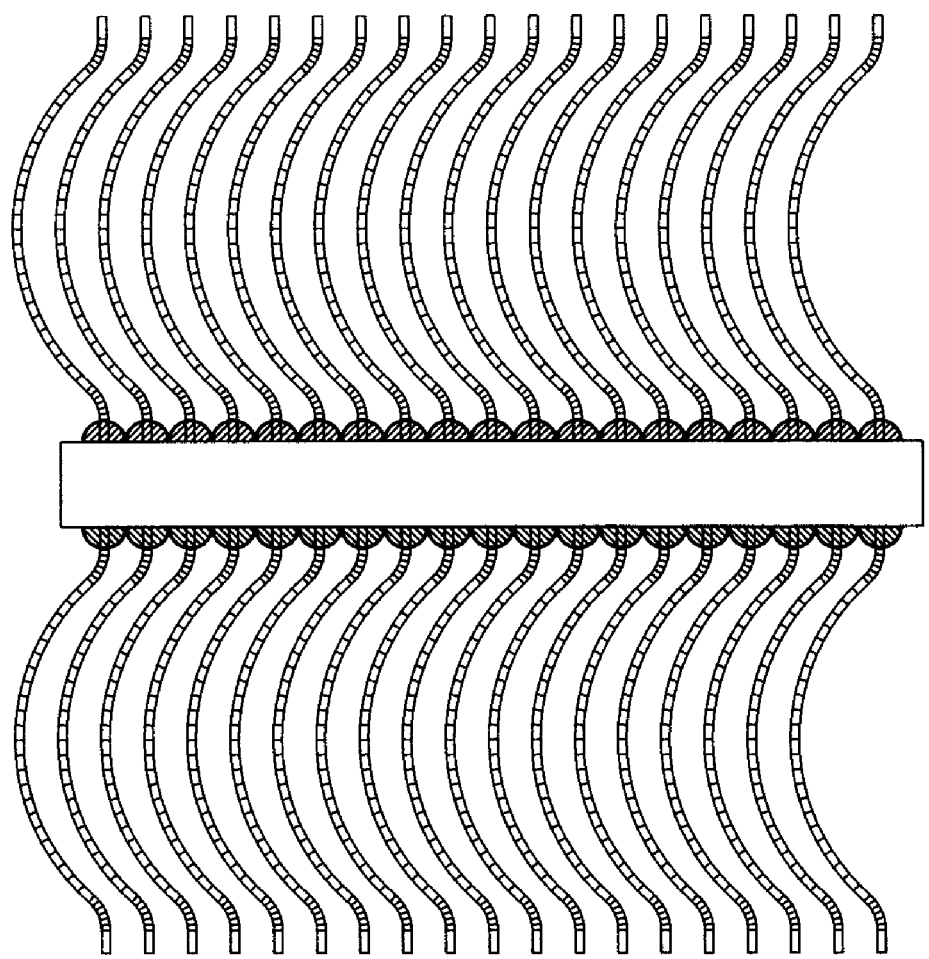
Figure 63:
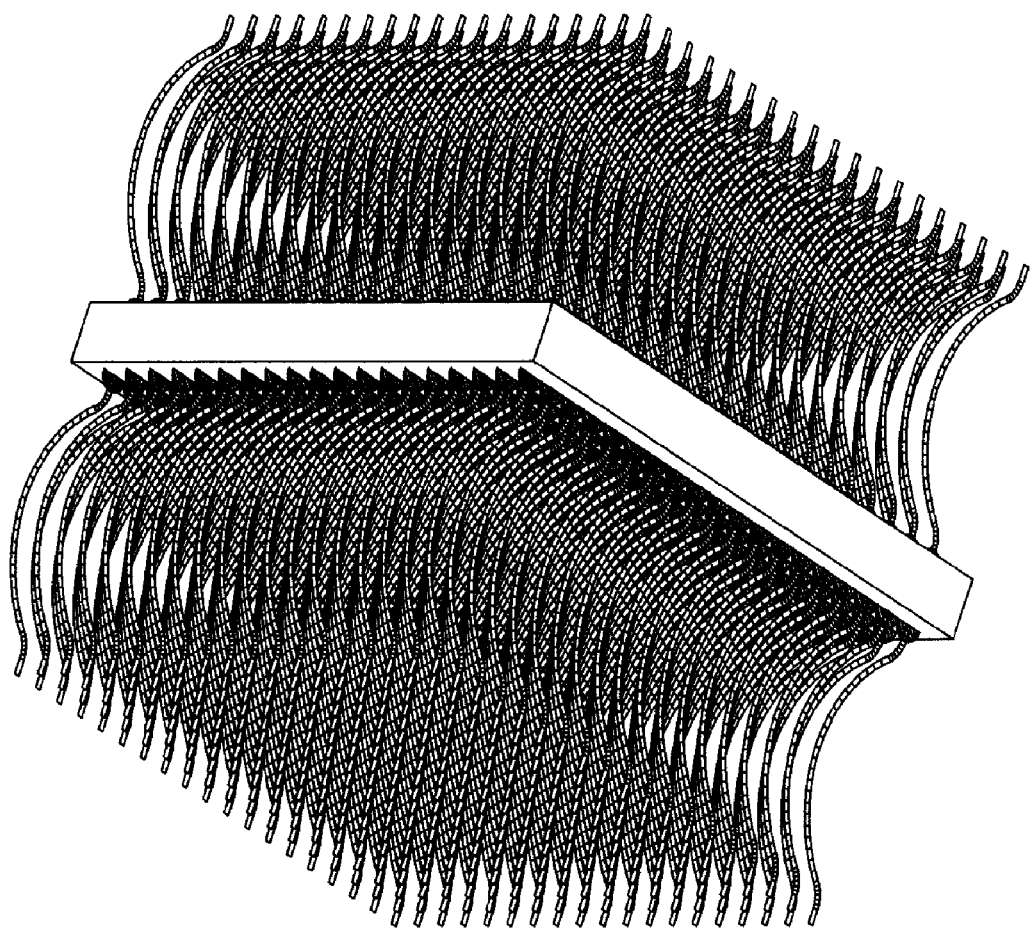
Figure 64:
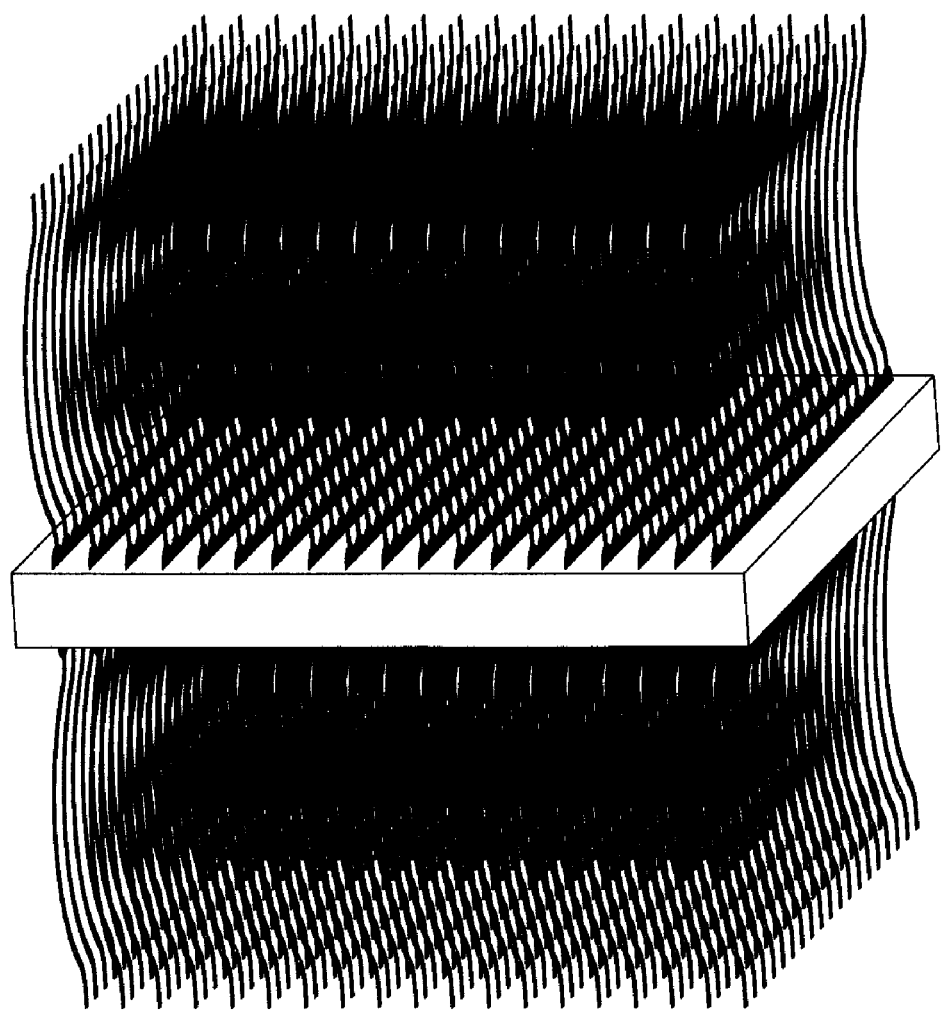
Figure 65:
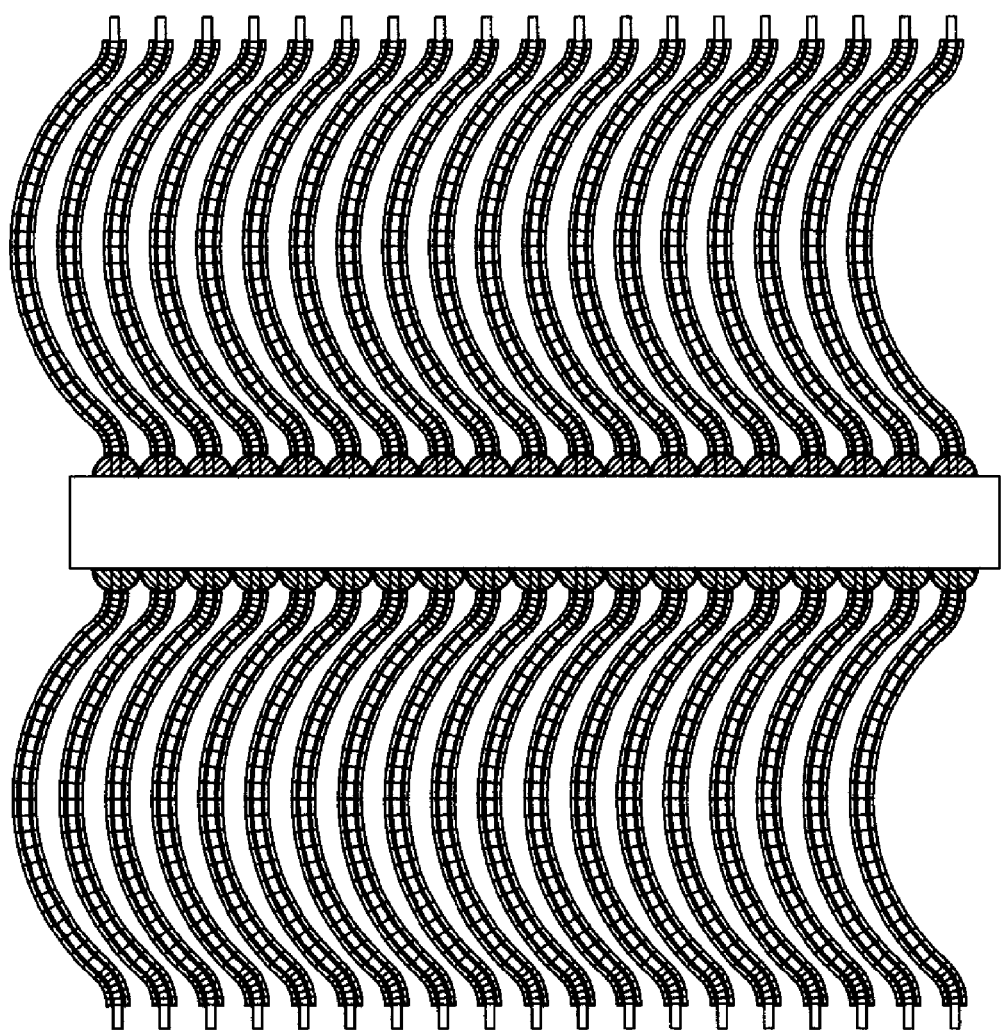
Figure 66:
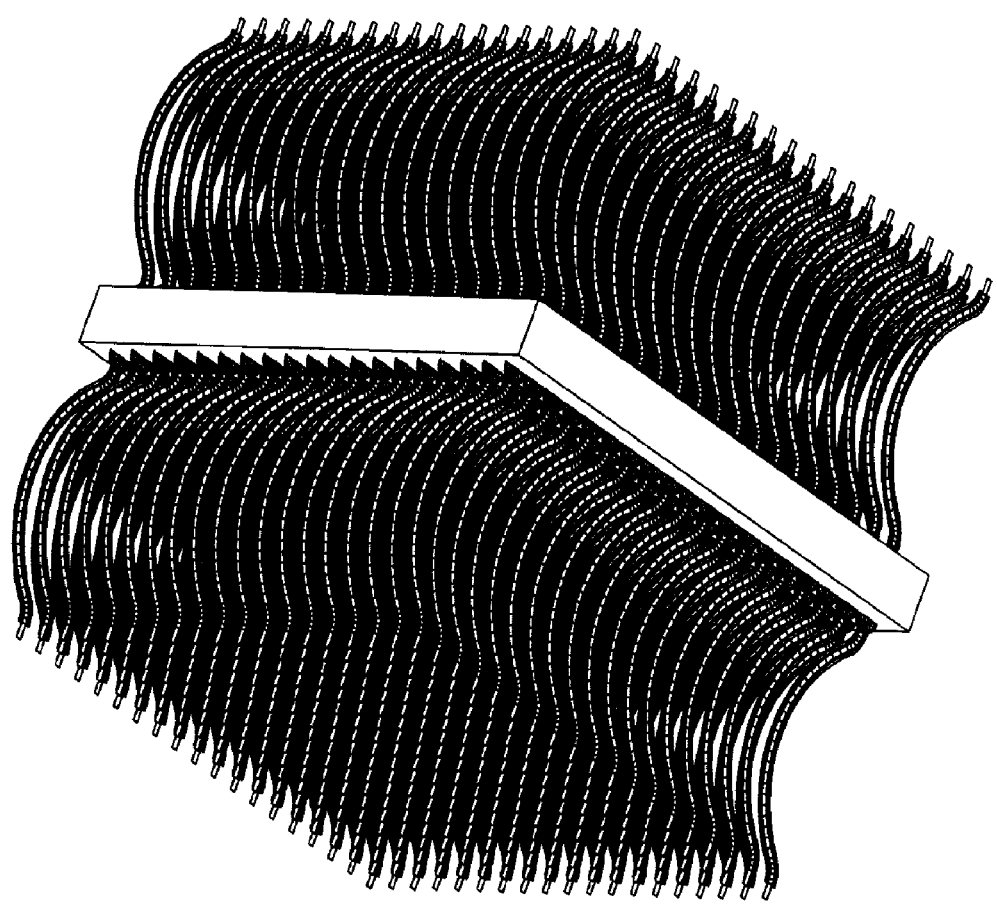
Figure 67:
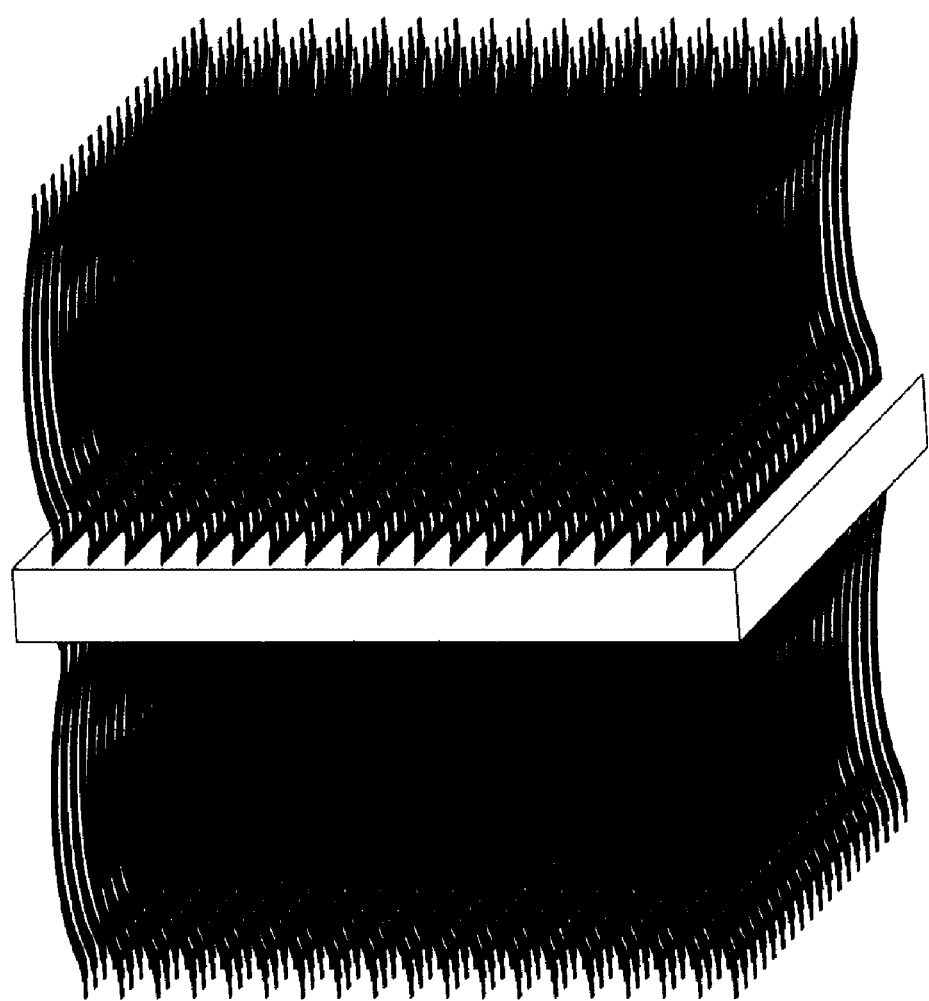

31. FIGS. 60 and 61 show a spreader with such curvilinear parallel nested columns on BOTH sides of the platform. We can resort to this configuration, if and when the CTE mismatch is on both sides of the platform, i.e. between the platform and the respective devices attached to it, at either side. Notice that we can even opt to have the curvilinear shape at one side of the platform oriented at 90 degrees or at any other desirable angle with respect to the curvilinear shape at the opposite side of the platform.

32. FIGS. 62 through 69 show spreaders with curvilinear wires/fibers, again on both sides of the platform. Again we could resort to such configurations, if and when the CTE mismatches at both sides of the platform are large enough that we need to do something about them.

33. FIGS. 70 through 85 show a variety of other embodiments, which have various features, which enhance the serviceability of the spreaders and related components.

Figure 70:
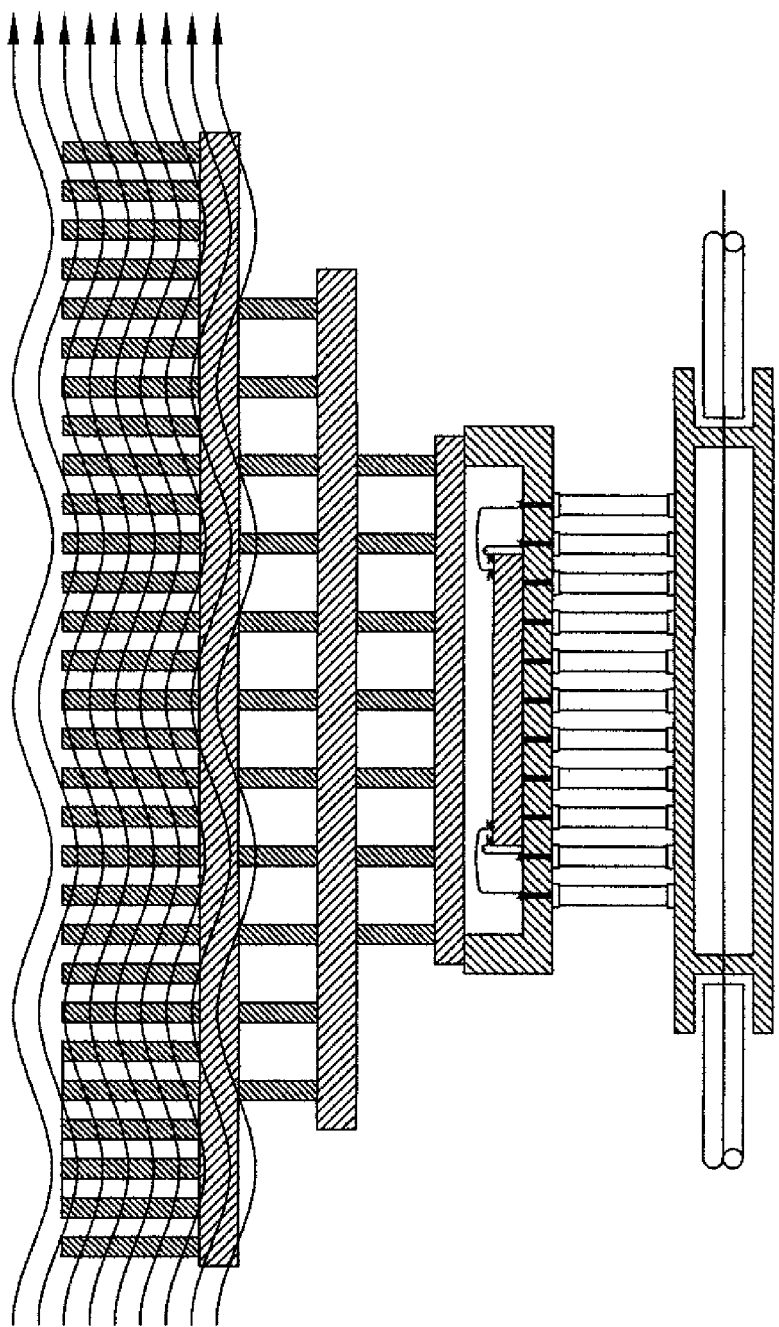

34. FIG. 70 shows an example of a multi level arrangement, where we could end up with vertical heat pipes that are air cooled by a flowing stream of air. Or the vertical member at the top could be regular simple finned heat sinks, not necessarily heat pipes per se.

Figure 71:
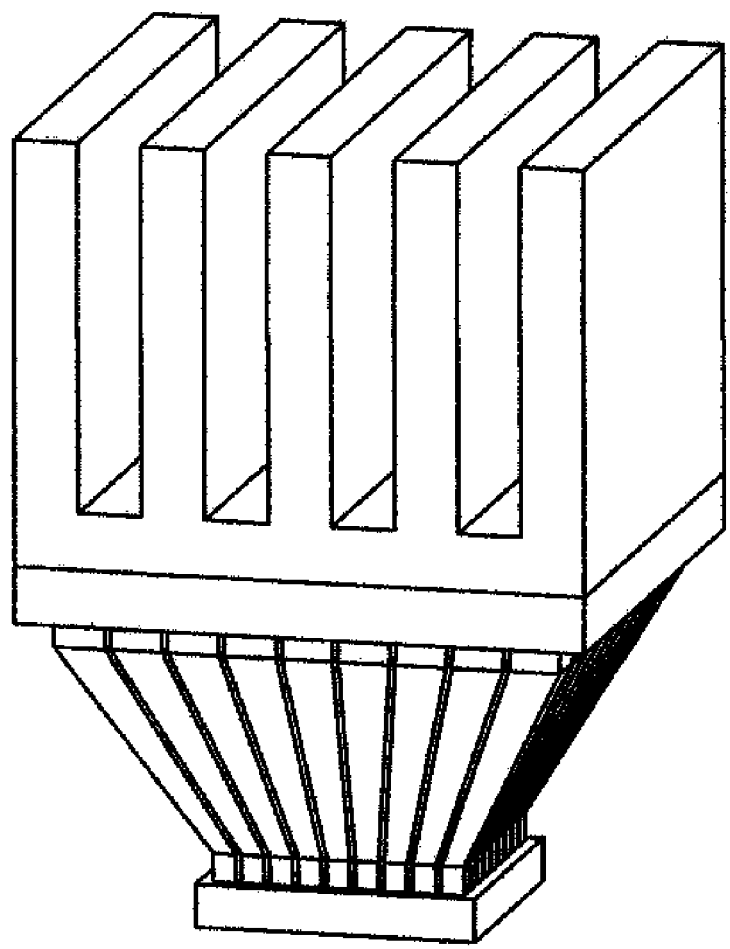

35. FIG. 71 shows a heat spreader with a conventional type of heat sink on top of it.

Figure 72:
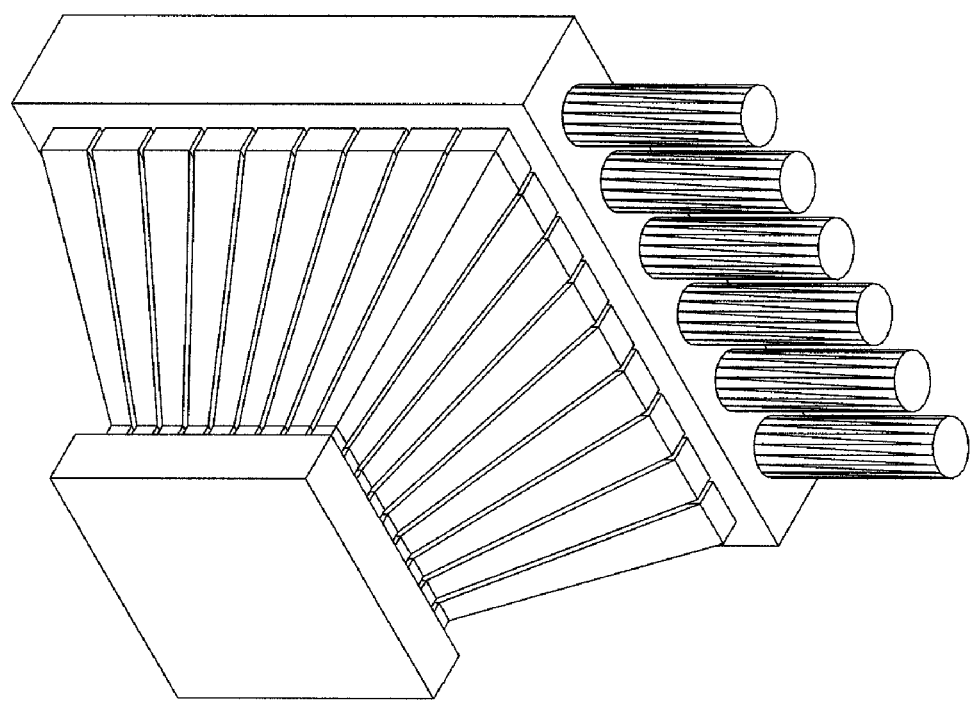
Figure 73:
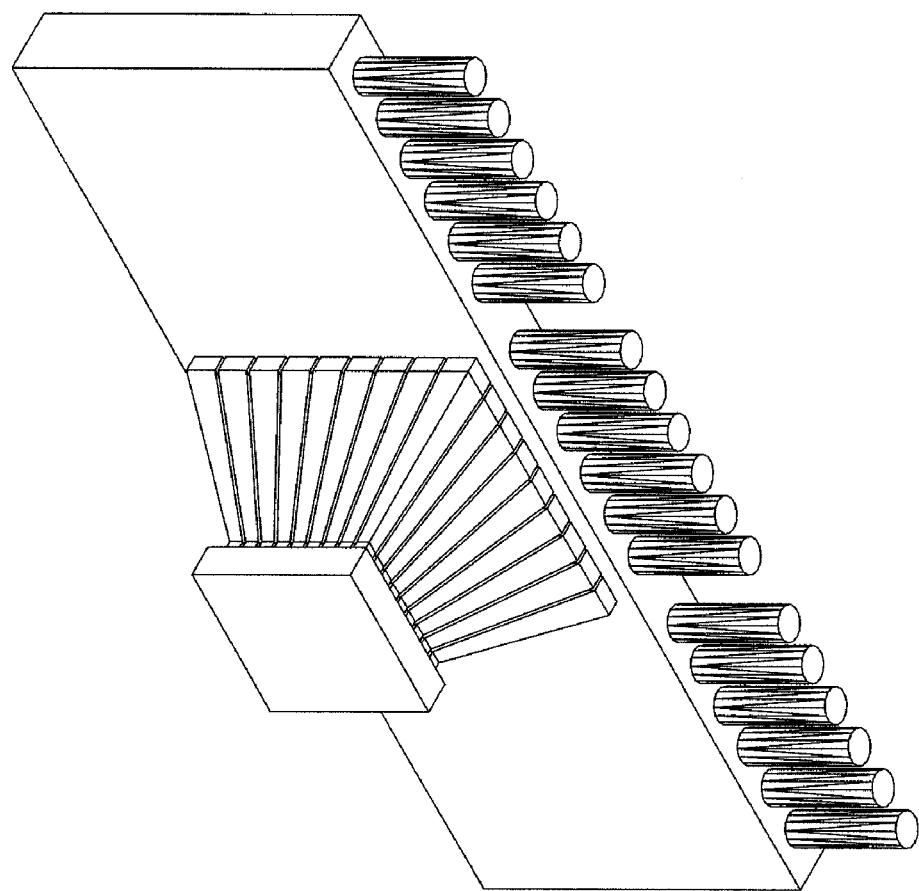

36. FIGS. 72 and 73 show two variations, with fanning columns, and with more than one heat pipe being embedded in the platform.

Figure 74:
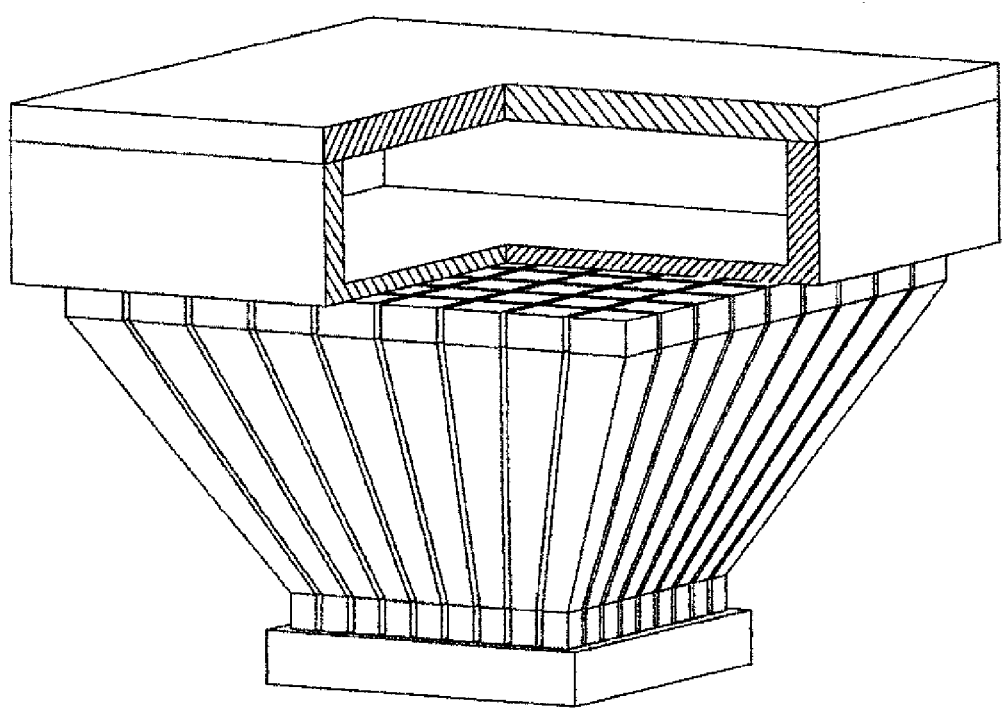

37. FIG. 74 shows that the platform itself comprises a vapor chamber.

Figure 75:
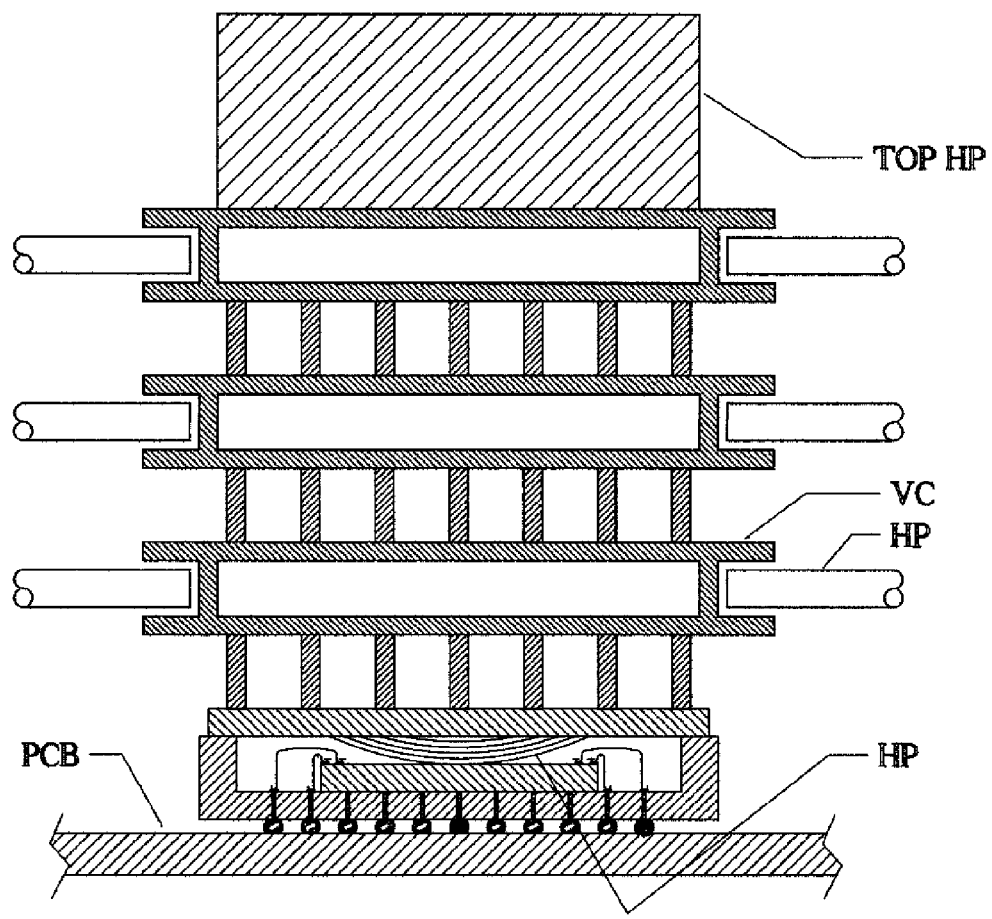

38. FIG. 75 shows multi layer embodiment, where the spreaders platforms are at various levels, and where the arrangement shows a number of new features, such that the first stage spreader, directly on top of the chip carrier, comprises a Vapor Chamber inside its platform, and two LHPs extending from each side, and we can also see that we can add more stages, and one or more LHPs all the way at the top of the last stage.

Figure 76:
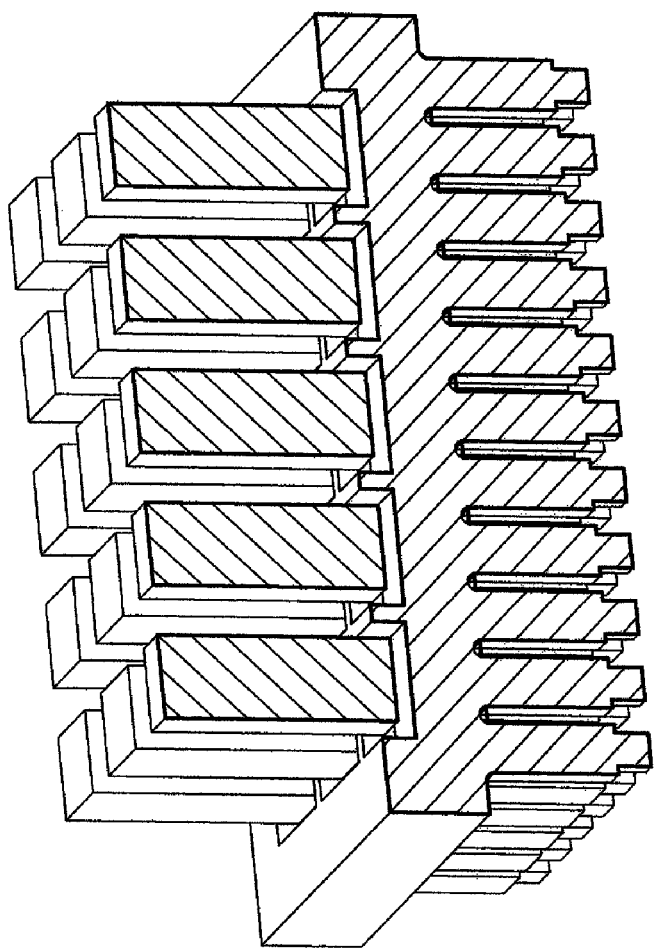

39. FIG. 76 shows a detail for how we can attach columns or LHPs to a spreader platform. The platform can have certain recesses in its surface, as shown at the top of the platform, to accept the individual columns. Then the columns can be glued or soldered or brazed, each one in its respective recess. Also the platform could have the columns, as integral parts of the platform, as shown at the bottom side of the platform.

Figure 77:
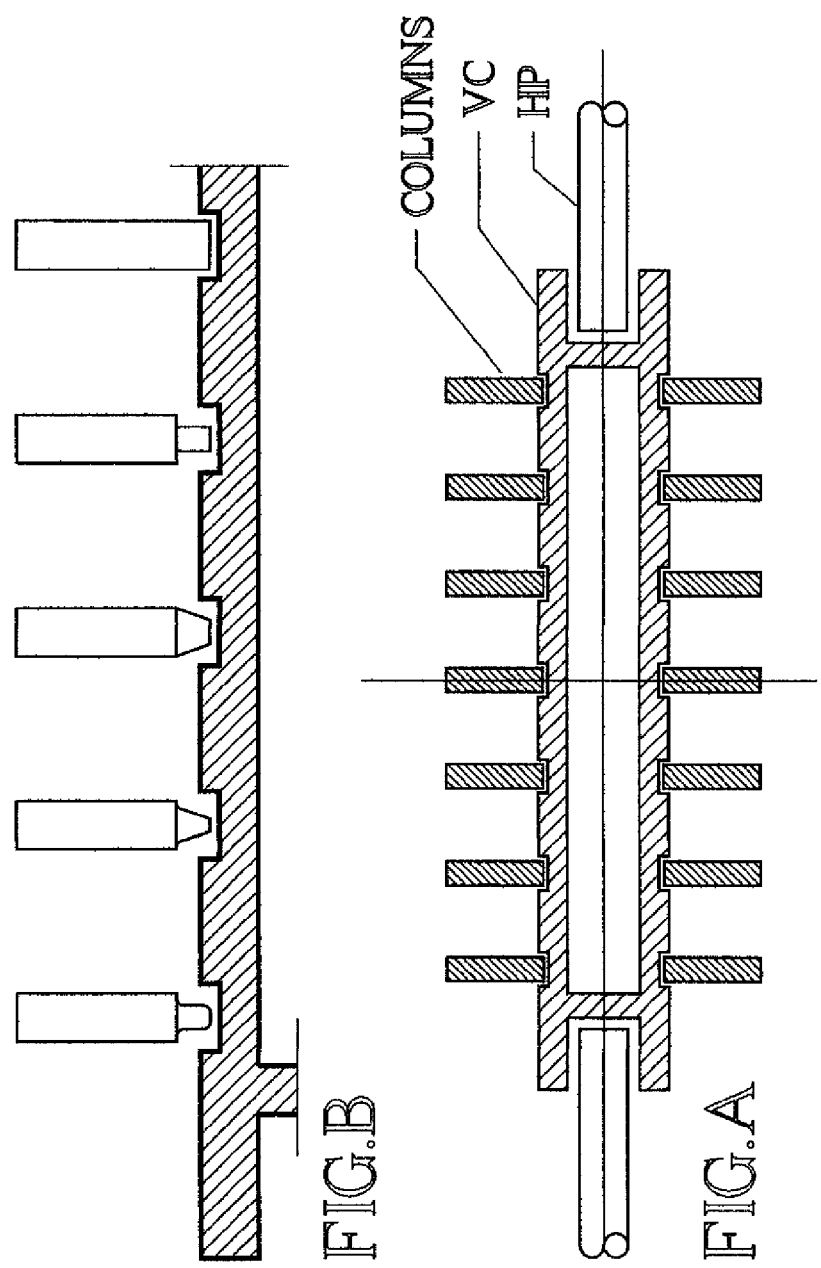

40. FIG. 77 shows some additional details of the Vapor Chamber and related components. FIG. 77-A shows a larger view of the vapor chamber shown in FIG. 75, and FIG. 77-B shows different "endings" of the column tips, which could enhance the reliability of joining those tips to their respective components.

Figure 78:
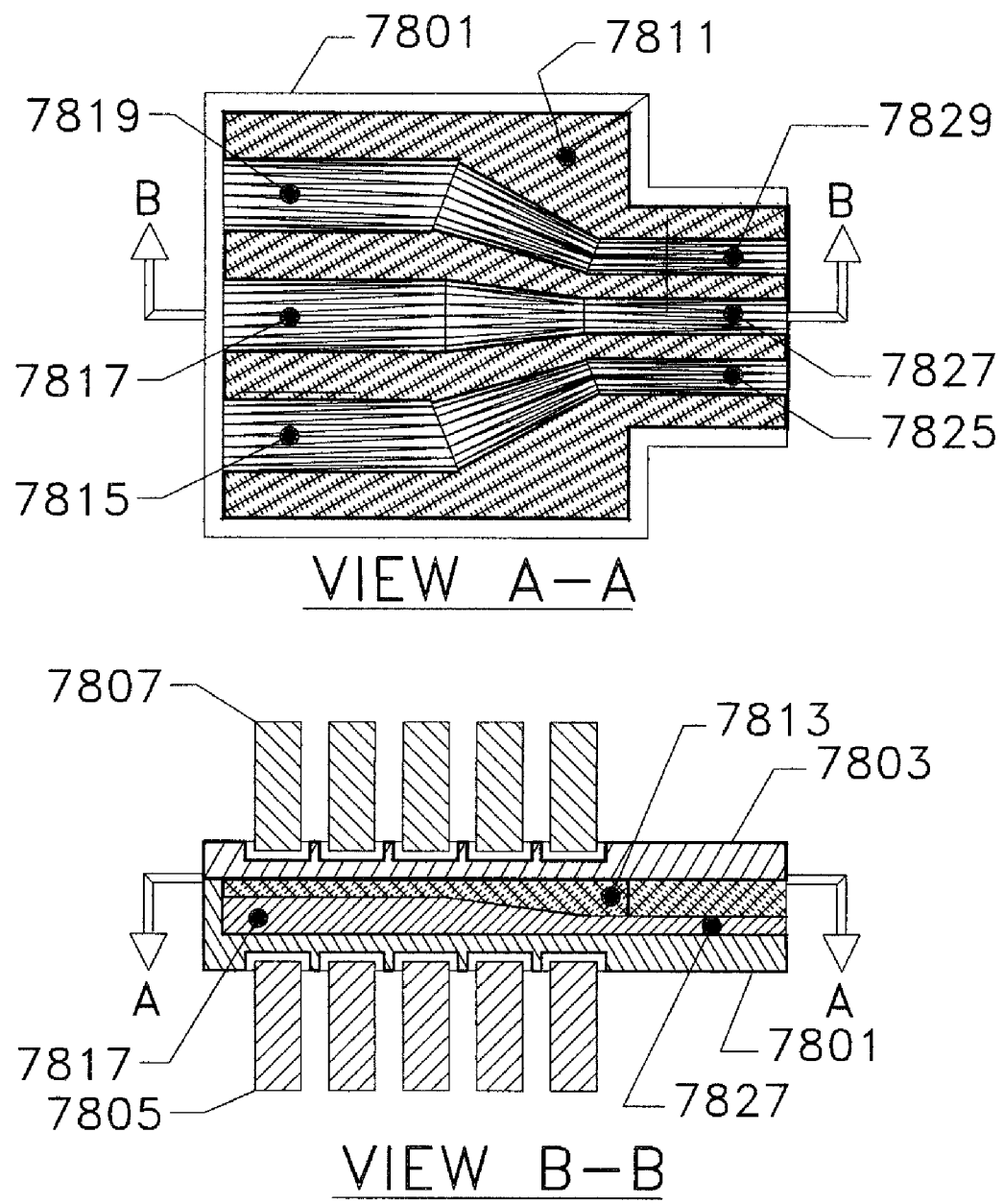
Figure 79:
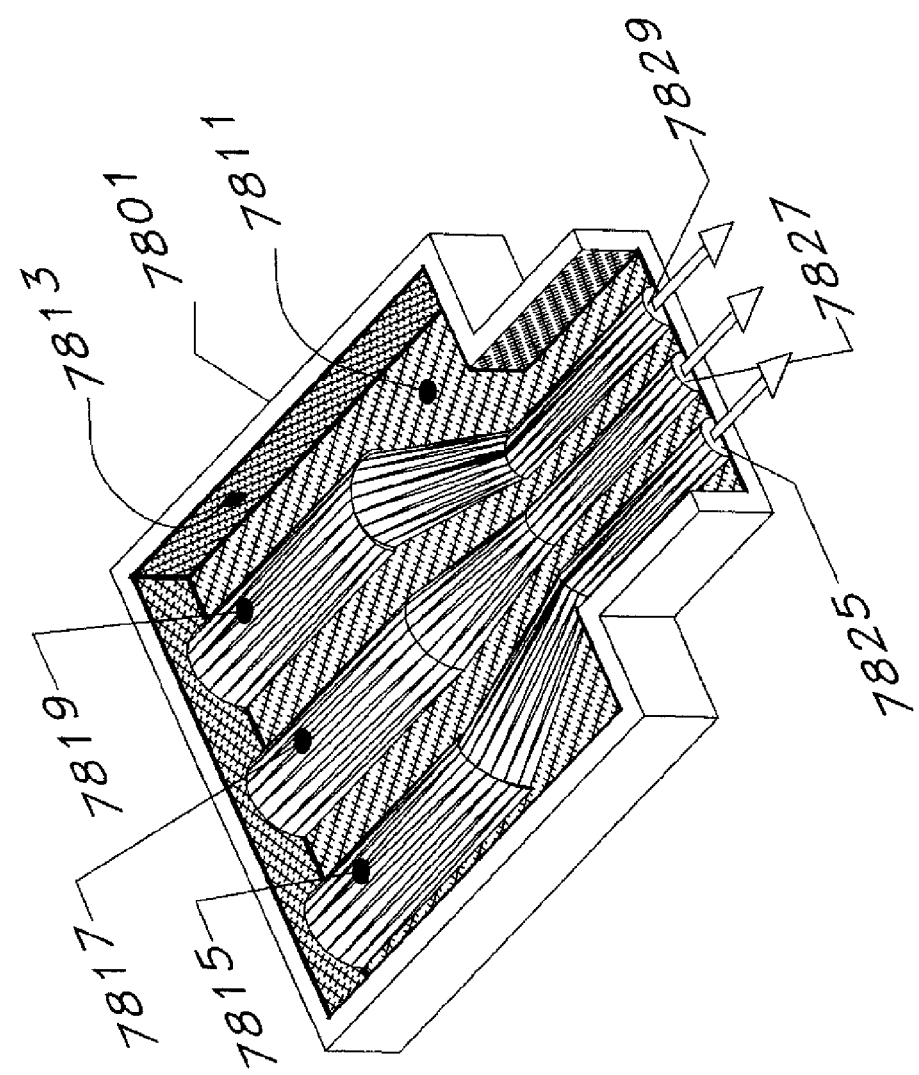

41. FIGS. 78 and 79 show an improvement on the Therma Base or Therma Vapor Chamber, or Flat Plate Heat Pipes, where I have added a number of wicks or wicking "mounds", which could enhance the heat transfer process of such devices.

Figure 80:
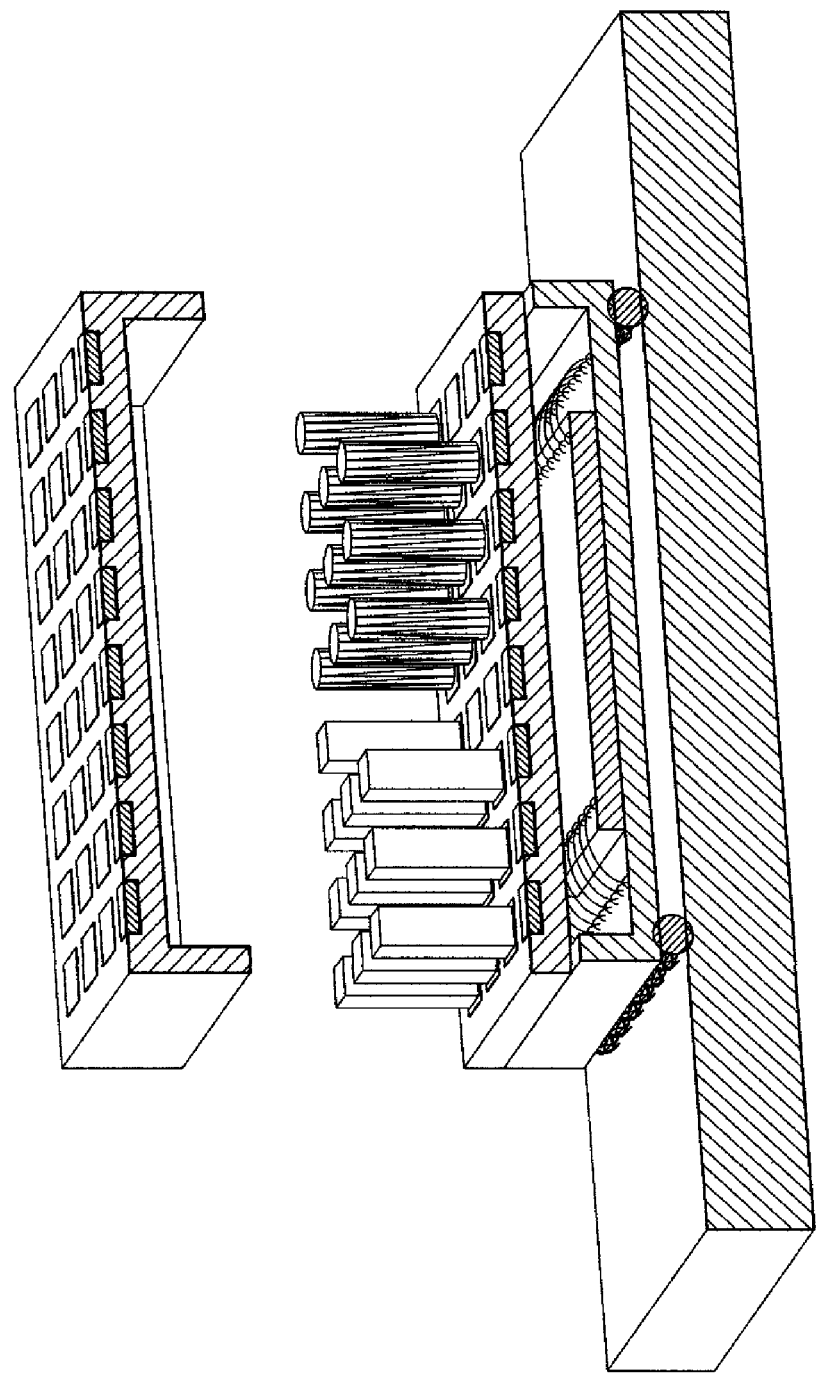
Figure 81:
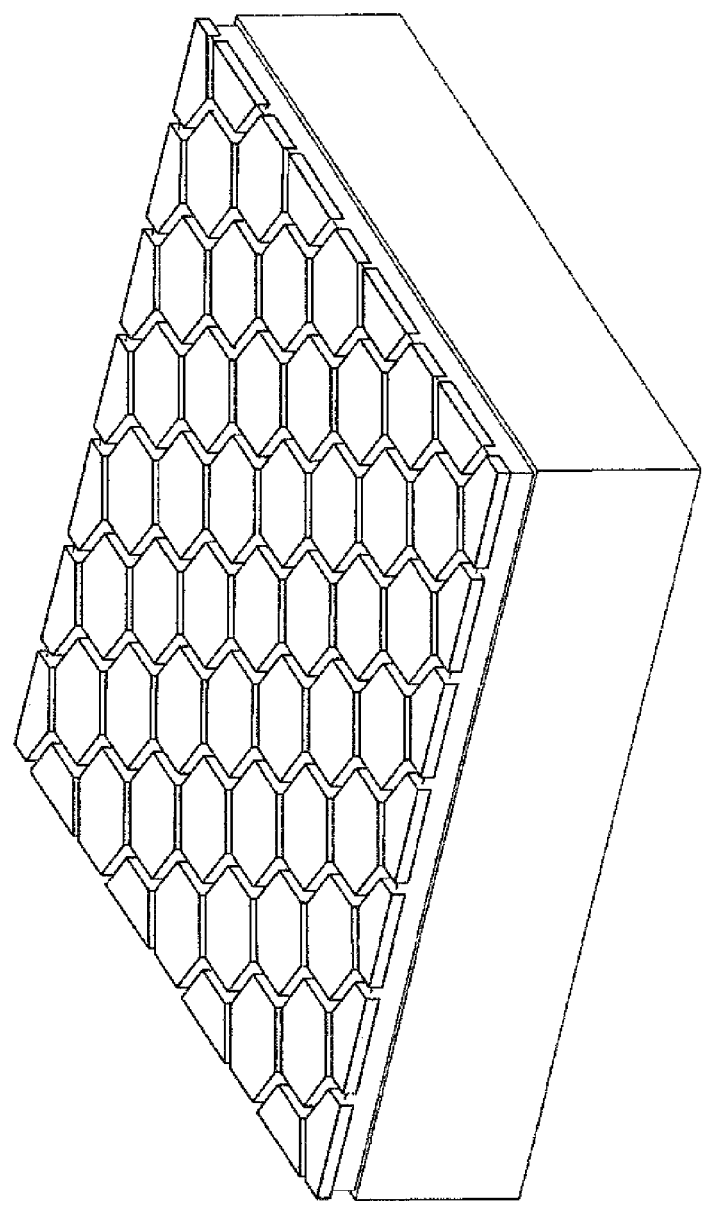

42. FIGS. 80 and 81 show individual metal islands provided in a ceramic chip carrier, to isolate the thermal linear deformation of each island, with respect to the ceramic material, with the intention that the islands will not delaminate from the ceramic material due to thermal cycling or CTE mismatch.

43. FIG. 82-A shows a variation of Thermacore Therma Base, where it is used as part of the PCB, with various components mounted on top of it.

44. FIG. 82-B shows a chip carrier, with metal islands placed in the ceramic housing, to improve heat transfer and the reliability of the solder attachments. These islands will be similar to those shown in FIG. 80, and the columns will be in essence like the ones shown in FIGS. 39 through 41, to transfer the heat from the chip carrier the spreader below the PCB.

Figure 83:
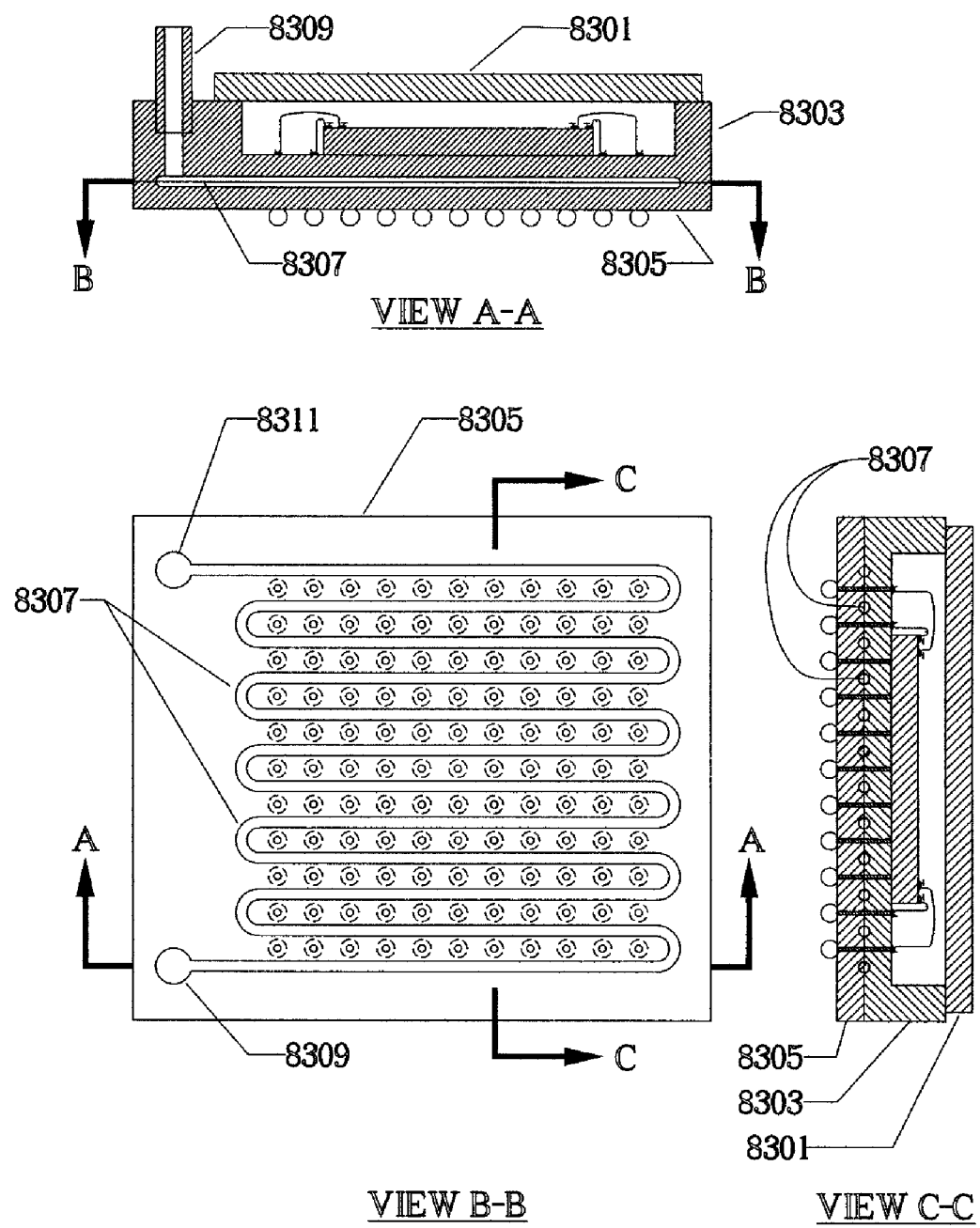

45. FIG. 83 shows three views of a chip carrier housing, where I have inserted a cooling serpentine or a heat pipe that meanders back and forth, trying to avoid the electrical through vias. The serpentine has an inlet and an outlet that will be located at some opportune locations along the chip carrier housing. The serpentine can be in the shape of a circular pattern or can go back and forth like a number of successive letters U's, connected end to end to each other.

Figure 84:
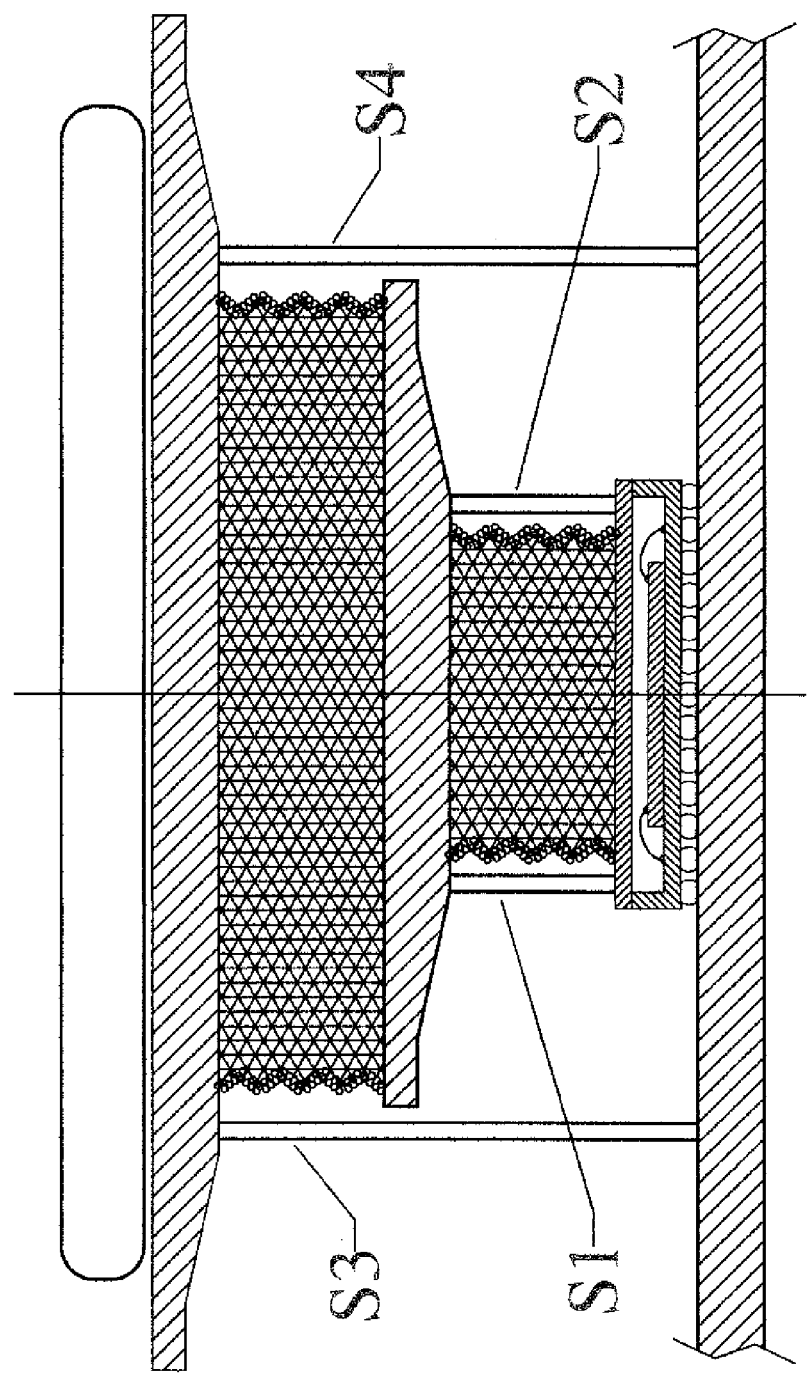
Figure 85:
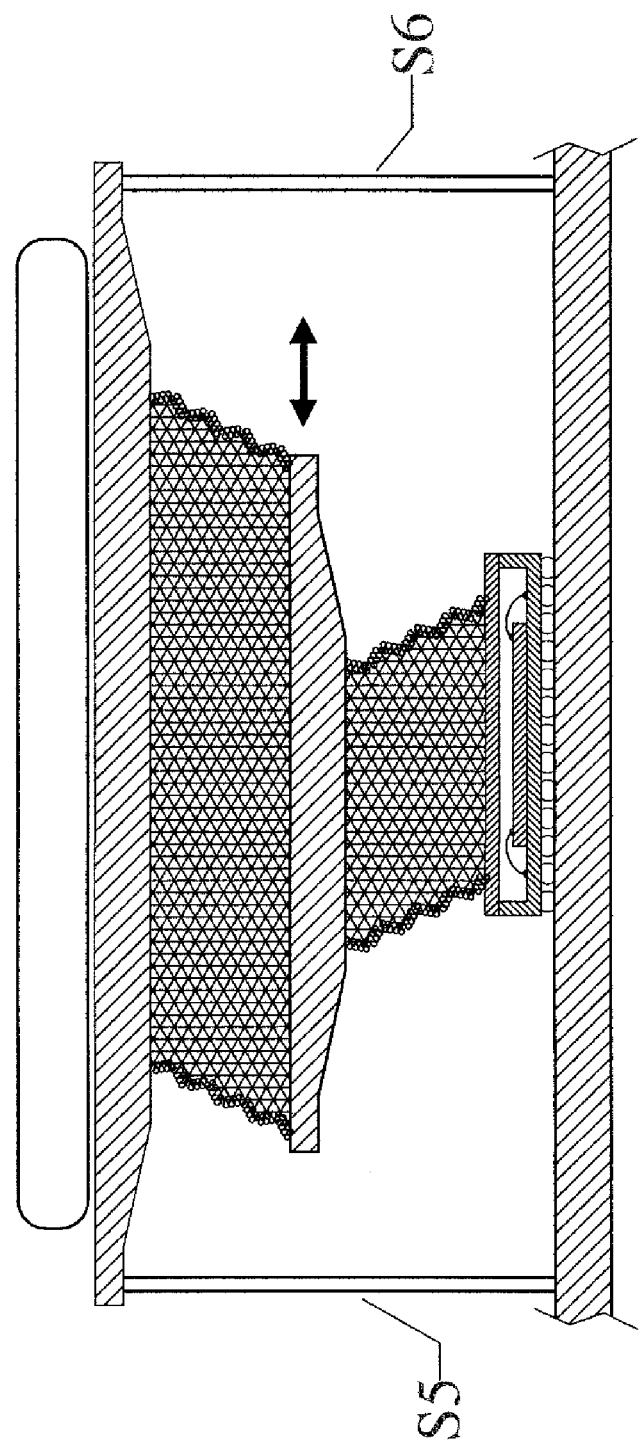

46. FIGS. 84 and 85 show another feature. It is the flex bag or sleeve, which could be provided, to contain any filler materials, like heat conductive gels or similar conductive materials, which we may opt to insert between the platforms. We could also use any conductive fibers, even if they are metallic materials, and electrically conductive, such as metal wool or fibers. They will be OK. Such a gel or other filler materials could be provided to fill any gaps between the columns, or wires, or it can be all we need to put in there between the platforms, inside the flexible bags. This means that we could eliminate the need for the "columns" per se. FIG. 85 highlights the fact that the intermediate platform can move sideways or otherwise, without affecting the function of the setup.

4. DETAILED DESCRIPTION OF THE INVENTION 4.1 Thinking Process and Basic Design Criteria 4.1.1 Based on the above extensive analysis of the problem and its possible causes, and on the requirements of the potential users of the solutions to the problem, I figured that the solution should include at least one or more of the following features and/or elements:

1. A means to reduce the upstream heat flux intensity, coming out from the upstream heat source and going towards the downstream heat sink or cooling system. We will call it a "spreader". The downstream surface area of the spreader, which would interface with the heat sink or cooling system, would be larger than the upstream surface area of the heat source. This leads us to using a "platform" or the like, which would have the proper larger surface area, so as to bring the heat flux value at the downstream surface of the spreader down to the desired lower level or magnitude.

2. If it is deemed necessary, e.g. the difference between the surface area of the heat source and the spreader is too large, then we could use multi-levels, or multi-stages, of spreaders, to make the transition between one level and the next more gradual. This of course would extend the height of the spreader.

3. Another way is to extend the spreader sideways in one or more directions, generally parallel to the heat source, to limit the height of the spreader. In other words, we could extend the spreader and its platform(s) either in the height or in the width.

4. The spreader(s) should be made of a good heat conducting material, such as copper or aluminum or the like. And if the spreader will be use in aerospace applications or the like, then the weight of the material should be an important factor to consider as well, and should be as light as possible and as necessary.

5. A means to reduce the mechanical stresses at the interface between the upstream heat source and the downstream spreader and its platform. I chose to use columns or columnar-shaped elements to connect these components.

6. If it is deemed necessary, then we can use such columns also to connect the platform of the spreader to the next links in the chain of the heat path/flow, e.g. between the spreader platform and the downstream heat sink, and/or between the various levels/stages of spreader itself.

7. Depending on the geometry of the expected end product, the connecting columns can be perpendicular to the heat source and/or the spreader(s), which would make them practically parallel to each other.

8. The spreader's platform could be made thicker near the center, tapering off towards the outside edges, where such geometry would help in spreading the heat, or rather the temperature, more uniformly along the heat exit surface of the spreader. The tapering can be in the shape of a triangular, trapezoidal or convex cross section, thicker near the focus of the heat source and getting thinner as we go further away from that center.

9. The columns could also fan out, to transition between the small narrow surface of the heat source and the larger wider spreader platform.

10. The columns also should be made of a good heat conducting material, such as copper or aluminum or the like. And their weight is to be considered as well, if they are made of a different material than the platform.

11. Both columns as well as any other components the spreaders, including the platform, should be easily fabricated and should be capable of being attached to each other and to the heat source and the heat sink and any other adjacent element, as necessary as well. For example, they should be able to be soldered, brazed, glued, or attached to each other one way or another.

12. The columns could be shaped to have a uniform cross section, especially if they are parallel to each other, or if they are fanning out, then they could be tapered, with a narrow cross section near the narrow heat source and a larger cross section near the larger platform.

13. The columns or rather the columnar elements could have a generally longitudinal axis, which can either be straight or curvilinear, and in which case, they could even be parallel nested.

14. The spaces between the columns can be kept to a minimum, so as to keep the columns as thick as possible, thus keeping the "total or combined" cross sectional area of "all the columns combined" as large as possible, so that the columns could have the least possible thermal resistance, so that the columns would conduct as much heat as possible.

15. The spaces between the columns could remain empty or could be filled with some flexible, heat conductive material, e.g. good heat conducting elastomer, to enhance the heat transmission through the spreader, but making sure that we do not hinder or reduce the flexibility of the columns with respect to CTE mismatch between the interactive components of the whole setup.

16. Since the columns do not need to be electrically insulated from each other, then they could be allowed to touch each other, if it happens. We need, however, to make sure that they would not interfere mechanically with each other's independent movements and flexibility.

17. On the other hand, we can reduce the diameter of the columns and keep the height small and use more such columns, or we can even use thin fibers, as in FIGS. 29 through 32, 54, 55, 62 through 69, 84 and 85.

18. Actually, we can use very thin columnar elements, as long as we keep the total area for the heat flow as large as possible. We can even go one step further. We could use thin strands, like hair strands, of heat conductive materials, even nano fibers, and these strands can even be tangled up together, even like the steel wool pads, used to scrub pots and pans in the kitchen, as long as we attach one side or end of the pad to the heat source and the other side or end to the spreader platform or directly to the heat sink, or between the spreader platform and the heat sink.

4.2 Design and Drawings Progression

I grouped the drawings in the following seven Groups as in the list below, going from the required scheme, to the helpful prior art, then to the simplest spreader designs, then to the more elaborate and complex designs. However, the drawings which were attached to my SBIR proposal will be described before these 7 groups. Also, some of the Figures, which were originally part of Group 2, are shown later, between the drawings of Group 5 and Group 6. These groups are:

Group 1: SPRDR_PPA-1_DWGS-Intro.doc

Group 2: SPRDR_PPA-2_DWGS-Overview.doc

Group 3: SPRDR_PPA-3_DWGS-Vertical_Cols_Spreader.doc

Group 4: SPRDR_PPA-4_DWGS-Fanning_Cols_Spreader.doc

Group 5: SPRDR_PPA-5_DWGS-Multi_Levels_Spreaders.doc

Group 6: SPRDR_PPA-6_DWGS-Double-Sided_Spreader.doc

Group 7: SPRDR_PPA-7_DWGS-Specials.doc 4.3 So, now I will describe the drawings and the chosen embodiments.

5. DETAILED DESCRIPTION OF THE DRAWINGS AND THE PREFERRED EMBODIMENTS 5.1 While the invention is susceptible of various modifications and alternative constructions, certain illustrated embodiments thereof have been shown in the drawings and will be described below in detail. It should be understood, however, that there is no intention to limit the invention to the specific form(s) disclosed, but, on the contrary, the invention is to cover all modifications, alternative constructions, and equivalents falling within the spirit and scope of the invention as defined in the claims.

While I am describing the drawing in more details, I will at the same time explain the technology basis of the invention. I will also include a number of examples in this section, which should be considered as part of the embodiments for the purpose of this application as well.

This description covers more than one invention. The inventions are based partly on the same technology platform, but then each of the inventions has some additional features of its own. I would like to leave it to the patent examiner to decide on the number of the inventions contained and how to split one invention from the other.

Finally please note that the dimensions, especially the height of the devices, shown in the various figures are arbitrary and not to any special scale. They just illustrate the design concepts. The actual dimensions of any of the devices, according to the shown embodiments, should be chosen to suit the specific respective application case.

5.2 First, I will describe the general typical scheme of the required setup, and then will define the typical elements of the drawings and their reference characters:

1. FIG. 1 shows the general scheme of the required set up, based on my interpretation of the SBIR requirements. The box (2) between the CC (1) and the new heat sink (3), or the Loop Heat Pipe (LHP) (3), as shown in this case, with its evaporator end (3E), represents the desired new device, which will provide all the features necessary to satisfy the requirements, goals and objectives of the SBIR solicitation. In this case, the heat sink is represented by the Loop Heat Pipe (3), together with its evaporator end (3E) and its condenser end (3C). This kind of cooling/heat sink was requested by the SBIR solicitation.

2. FIG. 8 shows a first glimpse at one of the proposed solutions. It is identified in the drawing as item 2. It is shown in more details in FIGS. 9 and 10, which show that in this case, the heat spreader is presented as having two stages, where the "Heat Spreader First Stage" comprises the elements 23, 25 and 27 in FIG. 9, and the "Heat Spreader Second Stage" comprises the elements 31, 33 and 35 in FIG. 9. I could call it also a "2-stage Heat Spreader". It will be shown in a larger view and will be described in more details in the following figures.

3. FIGS. 9 and 10 show the above spreader, together with some "typical" reference characters (RCs) for certain "typical" elements of the design. These RCs are listed here below. Please note that most of these design elements will be repeated in the following drawings. So, I will not repeat the reference characters in every drawing, unless there are some special or different elements in those drawings.

4. DEFINITIONS or Typical Reference Characters (RCs), as in FIGS. 9 and 10

First, please look at FIG. 9.

Element or Part 11 is a Printed Circuit Board (PCB) or a Mother Board Element or Part 13 represents the solder joints holding the Chip Carrier on to the PCB Element or Part 15 is the Chip Carrier housing Element or Part 17 is the Chip itself, which could be wire bonded to the inside contacts inside the housing Element or Part 19 is the cover of the chip carrier housing. It could be provided with an elevated rim along its outside periphery, to help in containing the solder or any other joining material, which could be used to attach the spreader components to the CC.

Element or Part 21 is the joining material that holds the spreader's columns, or the heat sink, to the top of the chip carrier Element or Part 23 represents the individual columns of the proposed heat spreader. These can take different shapes, e.g. like the fanning columns shown in the Group 4 drawings, or like the ones shown in Group 6 drawings, etc.

Element or Part 25 is the top platform of the proposed heat spreader. This can take different shapes, as shown in FIGS. 10, 18, 27, etc.

Element or Part 27 is the TRANSITION portion of the proposed heat spreader, which is situated between the top platform and its underlying columns. This TRANSITION can take different shapes, as shown in FIG. 15.

PS: Element or Parts 23, 25 and 27 represent what I would call a Stage 1, or Level 1, Spreader. Again, Part 25 could have an elevated rim as with part 19.

Element or Part 29 is the joining material that holds the 2nd Stage spreader's columns, or the heat sink, to the top of the 1st stage spreader underneath it.

Element or Part 31 represents the individual columns of the proposed 2nd stage heat spreader. These too, can take different shapes, e.g. like the fanning columns shown in the Group 4 drawings, or like the ones shown in Group 6 drawings.

Element or Part 33 is the top platform of the proposed 2nd stage heat spreader. This too, can take different shapes, as shown in FIGS. 10, 18, 27, etc.

Element or Part 35 is the TRANSITION portion of the proposed 2nd stage heat spreader, which is situated between the top platform of this proposed 2nd stage heat spreader and its underlying columns. Again, this TRANSITION too, can take different shapes, as shown in FIG. 15

PS: Element or Parts 31, 33, and 35 represent what I would call a Stage 2, or Level 2, Spreader.

Element or Part 37 is the joining material which will hold the ultimate heat sink, say a heat pipe or the like, on to the top platform of the spreader underneath it.

Element or Part 39 is the heat sink, which will suck out the undesirable waste heat from the top platform out to the outside world, which could be the Satellite Prime Thermal Control System.

Now, please look at FIG. 10.

Element or Part 41 and 43 are suitable support elements, which could carry the PCB. They could have some cushioning sub-elements to counteract any shock and vibrations during shipping, handling and/or during operations in harsh environments.

Element or Part 45 and 47 are Flexible Circuits elements. They could be needed if the support system of the PCB and the Chip Carrier are independently articulated from the rest of the satellite system.

Element or Part 49, 51 and 53 are more support elements, which could be added to support the fragile elements of the stacked setup shown. Again, they could be dampened and their linkage could be designed to work with the proper instantaneous center of rotation of any expected or suspected possible motions, which would be the center of the expected motions of the system. For example, the angle shown is 90 degrees to the linkage shown in FIG. 10.

Element or Part 55 is the top platform of a respective heat spreader. It can be shaped such it could easily accept the linkage which would support the system.

5. Now I will describe the drawings that I have included in my SBIR proposal. This will act as a first "executive summary". I will revisit these same drawings later, down below. After that I will go to describe a second executive summary and then all the rest of the drawings.

6. THE PROPOSED SOLUTIONS, SUBMITTED IN MY SBIR PROPOSAL

The solutions proposed to the Air Force SBIR were represented by the following figures, FIGS. 8 and 10, and by the equivalent of FIG. 13, and by FIGS. 20, 22, 23, 27, 34, and 36, and by hand sketches, which were the source of FIGS. 37 through 41. Please note that I will describe most of these drawings and embodiments again, in the following Section of the present specification.

FIG. 8 shows the general scheme of the problem to be solved, together with a condensed view (2) of one of the proposed solutions. We have the Chip Carrier [CC] (1) at the bottom left corner, with a strange looking contraption (2) on top of it, which then ties to a number of loop heat pipes [LHP] (3), which in turn tie in to the satellite prime thermal control system (4) [TCS], which throws the undesirable heat out into outer space (7).

FIGS. 9 and 10, (Note: Only FIG. 10 was submitted with the SBIR proposal), show a close-up view of the contraption (2), between the CC (1) and the LHP (3). I will refer to it as the "Tailorable Flexible Passive Heat Spreader", or we could use an acronym like "TFPHS". But for short, I will simply call it my "SPREADER". Let's study the spreader a bit closer. Please follow the reference characters in both FIGS. 9 and 10. At the bottom of the figure, we can see a PCB (11), sitting on a couple of supports (41) and (43). By the way these supports can be "dampened" to fight any potential shocks and vibrations. On top of the PCB, we see the CC (15) and (19), which holds the chip (17) inside it. Here I am showing that the CC is attached to the PCB by the standard short stubby reflowed solder balls/joints (13). This can be improved by using my CCMDs/Solder Columns, but this was not the object of the SBIR research work, nor is it the object of the present invention/specification. On top of the CC, I placed/attached my spreader (23) through (33). In this case, I am showing a two stage spreader. On top of the second stage spreader, I have attached a flat LHP (39).

Now, let's look closer at the spreader. Please look at FIGS. 11 through 13, plus FIG. 14 at the same time. Both first stage and second stage spreader are almost identical in their general shape, except that the second stage spreader is larger, with a wider top platform.

Please see FIG. 14 to study the effect of increasing the size of surface areas of the spreaders platforms. If the CC (0) is, say, 1 cm on the side, i.e. its surface area is 1 cm2, and is generating 300 W/cm2, and if we make the top platform (1) of the first stage spreader to be 2 cm on the side, i.e. with a surface area of 4 cm2, then the heat flux, in units of W/cm2, at the top platform will be 25% of the heat flux at the top of the CC, i.e. 75 W/cm2. Then if we make the top platform (2) of the second stage spreader to be 4 cm on the side or even larger, hence the surface area will be 16 cm2 or more, then the heat flux there will be 18.8 W/cm2, or approx 6.25% of the original heat flux, or less. We can go on and place a third stage spreader on top of the second one. If we make the top platform (3) of this third stage 8 cm on the side, then its surface area will be 64 cm square, then the heat flux there will be 4.7 W/cm2 or 1.56% of the original heat flux.

And so on. So, if we want to reduce the heat flux down to 10 W/cm2, we will have to, theoretically at least, make the top platform of the last/highest stage to be 30 times as large as the top area of the CC. In other words, 300/10=30. Of course, we could make it a bit larger yet, to account for thermal resistance and side losses or what have you. We could simply increase the area of the two stages shown here, either the top stage or the bottom stage or even both stages; or we could add a third stage, depending on whether we have room to stretch in the height or in the width, and depending on the space available, etc.

The top platform would then join the LHP in any way that is acceptable to the industry. Here, in FIGS. 9 and 10, I am showing a flat LHPs, which could be soldered or brazed to the top platform and are going out sideways from the platform, while in FIG. 8, the LHPs are going out vertically away from the platform.

Please keep in mind that these spreaders are made of materials that are heat conductive, including the individual parts, such as the columns, the platform and the transition part between them, and all the joining materials holding these parts together and to their respective heat sources and heat sinks.

Now let's look at the bottom end of the spreaders shown in FIG. 13. FIG. 13 shows the spreader, looking at it at an oblique angle from the bottom. The vertical tentacles below the top platform look like columns or columnar elements, machined or carved out of the original solid block that could have been used to create the whole piece, out of one piece. They could also be individual components that could be brazed to the bottom of the platform.

Also the columns can have different cross sectional shapes, which can be square, as shown in most of the embodiments here, or they can be rectangular, hexagonal, round, or even triangular or circular, as shown in FIGS. 16 and 17. Which ever shape that can facilitate the manufacturing of such spreaders.

The spacing between the columns can be very small. Just wide enough to physically separate the one column from the one next to it. The columns can even almost touch. There is no need to place the columns far apart, as in the case of the CCMD, because we do not have to worry about electrical short or the like. The purpose of having columns with small diameter or girth is to have them "flex" and "bend", to compensate for any linear dimensional differences between the spreader and the CC. These dimensional differences will occur due to any mismatch between the CTE of the CC and of the spreader. These dimensional differences will be in the horizontal direction, as seen in the present figure, more precisely, in a direction that is perpendicular to the general vertical axis of the assembly, or we can also say, in the direction along the top surface of the CC, i.e. along the interface between the CC and the spreader. We can also say that the dimensional differences will act as normal deflections at the tip of the columns, which will act as cantilever beams. So, now, if and when we get temperature changes and the links of the heat flow chain, i.e. the CC and the spreader, change dimensions, due to their CTE mismatch, then the columns would bend and flex and will be able to absorb the stresses resulting from this deformation, more easily than any short stubby solder joints. The analysis of the stresses and the comparison between the shear stresses in the case of the short stubby solder joints, and the bending stresses in the case of the tall slender columns, was discussed in my papers and patents, listed in the References, mentioned above.

Also in most of those papers and patents, I have explained how we can control the level of bending stresses in the column. For example, as illustrated in FIG. 7, if we want to reduce the bending stress, we can reduce the diameter of the column, or we can increase its height. In our case here, we rather not reduce the diameter of the column, or its cross section. Please refer also to the last paragraph in Section 1.10 above. We rather keep the number of columns and the area of each column cross section as large as possible, in order to keep the thermal resistance of the columns to a minimum, so as to make it easy for the heat to flow through. This is also the reason, why we want to make the slits between the columns as narrow as we can. This is in contract with the CCMD, where we had to keep enough distance between the columns, to prevent any electrical shorts between them, and to locate the columns in registration with the contact pads of the CC and the PCB.

So, the easiest way to reduce and control the stresses in the columns is to adjust their height, to suit the individual situation at hand. This is why I am calling my proposed spreaders here, "TAILORABLE", i.e. we can "tailor" the dimensions and shape of the SPREADER and its elements, to suit almost any case that we would face. If the CTE mismatch between the CC and the spreader is small, then we can keep the columns short. If we have a larger CTE mismatch, we can increase the height of the columns proportionally.

The purpose and the goal are to keep the stress levels, in the worst case scenario, to be within the allowable stress levels. And if we have temperature cycling, then we should keep the max stresses below the endurance or fatigue limits of the materials being used in the particular situation. All this can be pre-calculated in advance and later proven empirically.

And obviously, the columns are designed to flex, as explained above, so they are "FLEXIBLE".

Also, the columns and the whole spreader do not require any "power" to operate or to control their operation, which was another one of the requirements of the SBIR research topic. So they are "PASSIVE".

And obviously, from all the above description, they perform as Heat Spreaders.

So, a name like this one, "TAILORABLE FLEXIBLE PASSIVE HEAT SPREADER" sounds to be a good descriptive name for the device.

FIG. 10 highlights also a couple of additional features. Both top platforms of the spreaders are supported at some points by brackets, items 49 and 51, of some sort, preferably with dampening features, to reduce any harsh effects or loads or stresses, during shipping, during launch or during the general operation of the satellite. Also, the PCB can be supported in a similar manner. See items 41 and 43, But another way to safeguard against such shocks and vibrations, is to decide as to which parts of the assembly should be anchored/fixed, and which parts should be "floating". It is similar to having a camera on a tripod. If it is a regular camera, with a relatively small objective lens, then the body or the housing of the camera gets attached to the tripod. But if the camera lens is a very large one, e.g. has a long focal distance objective lens, then the body weight of the lens could surpass and overwhelm the body or the housing weight of the camera housing itself. In such a case, the lens housing gets attached to the tripod and it will then carry the housing of the camera. We can do something like that here. The size and weight of the spreader(s) and of the heat sink can be disproportionately larger than the CC. In such a case, we can have the CC and the PCB floating, supported or carried by the spreader. In such a case, we may elect to have flex circuits to connect the PCB to the outside world or to the rest of the electronics system in the satellite. Other examples of this are illustrated in FIGS. 9, 10, 19, 20 and 27.

FIG. 20 also shows a slightly different version of the same spreader approach. We could call this one, the FAN Spreader. The main difference is that the columns are arranged on certain angles, flaring out from the small area of the chip carrier to the larger area of the spreader platform. We can still do a multi stage spreader, but here in this figure, I am showing just one stage.

Here also is another difference. The LHP is shown being embedded into the top platform of the spreader. This could be a better way to ensure better heat flow. Another thing that can be done, is to use a "VAPOR CHAMBER", see FIGS. 74, 75 and 77-A, as the top spreader platform. Yet another thing is to double up and have LHP embedded, (See FIGS. 72 and 73), as well as other LHPs attached to the top. See FIG. 75

FIG. 22 shows a bottom view of the fanning spreader shown in FIGS. 19 and 20, looking straight up at the fan spreader, while FIG. 23 is looking at the same fan spreader, again from the bottom, but at some oblique angle.

FIG. 27 shows a further extension of the proposed approach. If the materials of the spreader and of the LHP are so different that we could expect the same kind of interface problem, i.e. CTE mismatch, between them, similar to the CTE mismatch between the CC and the spreader, then we can provide another set of Tailorable Flexible Passive Columns between the top of the spreader and the LHP attached to that side of the platform. Again, we can select the cross section and the height of these top columns depending on the severity of the situation, i.e. the expected temperature fluctuations and the magnitude of the CTE mismatch.

Figure 34:
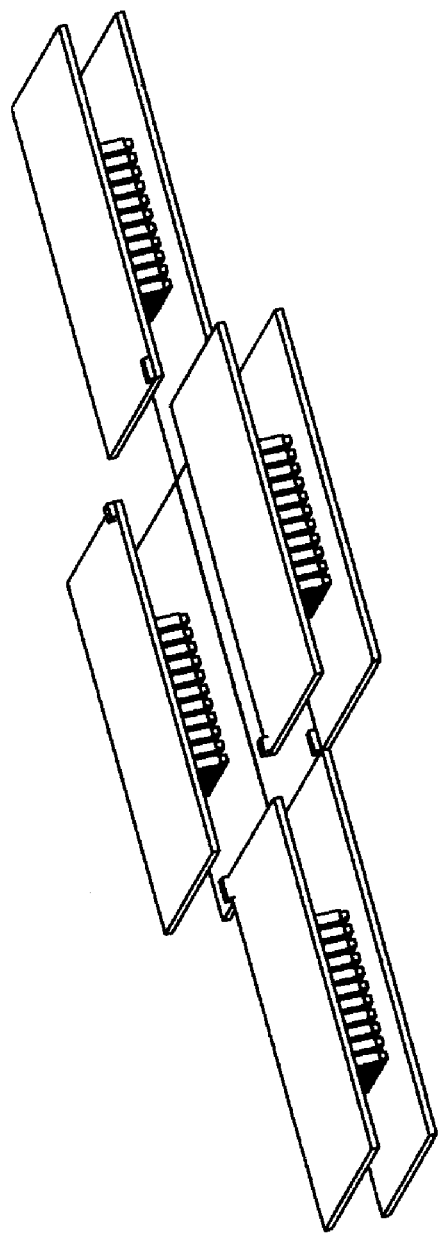

FIG. 34 shows yet another extension of the concept. Say the top platform of the spreader is stretched on at least one of its sides by a certain distance, which would allow us to attach more spreaders on top of it. We can go East, West, North and/or South, if we need to. Then we can in fact increase the heat dissipation capacity quite a bit more yet, via additional LHP.

Figure 36:
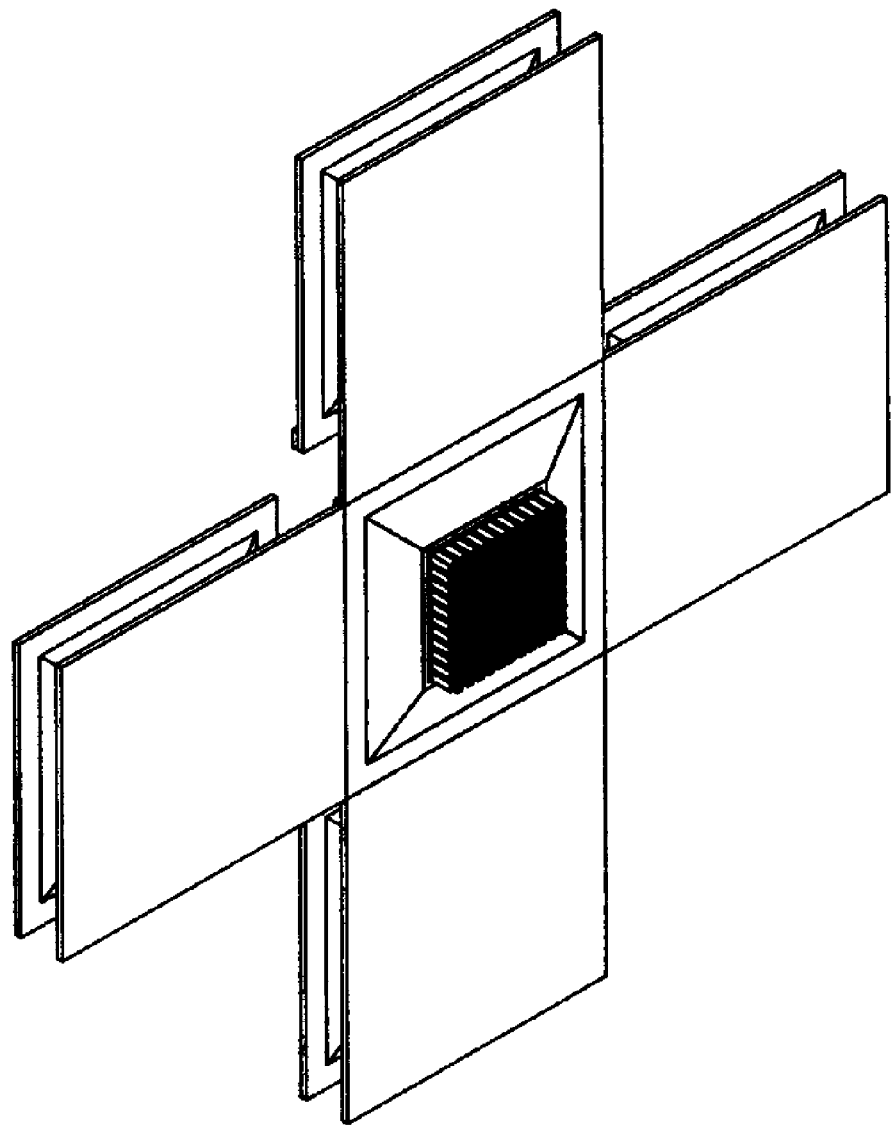

FIG. 36 shows a bottom view of the arrangement shown in FIG. 34.

FIGS. 37 and 38 yet another combination of LHPs, where some are going horizontally sideways, while in the middle, we can have one or more LHPs going vertically upwards.

FIGS. 39, 40 and 41 show yet another embodiment, expanding the concept quite a bit more. At the bottom of the bottom view, we can see that the PCB is carrying the CC as usual, but we see also that we have a spreader and a LHP below the PCB. The PCB can have some Heat layers or heat columns built in it, so as to conduct some of the heat to the bottom of the PCB, which we can then remove by using spreaders and LHP as described earlier.

On top of the CC, we can put a heat spreader like the one shown in FIG. 34 or 36 or 49 or 50.

The other new stuff here is added for mechanical stability. We see the four posts, anchored at their bottom to the PCB. Then each one goes through a hole, rather a slot or even an open slot, like a two prong fork, as shown in the top view of FIGS. 30, 40 and 41, by the corners of the large spreader platform, and then extends further upwards, so that their top ends get captured by a member, which I refer to as a clamp of some sort, if you will, to stabilize these rods. The slots in the large platform, at about the middle of the height of the rods, would have just the proper amount of clearance to allow for the thermal deformations of the platform, but would be tight enough, so that during shipping or handling of the system, they would still be good enough to protect the whole assembly from serious damage. This has to be designed and calculated to suit each particular situation.

7. DETAILED DESCRIPTION OF THE DRAWINGS AND OF THE PREFERRED EMBODIMENTS

Now I will start to describe the drawings in a more sequential manner.

Group 1 Introduction Drawings

Some of FIGS. 8 through 41 were described already earlier.

1-2. FIG. 14 explain the effect of enlarging the heat transfer platform on reducing the value of the heat flux.

1-3. FIGS. 2 through 6 show and describe the undesirable effects of Temperature changes or temperature cycling and of CTE Mismatch in assemblies comprising a BGA and a PCB. FIG. 5 shows a BGA, which consists of a chip carrier with solder balls attached to each one of its contact pads. The BGA gets attached to a PCB, as shown in the middle figure of FIG. 6. This middle figure shows the solder balls in their unstressed or at rest position, say at room temperature. Above this room temperature figure, we see what happens when the temperature is raised (high temperature condition), and below this room temperature middle figure, we can see what happens when the temperature is lowered (low temperature condition).

1-4. At the high temperature condition, the PCB expands more than the BGA, and the solder ball/joints at the farthest ends of the assembly get deformed as shown, so that their axes would look like a portion of an inverted capital letter VEE. When the temperature is reversed, i.e. lowered below the original room temperature, i.e. at the low temperature condition, then the deformation of the solder balls/joints get inverted or reversed, and the axes of the solder joints/balls look as if they are a portion of an upright capital Vee.

1-5. If the temperature is repeatedly changed from cold to hot and back to cold, the condition is referred to as thermal cycling.

1-6. The effect of such thermal cycling is that the solder joints get stressed repeatedly in one direction, and then in the opposite direction and then back again. Eventually, the joints could reach their ultimate fatigue stress and would fail.

1-7. The S-N curve for non-ferrous materials is well known in the industry. It has a similar effect as the Endurance curves for ferrous materials. It is desirable to keep the stress levels in the components below the fatigue/endurance stress levels of the components materials, if the components are exposed to repeated cycling and if we want the components to last and to have a long operating life.

1-8. FIG. 7 shows the difference in the resulting internal stresses in the joints, if a system is under shear stress vs. bending stress. It also points out to the fact that we can reduce the stress in the columnar shaped attachment means, by either reducing their diameter or by increasing their length or height.

Group 2 Drawings Showing an Overview of the Problem and a Preview of Some Solutions.

2-1. FIGS. 1 and 8 show the general overview or scheme of the whole thermal control system, in a satellite or a spacecraft or even of a general land based high power electronic system. The heat flow starts from the upstream Chip Carrier (1), which is the source of heat, then the heat flows out to and through the proposed Heat Spreader (2), which is as per present inventions, then goes to the immediate Heat Sink (3), which could be the shown Loop Heat Pipes, and then finally goes to the spacecraft or satellite Prime Thermal Control System (4).

2-2. FIGS. 43 through 51 show a number of drawings, giving a sort of an executive summary of the proposed invented embodiments.

2-3. FIGS. 43 through 45 show various views of a first preferred embodiment of a ONE-STAGE proposed spreader (2), which incorporates VERTICAL columns, and a wide platform. A number of short segments of loop heat pipes (3) are mounted on top of the spreader platform and then a COLD PLATE (4) is mounted at the other end of the heat pipes. The cold plate simulates the Prime Thermal Control System (4), which is supposed to keep the temperature at the end of the heat pipes at a specific desired low temperature level. Note: The actual loop heat pipes can be much longer. I showed them here as short stubby ones, simply to fit them in the figure.

2-4. FIG. 43 shows the lower tips of the columns of the spreader being exposed and not yet attached to the heat source yet.

2-5. FIGS. 44 and 45 show the heat source (1) joined to the spreader (2).

2-6. FIGS. 46 through 48 show various views of a similar arrangement as in FIGS. 43 through 45, except that the spreader (2) in this case here does not have vertical columns. Instead, the columns here are fanning out, from the narrow area at the top of the Chip Carrier, i.e. the heat source (1), to the wider platform of the spreader at the top of the columns.

2-7. FIGS. 49 through 51 show a TWO-STAGE spreader, with fanning columns. Of course, we can have 2-stage spreaders with vertical columns as well, but they are not shown in this group of figures. Some such two-stage spreaders are shown in FIGS. 9, 10, 33 through 41. In this example, the first stage spreader (2-1) is shown to have a platform, with a side length twice as long as the side length of the heat source. Assuming that both platform and heat source are square, then the surface area of the platform is (2×2=) 4 times as large as the surface area of the heat source. Theoretically then, the heat flux at the exit surface of this 1st stage platform should be ¼ of the heat flux, which is coming out at the top surface of the Heat Source. Then, the 2nd stage spreader is again twice as large as the 1st stage spreader, and is mounted as shown. Hence the surface area of the 2nd stage platform is (4×4=) 16 times as large as the Heat Source surface area. Consequently, the heat flux value at this 2nd stage platform should theoretically be ¹⁄₁₆th of the heat flux value/level at the Heat Source.

2-8. In addition to lowering the heat flux level, this arrangement in FIG. 49 through [51 allows us to mount more heat pipes on top of the 2nd/last stage platform, thus sucking out the heat faster and more effectively than in the previous embodiment. Here we can see that we can mount 16 heat pipes on the second stage platform, while in FIGS. 43 through 48, we have 4 heat pipes only.

2-9. Later on, I will show how we can increase the effective area of the platform, even more yet.

Group 3 First Preferred Embodiments: Heat Spreaders, with Vertical Columns.

3-1. FIGS. 9 and 10, which were described earlier, show the basic idea of the proposed Heat Spreader, as per present inventions, in different views and with some different variations.

3-2. They show typical reference characters for the various typical elements of the spreaders, shown and described in this present specification. They are listed above, in paragraph 4 of Section 5.2, of Section 5. DETAILED DESCRIPTION OF THE DRAWINGS AND THE PREFERRED EMBODIMENTS, of this present specification, and should be considered as my "DEFINITIONS" for this specification.

3-3. FIGS. 11 through 13 show various views of the first stage of the heat spreader shown earlier above. The second stage would look fairly similar, except that it will be larger, i.e. it will have a larger platform, i.e. with a larger surface area, as shown in FIGS. 9 and 10. Please notice here that the whole spreader is carved out of one piece of material. The outside configuration can be milled out of the starting block of material, then the columns could be milled out, either by using a thin blade saw or by EDM. First, one set of cuts, the first cuts, can be made in one direction and then a second set of cuts would be made at a perpendicular direction to the first set. Actually, the second or third etc cuts could be at different angles, to create columns with different cross sections. For example, we would get columns with triangular cross sections, if the cuts are on 60 degrees angles. See FIG. 16. Also, the first cuts can be concentric circular cuts, and then the cross cuts can be at 90 or 60 degrees or the like. See FIG. 17.

3-4. FIG. 18 shows a similar first stage or second stage platform, but with a rim along the edges or outside perimeter of the platform, to help in containing any molten solder or other attachment or joining material, if the next stage or the Heat Sink will be soldered, or glued, etc., to this platform.

3-5. Please note that the columns in all the figures, from FIGS. 9 through 13 are vertical, i.e. they are generally perpendicular to the platform and the heat source, and are generally parallel to each other.

3-6. FIG. 15 shows three cross sectional views of a spreader with vertical columns. The same thinking will apply to the other spreaders described elsewhere in this specification.

3-7. The top figure in FIG. 15, i.e. FIG. 15-A—No Belly, shows the cross section of the spreader as was shown in all the previous figures, FIGS. 9 through 13. We notice that the bottom of the platform, Reference Characters 35 and 27 in FIG. 9, is like a straight line, which is parallel to the top of the platform. In this particular example case, the thickness of the platform is shown to be 0.1200 cm.

3-8. Please note that, here and in all the other drawings in the present specification, the dimensions of any of the components are arbitrary and are just to help in the description and explanations. A good example of this fact is in the few following paragraphs.

3-9. The middle figure in FIG. 15, i.e. FIG. 15-B—Small Belly, shows that the bottom line of the platform thickness is not a straight line anymore, but it dips down. In this case, it s shown as a straight line sloping downwards, from a point near the edge of the platform towards the center of the spreader. The tip of the sloping line is shown in this case to be 0.220 cm away from the top of the platform. I will refer to this as the "small belly".

3-10. The bottom figure in FIG. 15, i.e. FIG. 15-C—Bigger Belly, shows a similar spreader like in the middle figure, but here the belly is BIGGER or FATTER. The tip of the belly here is 0.2556 cm away from the top surface of the platform.

3-11. The effect of providing a belly as shown is to improve the heat flow from the columns towards the edges of the platform. In the top figure, No Belly, the edge of the platform could be relatively much colder than the center of the platform. In the middle figure, Small Belly, the heat flow is enhanced and the temperature distribution along the top surface of the platform becomes more even, more uniform. In the bottom figure, BIGGER BELLY, the temperature becomes more evenly distributed yet along the different spots of the platform surface.

3-12. This small change in the shape of the platform bottom cross section can have an important effect on the transfer of heat from the platform to the other components attached to it, downstream of it.

3-13. Note that here the belly has been shaped to have a straight line at its bottom. But we can easily visualize that we could make the belly's bottom follow a generally curved, convex line, like an arc, an ellipse, a parabola, a hyperbola, or any other shape, which can help in improving the even distribution of the temperature at the top of the spreader.

3-14. Note also another feature or rather an advantage to increasing the size of this Belly. The columns towards the center of the spreader will be shorter than the columns closer to the edges of the spreader. This may look like a negative unfavorable feature, but in fact the opposite is true. The columns are there to accomplish/satisfy two specific requirements. First, we want the columns to act as flex joints, to compensate for any existing CTE mismatch, so we want them to be as tall as possible. Second, the columns should conduct the heat from the upstream chip carrier/heat source, down to the heat sink or any other downstream device, so the columns should be as short as possible to reduce their thermal resistance, to have a smallest thermal resistance of the total spreader. So, these are two conflicting requirements. We have to play the one requirement against the other and find the best compromise for each individual situation. However, here as seen in these two FIGS. 15-2 and 15-3, we have a good opportunity to satisfy these two requirements at the same time. You see, the need for the "flexible" columns/joints is more severe toward the farthest distance from the center. Actually, at the exact center of the chip carrier and the spreader, there is no bad effect from the CTE mismatch. So, we could get away without any columns. If we move outwards away from the center, then the CTE mismatch starts to increasingly show its ugly undesirable effects. And that is when we would need these columns. When we go farther away from the center, the difference between the linear deformations of the two bodies becomes larger and more pronounced, and its effect more pronounced and there is where we would need longer taller columns. So, with the belly the way it is shown, we do gradually increase the length/height of the columns, which gives us practically the ideal solution to the problem. Of course we need to evaluate the stresses and select the best compromise for the heat flow as well as the mechanical stresses in the whole system, to get the best desirable outcome.

Group 4 Second Preferred Embodiments: Heat Spreaders, with Fanning Columns.

4-1. FIGS. 19 and 20 show spreaders, that are basically similar to those in Group 3, but here the columns are not vertical or parallel, but they are fanning out from the narrow end at their bottom, near the chip carrier or the heat source, to the wider platform, at their top, i.e. at the heat dissipating end.

4-2. They also show various possible ways to arrange and to attach the Heat Sinks to the spreader platform.

4-3. Some embodiments could comprise some vertical elements at the top end of the platform. These could be like conventional cooling fins or can be heat pipes, attached vertically on top of the platform. See FIGS. 46 through 51. They could also be heat pipes with round cross sections, lying on their side. These heat fins or heat pipes can be soldered, brazed or attached to the platform in any desirable method.

4-4. In FIG. 19, I show only one Loop Heat Pipe, laying on its side and showing only its flat end, while the rest of its body, not shown, is laying sideways, going to the back of the view, like the top LHPs in FIGS. 37 through 41.

4-5. FIG. 20 shows the LHP embedded in the platform. This could reduce the thermal resistance between the platform and the LHP and thus could enhance the heat flow. Please see also FIGS. 72 and 73, which shows a similar arrangement, but looking at a side view of the spreader, i.e. at 90 degrees with respect to the present view in this FIG. 20.

4-6. Back to FIG. 19. The base of the spreader can have a flat component, as part of the spreader, which can be used as the cover for the chip carrier case itself. One of the usual, conventional ways of manufacturing chip carriers is to first attach the chip on to the carrier base, wire bond it or otherwise connect the chip to the external world via the carrier contact pads, and then close the base with a cover. Then, at some later point in time, the heat sink gets attached to the cover of the chip carrier. But here in FIG. 19, I am proposing that the heat spreader could act as that cover of the chip carrier. In other words, we would create chip carriers with their own heat spreaders, mounted on them already. This would provide two possible advantages and benefits.

4-7. First, this would eliminate one assembly step in the manufacturing process. Second, it would eliminate the interface between the conventional chip carrier cover and the heat sink/heat spreader. It would eliminate a major part of the interface problems, as explained at length here in this specification.

4-8. Of course, the combination of chip carrier together with its heat spreader and chip carrier cover may become too big and heavy, and may create difficulties in handling and assembly, but it is something to consider nevertheless. It would be a trade-off, to be decided upon by the end users.

4-9. Another thing shown in FIG. 19 is the columns between the bottom base or chip carrier cover and the top platform of the spreader. These columns can be carved out of one piece of material, one block, or they can be made as individual elements and then joined together, to create the final desired shape of the spreader. The joining can be done by soldering, brazing, welding or any other method known to the industry. If the decision is to make the device out of one block, then the spaces between the columns cold be made by using wire EDM or the like.

4-10. Another way is to use 3D/Rapid Prototyping, or the like. All this can be used to make parts like in FIGS. 21 through 26, or like in FIGS. 58 through 61 for example.

4-11. FIGS. 21 through 23 show different views of one style of heat spreaders with its fanning columns and its platform. Here the columns could also be possibly machined out of one block of material, by any of the conventional methods, e.g. by EDM, or by milling, e.g. by a circular saw blade or an end mill, and creating slits at various angles across the base, as seen in FIG. 22. But for the embodiment in FIGS. 24 through 26, I believe that the EDM approach is one of the best methods that come to mind.

4-12. Another method is to create each individual column separately and then attach them all together to the platform, by soldering, brazing, etc.

4-13. FIGS. 24 through 26 show a slightly different design of the fanning columns and their platform. Here we can see that the bottom ends of the columns are shaped so as to end by having a "toe", if you will, which can sit in a perpendicular or vertical direction to the chip carrier. This is in contrast to the fanning spreaders in FIGS. 19 through 23, where the lower ends of the columns meet the chip carrier at different angles. The toes in FIGS. 24 through 26 may make it easier to attach the spreader to the chip carrier.

4-14. FIGS. 27 through 32 show another group of spreaders with fanning columns, as described before, but with some differences. The part below the platform can be practically identical to the earlier figures, but here we see an additional part above the platform.

4-15. FIG. 27 shows that we have a second group of columns above the platform, i.e. between the platform and the heat sink or the second stage spreader. These columns may be desirable to have, in case we have another CTE mismatch between the materials of the spreader/platform and the heat sink itself or any other components above the platform. We can also see the stabilizing supports at the platform, which could be needed to support the assembly.

4-16. FIGS. 27 and 28 show these top columns as vertical, parallel columns, with substantial size and cross-sections.

4-17. FIGS. 29 through 32 show the top columns, with a different shape. They rather look like curved beams or wires or even strings, and they can be parallel nested. These will have more flexibility and could be shorter than the columns in FIGS. 27 and 28.

4-18. Actually, after these thin flex columns get attached to the next link in the chain, they can even be collapsed together, to reduce their height, i.e. the distance between the platform and the heat sink or the next element in the chain can be made much shorter. They maybe even bundled and curled or coiled together, to reduce the distance between the platform and the heat sink. They can be made of flexible copper wires or carbon filled, high heat conductive materials; can even be Nano-type carbon material or the like. They could be like the steel wool pads used to scrub pots and pans in the kitchen.

Figure 31:
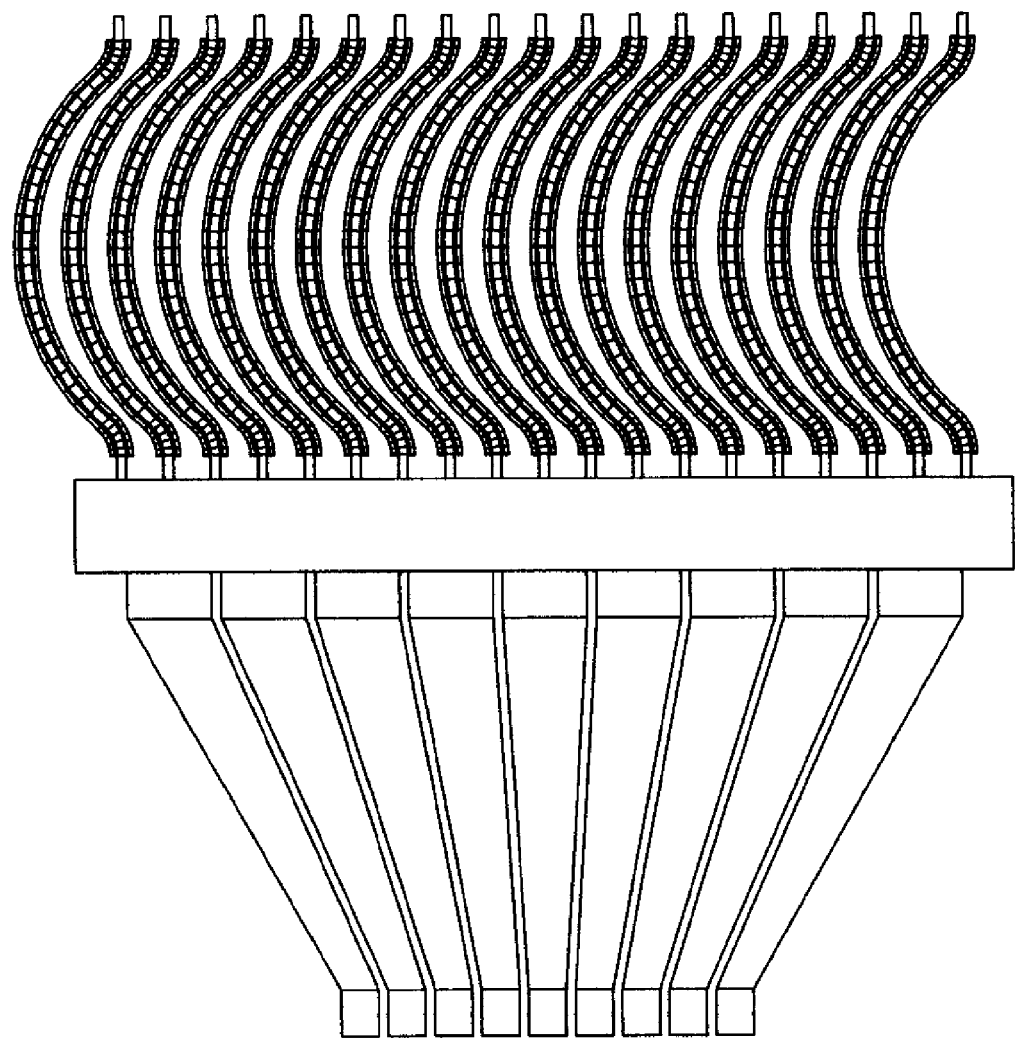
Figure 32:
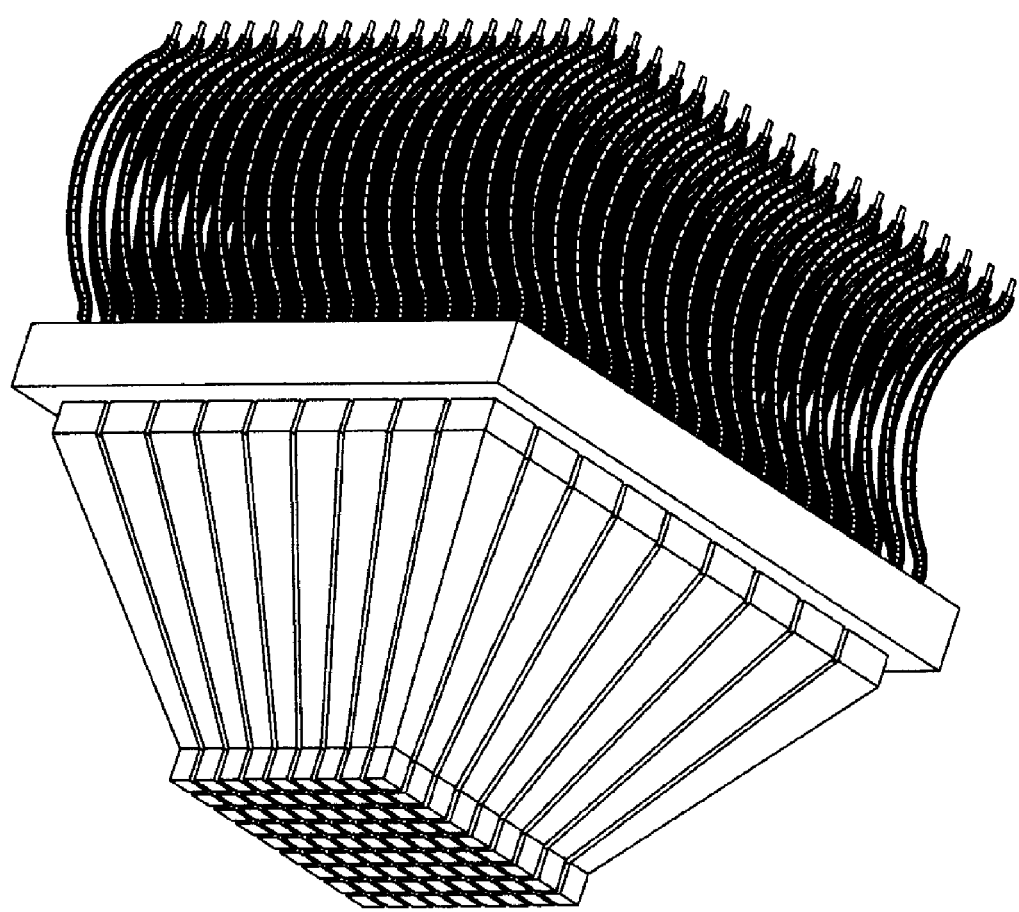

4-19. FIGS. 31 and 32 show that the flex wires can be coated with any desirable material, e.g. soft heat conductive elastomer or the like.

Group 5 Third Preferred Embodiments: Heat Spreader, with Multi-Level.

5-1. FIGS. 33 through 36 show an embodiments with one IC/Chip Carrier at the bottom, with one spreader on top of it, like the one shown in the previous figures. However, the top platform of this spreader is much larger, i.e. wider or longer, and in FIGS. 34 through 36, it extends in four different directions as shown. We could refer to these as the North, South, East and West extensions. Then on top of each one of these extensions, we place another spreader each having its own platform to accept additional individual heat sinks, with their own Loop Heat Pipes or the like. I would like to refer to such embodiments, as two-layer, or even a multi-layer heat spreaders.

Figure 33:
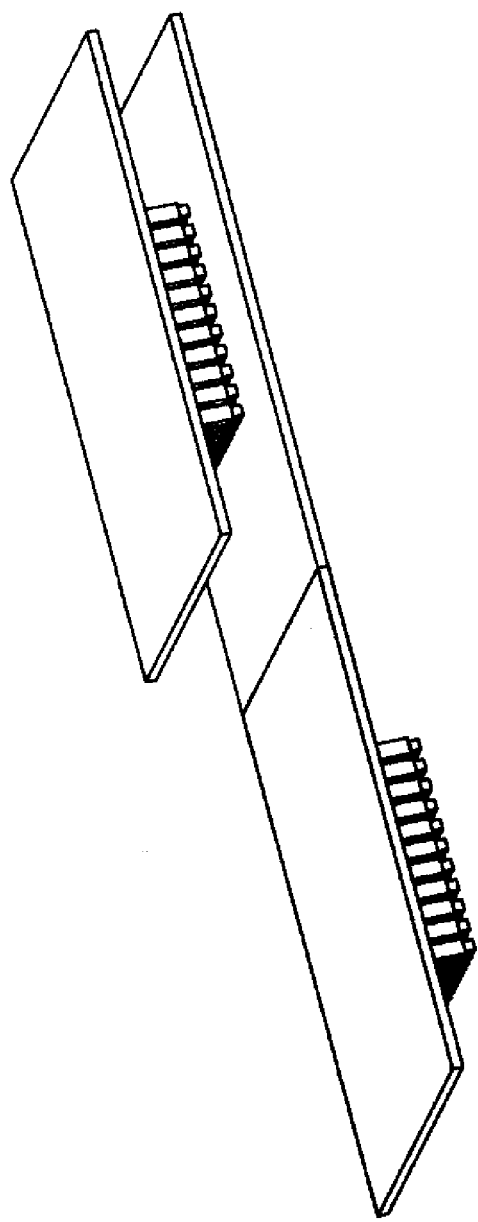

5-2. FIG. 33 shows an embodiment with only one extension of the platform.

Figure 35:
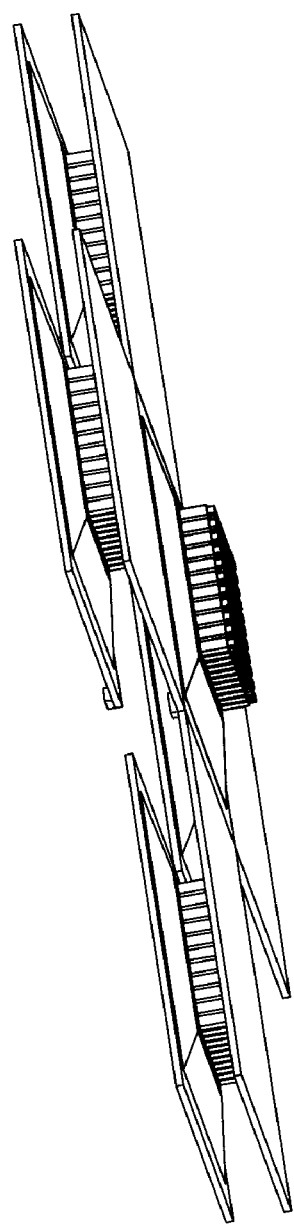

5-3. FIGS. 34 through 36 show various views of the embodiment.

5-4. FIGS. 37 through 42 show similar embodiments as in FIGS. 33 through 36, but with some additional options.

5-5. FIGS. 37 and 38 show an embodiment, where the second level heat sinks can be mounted horizontally, extending in one or more directions, e.g. towards North South East West or similar directions, while some other heat sinks can be mounted vertically, extending in a perpendicular direction to the platform of the lower spreader.

5-6. FIGS. 39 through 41 show that we can add some mechanical stabilizers as shown, and we can add another Loop Heat Pipe sink below the PCB as well, if the PCB has adequate copper vias or copper planes to conduct heat through them down to the lower LHP.

5-7. FIG. 42 shows yet another embodiment, where the spreaders are stacked even higher than two up. For example, here the second level is extending in an East direction, while the third level is extending in a West direction and finally the fourth level is extending in a North direction. We may be forced to follow a scheme like this, if the available space requires it or forces us to do such a thing.

5-8. We can easily visualize other arrangements, with multi levels in multi directions, branching out in every possible direction.

5-9. We can also visualize other arrangements, where the vertical arrangement can go from narrow at the bottom to wider at the top, or the reverse, depending on the geometry and available spaces surrounding the hear source.

Group 6 Fourth Preferred Embodiments: Double-Ended, or Double-Sided, Spreaders, or Flexible Ends of a Loop Heat Pipe.

6-1. Here are some embodiments for attaching the platform to either the heat source and/or to the heat sink.

6-2. FIGS. 52 and 53 show a typical flexible or bendable loop heat pipe (LHP) attached at each one of its two ends to a separate device. One device at one end can be the evaporator end, i.e. attached to the heat source, while the other device at the other end can be the condenser end, i.e. attached to the heat sink. The devices are shown as simple flat rectangles for simplicity. In FIG. 52, the joints between the devices and the ends of the LHP are shown as if they could have been soldered. In FIG. 53, some brackets are placed between the devices and the ends of the LHPs, to compensate for some of any potential CTE mismatch. Regardless of the methods of joining, there may be enough of a CTE mismatch between the respective loop heat pipe ends and their mating devices, to create problems. In the following drawings, I am showing some possible solutions to such problems.

6-3. FIGS. 54 and 55 shows an elongated end of the LHP, arranged to have some columns, that look rather like teeth or like a toothbrush at the interface surface, which will attach to the individual respective device. These can act as flexible columns, to absorb some of the linear dimensional changes between the LHP and the device, due to CTE mismatch or the like. The dimensions of the columns can be selected depending on the severity of the expected temperature excursions and on the magnitude of the CTE mismatch and the dimensions of the LHP end. Please notice also that I am showing different versions of the "teeth" of the tooth brush. The lower teeth are short and stubby, while the teeth on the opposite side are more like the bristles of a real tooth brush. FIG. 54 shows the bristles as straight line wires or fibers, and in FIG. 55, they can be more like metal fibers or wool strings or strands.

These bristles can even be heat conductive carbon fibers or wool, and can be used also for the embodiments shown in FIGS. 29 through 32, as well as in FIGS. 62 through 69.

6-4. FIG. 56 shows three such "ends" of a LHP as in FIGS. 52 through 55. Fig. A shows a solid "heel", and can be used when the conditions are not severe enough and do not warrant any flexible joints. Fig. B shows the teeth, columns or rather ribs, which can flex in the axial/longitudinal direction "L", and Fig. C shows a slit along the middle of the ribs, to allow the ribs to flex in both the longitudinal "L", as well as the transverse direction "T", if needed. It can also have more than one slit, as will be seen later.

6-5. FIG. 57 shows an enlarged view of the end of the above figure. It also highlights the joints chamfers (JC)=provided at the tip of the columns or ribs, to help in the soldering/attachment process, if necessary.

6-6. FIGS. 58 and 59 show an elaborate way to provide flexible columns, with two degrees of freedom, to absorb CTE mismatches. It may seem as overkill, but it is available, if and when needed. The important thing to notice is that the columns are curvilinear and are parallel nested at least in one direction. They can be curvilinear in both directions, if needed.

6-7. We can easily visualize how such flexible curvilinear columns could be machined. First we could machine the block along one direction, to have the parallel nested curvilinear elements as shown, and then machine the rest of the block, i.e. the rest of the slots, in the other direction. The cutting can be done by several different methods known to any person skilled in the art. For example, for the curvilinear cuts, we could use the wire EDM process and for the straight cut, we could use a simple circular saw. It is optional as to which cut is done first. Also, we could consider 3D/Rapid Prototyping, casting, investment casting, or any method preferred by the manufacturer.

6-8. FIGS. 60 and 61 show a spreader with such curvilinear parallel nested columns on BOTH sides of the platform. We can resort to this configuration, if and when the CTE mismatch is on both sides of the platform, i.e. between the platform and the respective devices attached to either side of it. Notice that we can even opt to have the curvilinear shape at one side of the platform oriented at 90 degrees or at any other desirable angle with respect to the curvilinear shape at the opposite side of the platform.

To machine these shapes out of a solid block of material, we can possibly machine straight slots in one direction and then EDM the curvilinear shapes in the cross direction. Or we can reverse the sequence. Or we can use the 3D-Prototyping or the so-called "additive" methods. Or we can use the investment casting. Whatever method that is available in the industry should be acceptable, as long as the material used are heat conductors.

6-9. FIGS. 62 through 67 show spreaders with curvilinear wires/fibers, again on both sides of the platform. Again we could resort to such configurations, if and when the CTE mismatches at both sides of the platform are large enough that we need to do something about them. These are similar to the top parts of FIGS. 29 through 32, but obviously, the wires or fibers or strings are on both sides of the platform in this case.

Figure 68:
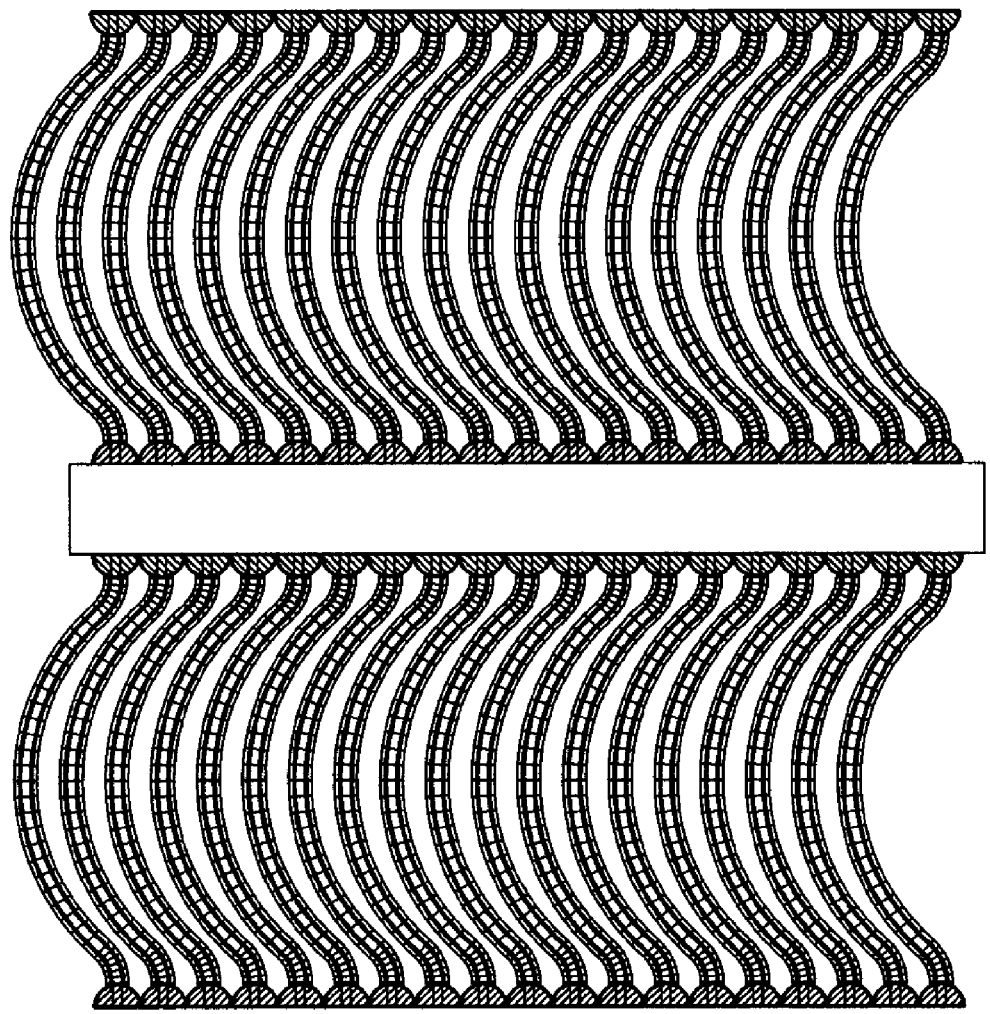
Figure 69:
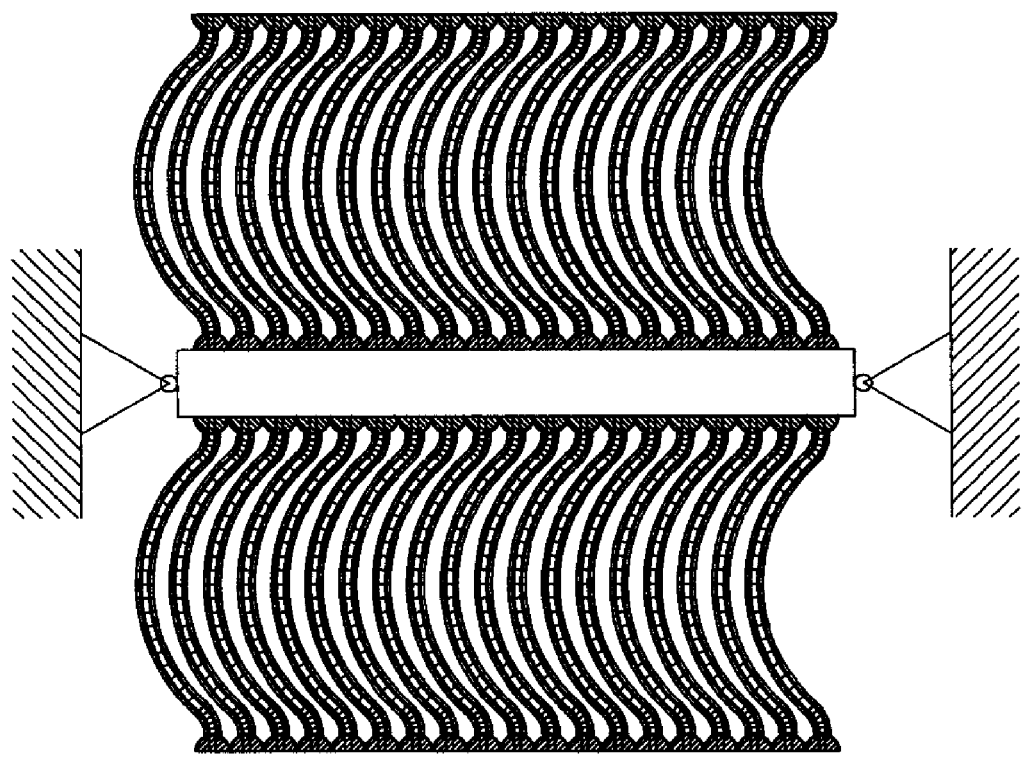

6-10. FIGS. 68 and 69 show such spreaders, where the tips of the wires have solder joints at the end tip of each wire.

6-11. FIG. 69 shows a special embodiment, as an extension to, or an additional feature to, the embodiments shown in FIGS. 62 through 68. If the wires are too flexible and too weak, then we may find it necessary to support the platform as shown, i.e. we may need to provide some mechanical supports between the various levels of components in the system, as shown in this figure for example, to maintain the position of the platform with respect to the rest of the system. And preferably, these supports members should allow for certain sideways compliance as deemed necessary.

Group 7 Fifth Preferred Embodiments: Heat Spreaders, with Special Features, Including Some Improvements to Existing Prior Art Products.

This group of drawings shows a variety of other embodiments, which have various features, which enhance the serviceability of the spreaders and related components.

7-1. FIG. 70 shows an example of a multi level heat spreader arrangement, where we could end up with vertical heat pipes that are air cooled by a flowing stream of air. The vertical member at the top could be regular simple finned heat sinks, not necessarily heat pipes per se.

7-2. FIG. 71 shows a variation of the embodiment in FIG. 70. The basic difference is that the columns are not vertical and parallel, but they are fanning out. Here, I am showing only one stage, instead of two or more as in FIG. 70. Also, FIG. 71 implies that the heat sink is rather of the conventional type with conventional air cooled fins, although we can easily visualize that it could use LHPs as well.

7-3. FIGS. 72 and 73 show two variations. They show a spreader, with fanning out columns They are similar in a way to the one shown in FIG. 20, except that the columns look more like the ones in FIGS. 24 through 26. In these two figures, I would be looking at the spreaders slightly obliquely and from the bottom, and at 90 degrees to the view in FIG. 20. In FIG. 72, the platform is assumed to be square and has the same size as in FIG. 20 and shows a total of 6 inserted Heat Pipes, while in FIG. 73, we see that the platform has been extended even longer or wider than in FIG. 72 or 20 and that it has three sets with 6 heat pipes each, inserted in the elongated platform. But the important thing is that I am also showing more than one heat pipe being embedded in the platform.

The heat pipes can be inserted in the platform and then soldered, brazed, epoxied or joined into the platform using any appropriate method. Another way is that the heat pipes would be "cast-in" directly into the platform.

7-4. FIG. 74 shows yet another variation. Here, the platform itself comprises a vapor chamber. Thermacore International Inc manufactures such devices and sells them as a different style or embodiment of the standard heat pipes. Sometimes they call them Therma Base. Please see Ref. 2, (listed earlier under "REFERENCES"), pages 323 through 325, and FIG. 8.3 through 8.5. Here I replaced the solid platform of the spreader with a Vapor Chamber, right on top of the spreader columns, and then, just for added measure, we could add a set of heat sinks on top of the Vapor Chamber, if we so desire. Here I am showing a rather standard conventional heat sink. Of course, we could just stick the Vapor Chamber on top of a standard spreader, like the ones shown in FIGS. 24 through 26.

7-5. FIG. 75 shows a multi layer embodiment, where the spreaders platforms are at various levels, and where the arrangement shows a number of new features: 1) Inside the Chip Carrier, we see a feature that can be used to directly connect the heat generated by the chip itself directly to the cover of the Chip Carrier housing or cover. This can be a special kind of heat pipe or any other heat transfer media. This is not a novel idea of mine, but it is adopted from one of the figure in the References, if I remember correctly. But cooling the chip inside the chip carrier can be done also by other means as well. I believe that some patents in the Prior Art cover such concepts already; 2) the first stage spreader, directly on top of the chip carrier, comprises a Vapor Chamber (VC1) inside of, or as part of, its platform, and two LHPs extending from each side. These 2 LHPs can work in cooperation with the VC1; 3) We can also see that we can add more stages, like the previous stage 1; and 4) We can add one or more LHPs all the way at the top of the last stage.

7-6. FIG. 76 shows a cross-sectional view of a detail of how we can attach columns or LHPs to a spreader platform. The platform would have certain recesses or pockets in its surface, as shown at the top of the platform, to accept the individual cooling columns or LHPs. Then these cooling columns or LHPs can be glued or soldered or brazed, each one in its respective recess or pocket. Also the platform could have the lower columns, as integral, or castings, parts of the platform, as shown at the bottom side of the platform.

7-7. FIG. 77-A shows some additional details of the Vapor Chamber and related components. For example, the top and/or the bottom surfaces of the vapor chamber or the heat spreader body can have pockets or nests or wells, similar to those shown in FIG. =76, to accept the individual columns or heat pipes, and can act as the platform of a heat spreader, as in FIG. 75.

The columns or heat pipes can be joined using solder, heat conductive glues or epoxies, or the like.

The side heat pipes can be either separate pieces, independent of the vapor chamber and can then be joined or glued together, or they can be made as an integral part of the vapor chamber to begin with.

7-8. FIG. 77-B shows some details of the columns. The tips of the columns that will be attached to the platform could be chamfered, in different shapes, to accommodate the method of joining the columns to their respective mating components, as applicable.

7-9. FIGS. 78 and 79 show an improvement on the Therma Base or Therma Vapor Chamber, or Flat Plate Heat Pipes (see Ref 2, Section 5.1, page 170+, and Section 8.1.2, page 323+). In Ref 2, we can see a number of wicks, or wicking features, many of them are sintered particles etc. Most of the wicks are spread and stuck along the inside circumferential surfaces or walls of the Heat Pipe Chamber. In the Flat Plate kind of heat pipe or Vapor Chamber, there may be some room away from the walls, where we could add some additional sintered material, to enhance the flow of the heat transferring fluids. This is what I am trying to show here in these two figures, FIGS. 78 and 79. FIG. 78 shows two orthogonal cross sectional views of a possible Flat Plate heat pipe or a Vapor Chamber. We can see that the walls 7801 along the outside shape of the device, as well as the floor, 7811, are covered with the sintered material. But I have added three lines, 7815 to 7825, 7817 to 7827 and 7819 to 7829, spread in the central area of the chamber, as seen in FIG. 78, as well as in the 3D Internal Cutout view in FIG. 79. I call them=lines, but we could also call them beads or mounds or rows, like the raised dirt lines or mounds along a plowed field. I envision that adding such features could enhance the heat transfer process of such devices. For example, these mounds can enhance the transfer of heat from one end of the Vapor Chamber to the other, for example as shown by the arrows in FIG. 79.

7-10. FIGS. 80 and 81 show another set of interesting embodiments.

7-11. FIG. 80 shows a cross-section in a chip carrier, sitting on top of a PCB. The chip carrier is shown to have a housing, like a tub, made of ceramic. The cover is also made of ceramic. If we want to attach a spreader to the top cover, we would have a hard time doing so, especially if the top surface of the cover is flat and relatively smooth, as it usually is. It would be easier if the cover is provided with a layer of material that would be more easily, and receptive to be, joined to the spreader material. We can visualize that if we embed some such metal in the cover, we would succeed in attaching the columns of the heat sink or of the spreader to that metal. However, we have to be careful. If the metal layer is solid, i.e. like one continuous flat sheet of metal simply applied at the top of the ceramic cover, we could expect that the metal may delaminate from the ceramic cover, due to CTE mismatch, especially at the farthest corners of the chip carrier cover. We talked about this problem earlier.

7-12. The way to overcome such a problem is as shown in FIGS. 80 and 81. The layer of metal could be shaped or carved out to look like separate islands sitting one next to the other, not directly connected to each other, but with distinct separations between each island and the ones adjacent to it. This will make it that the expansion and contraction of each island will be small and separate from the other islands.

7-13. So, in essence, each individual island will be "floating" on top of the ceramic cover and will move with the portion of the ceramic cover, which is carrying that respective island, and will move with that portion of the cover, independently from all the other islands surrounding it. We can say that this situation is analogous to a boat floating on top of the water in a calm bay. Similar to the old adage that says "a rising tide lifts all boats, here the boat, i.e. the metal island in our case here, floats on the surface of the water, i.e. the ceramic material in our case here, and its position and height on top of the water is relatively unchanged. The top surface of the water keeps moving up and down, or even sideways, due to the tides, but the position of the boat with respect to the water surface immediately surrounding the boat is practically unchanged.

7-14. The individual thermal linear deformation of each island, with respect to the ceramic cover, will be relatively small, so small that it would be negligible, as long as we keep the size of the individual islands small enough, commensurate with the expected prevalent temperature fluctuations and the system's CTEs. In such a case the individual islands will not delaminate from the ceramic material.

The islands can be shaped as hexagons, as shown in FIG. 81, but also as squares as shown in FIG. 80, or can be circular or can have any desirable shapes. The important thing is to make sure that they are small enough and are separated from each other, even by at least a few thousands of an inch.

Also these islands can be simply attached to the surface of the ceramic, or physically embedded in it, but should at least have one surface exposed, so that we can attach the columns or the like, to these islands.

All this applies also to any material used to make the chip carrier housings, not only ceramic material.

7-15. The top figure in FIG. 80 shows a cover that looks like an inverted tub. This could be another way to build the Chip Carrier cover or even the housing itself.

7-16. We can build similar islands at the bottom of the chip carrier housing based on the same principles as the ones just described above. The islands can be used for one or two purposes at least, first, to connect the bottom of the housing to its respective PCB or the like, and second, to conduct heat from the bottom of the package to any appropriate heat sink.

7-17. FIGS. 82-A and 82-B show two different, yet related embodiments. FIG. 82-A shows a variation of Thermacore Therma Base 8211 used as part of the PCB, with various components, 8213 and 8215, mounted on top of it. This could be considered as an extension of, or an improvement to, some of the Prior Art items, such as the concept shown in FIGS. 8.4 and 8.5, in page 325, of Ref 2, Heat Pipes, Theory, . . . .

The lower figure in this FIG. 82, i.e. FIG. 82-B, is similar to the top figure in FIG. 7-15 80, but inverted upside down. The lower figure in FIG. 82, i.e. FIG. 82-B, shows a housing of a chip carrier, made of ceramic. The lower surface of the housing could have a number of metal islands 8221 and 8223, embedded into it, which can be used to extract the heat from the chip carrier. These islands can be placed right at the areas, where the contact pads are, as in the case of the islands 8221, or they can also be added into any other spaces that are not covered by contact pads, as in the case of the islands 8223. Similar islands are shown in FIGS. 80 and 81, which have been described above Back to the upper figure in FIG. 82, i.e. FIG. 82-B. It shows an arrangement that simulate a PCB, carrying a number of IC devices 8213 and 8215. The PCB itself can be built as if it is a part of a Vapor Chamber 8211. It is shown here, as if it consists of a hollow box, which would contain the cooling media and where the top portion of said box would be acting as the PCB itself. The cooling media can be similar to that used in Vapor Chambers known in the industry, or can simply be a media, which can be circulated in and out of the box, e.g. cooling water or the like. Or we can look at it this way. We get a standard Vapor Chamber, a replace one of its sides by a PCB.

Now, here is where the two FIGS. 82-A and 82-B, tie in together. Besides the fact that the Vapor Chamber/PCB is acting as the PCB carrying the electronic devices, i.e. the Chip Carriers, and is connecting these devices electronically to the outside world, the Vapor Chamber/PCB is, at the same time, cooling these electronic devices, via the additional columns (8225), that have been attached to the metal islands (8221 and 8223), which are now at the bottom of the chip carrier. These columns will also, at the same time, act as means to counteract the potential undesirable effect of any CTE mismatch existing in the system.

7-18. FIG. 83 shows two cross sectional views in a chip carrier housing, which comprises three parts, the cover 8301, the base 8303 and the lower part 8305. The cross sectional views A-A and C-C go through the whole chip carrier housing. The view B-B is a top view of the lower part 8305. We can see that in the base of the housing, parts 8303 and 8305, I have inserted a heat pipe or simply a channel 8307, that meanders back and forth, trying to avoid the electrical through vias. I could refer to this heat pipe as the cooling serpentine, like the serpentine pipes in some old heat exchangers or old ice boxes. Even some not so old ice boxes. The serpentine will have an inlet 8309 and an outlet 8311 that will be located at some opportune locations along the chip carrier housing. The serpentine can be in the shape of a circular pattern or curvilinear, or can go back and forth like a number of successive letter U's, connected end to end to each other.

7-19. The base of the chip carrier can be made out of two pieces, 8303 and 8305, as shown, each of which being prepared to form the desired serpentine channels for the circulating fluids and then the two pieces can be glued together somehow. This is to facilitate the creation of the serpentine inside the material of the chip carrier. The view BB is a top view of the base's lower piece, 8305. The serpentine can be made, either entirely in part 8303 only, or entirely in part 8305 only, or as shown, partly in one part and partly in the other part.

7-20. FIG. 84 shows another feature. It is the FLEXIBLE BAG OR SOCK OR BOOT OR SLEEVE, which could be provided, to contain any filler materials, like heat conductive gels or similar conductive materials, and preferably flexible enough, which we may opt to insert between the platforms, between the columns. We could also use any conductive fibers, even if they are metallic materials and electrically conductive, such as metal wool or fibers or fiber strands. That will be OK. Such a gel or other filler materials could be provided to fill any gaps between the columns, or wires, or it can be all we need to put in there between the platforms, inside these flexible bags or socks or boots. In other words, we could totally eliminate the columns, which were described in the previous figures, if we want. These flex bags or socks or boots or sleeves could be made out of a flex material, which would be wrapped around the flex gel and then would need to be secured at both ends Another thing to keep in mind is that whatever we use as conductive gel or filler materials, should best have comparable "density", so as not to "settle", otherwise, we may not conduct and transfer the heat properly. Also, these flexible sleeves can be used with set-ups like those shown in FIGS. 29 through 32 and 62 through 69, and even with those shown in FIGS. 58 through 61.

7-21. For the first stage, the first end of the boot would be secured at or to the chip carrier or the IC package, and its second end near the bottom of the first stage heat spreader platform. For the second stage, the boot would be secured, at its lower end to the top of the first stage platform, and at its upper end, to the bottom of the second stage platform. The chip carrier, as well as the platforms, could be shaped to have some appropriate means, e.g. a lip or a protrusion of some sort, to accept these two ends of the flex bags or socks or boots respectively. In an embodiment like this, we will need to provide some means, to adequately support the components in place. I am showing the structural support members, S1, S2, S3 and S4, just to symbolically indicate and highlight such a need. We may add similar support components between the platforms of the first stage and the second stage spreaders as well.

7-22. Again, in this embodiment, the intermediate stages need not to be aligned exactly with the chip carrier or the upper stages. It can be "floating" sideways, or at an angle, if desired. In other words, the center lines of the different stages can shift sideways and/or at an angle, if necessary, if the available spaces dictate such a configuration. An example of such a situation is shown in FIG. 85. This would apply only in cases where the columns are not rigid. For example, it could apply with embodiments similar to those shown in FIGS. 29 through 32, and 58 and 59, which show the flexible columns at one side of the platform only, or with the embodiments shown in FIGS. 60 through 69, which have flexible columns at both sides of the platform Supports, like S5 and S6 shown in FIG. 69 or equivalent, would be appropriate Notes about NDAS Signed when Preparing My SBIR Proposal During the preparation of my SBIR proposal, I interacted with the following persons and organizations, either to help me in documenting my drawings conception dates (1), or to get them to work with me, as consultants (2) or as sub-contractors (3 and 4). I have asked them to sign Non-Disclosure Agreements, before I disclosed any of my concepts and/or drawings to them. They did. Here they are:

1. NDA signed on Jun. 1, 2011 by Mr. Robert H. Leyse, 222 Elkhorn Road, Sun Valley, Id. 83353; PO BOX 2850, Sun Valley, Id. 83353; Telephone: 208-622-7740.
2. NDA signed on Jun. 20, 2011 by Dr. Glenn E. McCreery, PhD, Fluid Dynamics and Heat Transfer Consultant, 2290 Briarcliff Ave., Idaho Falls, Id. 83404; Phone: 208-520-1074.
3. Mutual NDA signed on Jun. 22, 2011, by Mr. Nelson J. Gernert, VP Engineering, of Thermacore Inc, 780 Eden Road, Lancaster, Pa., 17601 USA; Telephone: 717-569-6551
4. Mutual NDA signed on Jun. 24, 2011 by Kelly E. Guy, U.S. Contracts Manager, FSO, Curtiss-Wright Controls Embedded Computing, 20130 Lakeview Center Plaza, Suite 200, Ashburn, Va. 20147; 571-252-7551 (w); 703-344-3207 (c); Kelly.Guy@curtisswright.com.

INDUSTRIAL APPLICABILITY

Paraphrasing from various publications, thermal management problems are now critical in microelectronic and optoelectronic packaging. In response to the serious limitations of traditional packaging materials, material suppliers are developing an increasing number of new thermal management materials with low coefficients of thermal expansion (CTEs), ultrahigh thermal conductivities (CT), and low densities. There are now 15 low-CTE materials with CT between that of copper (400 W/m-K) and four times that of copper (1600 W/m-K), several of which are being used in production applications. Thermally conductive carbon fibers and nanocomposites are being experimented with to reduce the CTEs and increase the CT of printed circuit boards. These materials have the potential to greatly expand the options of the packaging engineer, making it possible to eliminate heat pipes and fans. Unfortunately, the materials with the most promise, like nanocomposites, are the most exotic and expensive and I understand that some of them may not have been proven yet.

I suspect that the primary customer for these present inventions will be NASA which will require its use for future spacecraft electronic components. The inventor would not be selling directly to NASA, but to one of their prime contractors, like Northrop Grumman, Boeing, or Lockheed Martin, who are involved in developing and manufacturing their space technology. The inventor contacted Dr. Edward Silverman, Manager of Advanced Spacecraft Materials at Northrop Grumman Aerospace Systems Division and received a letter of interest/support for the project. Dr. Silverman has indicated that he would be interested in reviewing the work and may even like to test any prototypes developed, and that Northrop could provide advice concerning performance requirements for the R&D effort. Their objective would be to help guide the research so the technology will be ready for a variety of next generation aerospace missions that their company anticipates being involved in. I appreciate Dr. Silverman's interest and am grateful I feel that the products described in this present specification will solve a problem that potentially affects any user of high power electronic devices, especially among companies and organizations that are concerned about high reliability and longevity of their products. Once the proposed devices have been tested and proven, other federal agencies, like the Department of Defense, could be interested in this product for their satellite and space technology. All the major computers manufacturers are racing to increase the processing power and capabilities of their computers. Processing power creates heat, so all of these manufacturers would be good candidates to buy this product.

PRELIMINARY THERMAL ANALYSIS

A preliminary Thermal Analysis showed that the heat spreaders can perform as expected.

The thermal analysis was done on two embodiments.

The first embodiment was a one stage spreader, with vertical columns, as shown in FIGS. 43 through 45o. It connected the top platform to only four columns, simulating four heat pipes.

The second embodiment was a two stage spreader, with fanning out columns, as shown in FIGS. 49 through 51. It connected the top second stage platform to a total of sixteen columns, simulating sixteen heat pipes.

A heat source was assumed to be at the Chip carrier (1), which was generating a heat flux of 300 W/cm2, and the Heat Sink (4) was attempted to be kept at 20 degrees Centigrade.

The one stage spreader, with its four heat pipes, was not able to satisfy the required conditions. The temp at the heat sink was higher than acceptable.

The two-stage spreader was able to reduce the temp at the heat sink and keep it at the desired low temp level and the temp at the chip carrier was also kept at a low temp.

These preliminary results showed that the proposed designs are promising.

For any specific situation, the proper design needs to be worked out, including the choice of configuration, materials, dimensions of the components, etc. Once a preliminary thermal analysis is done, to prove that we are in the ball park, then the mechanical stresses could be analyzed as well, and then the engineering trade-offs and tweaking can be done, to optimize the total design, e.g. to make the device smaller, shorter, lighter, with the least thermal resistance, etc.

But, I feel that it is doable.

The invention claimed is:

1. A multi-level heat spreader, for transferring heat from a primary heat source, generating a certain amount of heat, exiting from a primary heat source heat exit area, with a certain heat source heat flux, to a final heat dissipating device, wherein
   a) said heat source heat flux is larger that the heat flux that can be tolerated by said final heat dissipating device,
   b) said multi-level heat spreader comprising:
   c) a first level heat spreader unit and second level heat spreader unit, wherein
   d) said first level heat spreader unit comprises a number of first heat conducting elongated elements and a first heat conducting platform;
   e) said second level heat spreader unit comprising a number of second heat conducting elongated elements and a second heat conducting platform;
   f) each one of said first heat conducting elongated elements having a foot, attached to and thermally engaging said primary heat source at the primary heat source heat exit area, and a head, at the opposite end of the elongated element, attached to and thermally engaging said first heat conducting platform;
   g) each one of said second heat conducting elongated elements having a foot attached to and thermally engaging said first heat conducting platform, and a head, at the opposite end of the elongated element, attached to and thermally engaging said second heat conducting platform; wherein
   h) the heat is transmitted from the primary heat source heat exit area through the first heat conducting elongated elements of the first level heat spreader unit to the first heat conducting platform, and subsequently the heat is transferred from said first heat conducting platform through the second heat conducting elongated elements of said second level heat spreader unit to the second level heat conducting platform, thus
   i) said first heat conducting platform is acting as the heat source for the second level heat spreader unit, and wherein
   j) a heat exit surface area of said first heat conducting platform is larger than the surface area of the primary heat source heat exit area, resulting in that the heat flux at the surface of the first heat conducting platform is smaller than the heat flux at the primary heat source heat exit area, and wherein
   k) a heat exit surface area of said second heat conducting platform is larger yet than the surface area of the first heat conducting platform, resulting in that the heat flux at the surface of the second heat conduction platform is smaller yet than the heat flux at the surface area of the first heat conducting platform, thus l) said multi-level heat spreader providing a greater reduction of the heat flux at the surface area of the second heat conducting platform compared to the heat flux at the primary heat source heat exit area, wherein m) said heat flux at the surface area of the second heat conducting platform is considerably smaller than the heat flux at the primary heat source heat exit area, and is better adapted to engage said final heat dissipating device, compared to the heat flux at the primary heat source heat exit area.

2. A multi-level heat spreader, as in claim 1, wherein the elongated elements of at least one of the first and second heat spreader units are parallel to each other.

3. A multi-level heat spreader, as in claim 1, wherein the elongated elements of at least one of the first and second heat spreader units are shaped to be spreading out, fanning out, from the small area of the heat source, to the larger area of the platform, wherein the elongated element at the center is perpendicular to the heat source, and the outwardly elongated elements are inclined on a certain angle with respect to the heat source, wherein the angle gets larger as the elongated elements get further away from the center.

4. A multi-level heat spreader, as in claim 1, wherein each one of the heat conducting elongated elements, of at least one of the first and second heat spreader units has various cross sectional areas along the length of the elongated elements, wherein the cross sectional area of the elongated elements is smaller near the foot of the elongated elements than the cross sectional area of the elongated elements near the head of the elongated elements.

5. A multi-level heat spreader, as in claim 1, wherein gaps between the elongated elements of at least one of the first and second heat spreader units are uniform in size, wherein the elongated elements have a narrow cross-section near the foot of elongated elements, near the heat source and have a larger cross-section near the head of the elongated elements, near the platform.

6. A multi-level heat spreader, as in claim 1, wherein the elongated elements of at least one of the first and second heat spreader units are curvilinear.

7. A multi-level heat spreader, as in claim 1, wherein the elongated elements of at least one of the first and second heat spreader units are parallel nested.

8. A multi-level heat spreader, as in claim 1, wherein the elongated elements of at least one of the first and second heat spreader units are shaped so that the foot of every elongated element is shaped to have a tip of the foot perpendicular to the surface that said tip is attached to, and the head of every elongated element is shaped to have a tip of the head perpendicular to the surface that said tip is attached to.

9. A multi-level heat spreader, as in claim 1, wherein the elongated elements of at least one of the first and second heat spreader units are shaped so that a tip of the foot of every elongated element is beveled, so that the surface of said beveled tip is along a plane, parallel to the surface of the heat source exit surface area, where said respective foot will be attached to.

10. A multi-level heat spreader, as in claim 1, wherein at least of the first and second elongated elements are made of flexible curvilinear wires, strings, or fibers, including heat conductive carbon fibers, or nano fibers.

11. A multi-level heat spreader, as in claim 1, wherein the platform of at least one of the first and second heat spreader units is thicker near its center and gets thinner as it gets closer to outside edges of the platform.

12. A multi-level heat spreader, as in claim 1, wherein each of the individual elements of the first and second heat spreader units is made of its respective individual material, having its respective physical properties and individual coefficient of thermal expansion (CTE) and its individual shapes and dimensions and wherein the first and second elongated elements are flexible enough to absorb and to accommodate any changes and differences in shapes and dimensions between the individual elements, due to changes in their temperatures and due to their respective original shapes and dimensions and coefficient of thermal expansion.

13. A multi-level heat spreader, as in claim 1, wherein the elongated elements of at least one of the first and second heat spreader units, and the platform to which these elongated elements are attached, are all created out of one single piece of material.

14. A multi-level heat spreader, as in claim 1, wherein the first and second heat conducting platforms of the heat spreader units have a rim, including an elevated ledge along the edges of the platform top surface, to help in containing any molten joining material used to join the elongated elements, when the first and second elongated elements get attached to their respective first and second heat conducting platforms, wherein the joining material is in a liquid state at any time during the joining process.

15. A multi-level heat spreader, as in claim 1, wherein the multi-level heat spreader comprises more than two levels of heat spreaders.

16. A multi-level heat spreader, as in claim 1, wherein the platform of at least one of the first and second heat spreader units comprises at least one extension, wherein at least one more heat spreader unit is attached to said extension.

17. A multi-level heat spreader, as in claim 16, wherein said extension is a flexible heat pipe.

18. A multi-level heat spreader, as in claim 16, wherein at least one of the first and second heat conducting platforms is supported by support means, which are anchored on to rigid bases, wherein said support means are designed to accommodate and to allow for free movements of the individual heat spreader elements.

19. A multi-level heat spreader, as in claim 1, wherein the elongated elements of at least one of the first and second heat spreader units are distributed along the surface of their respective heat conducting platforms in a distribution pattern, in one of the following group of patterns, comprising a rectangular pattern, a circular pattern, an hexagonal pattern, a triangular pattern, a radial pattern, and a linear pattern.

20. A multi-level heat spreader, as in claim 1, wherein tips of the feet of the elongated elements of at least one of the first and second heat spreader units are having a smaller cross-section than the cross-section along a length of the elongated elements, to facilitate the attachment of the elongated elements to their respective heat source and wherein the heat exit surface of the respective heat source is shaped to have individual recesses, forming individual pockets, each one of said pockets being shaped to receive one respective elongated element mounted on top of said recess.

21. A multi-level heat spreader, as in claim 20, wherein the pockets comprise anchor elements, wherein each one of said anchor elements is made of a material, which can be easily attached to both the elongated elements and to the pockets, and wherein said anchor elements act as isolated islands and are not touching any of the neighboring anchor elements, so that said island will not be affected by temperature variations and by their coefficient of thermal expansion (CTE), and wherein said islands can be located in a distribution pattern from the group comprising a rectangular pattern, a circular pattern, an hexagonal pattern, a triangular pattern, and a radial pattern, a linear pattern, and wherein said islands pattern matches the distribution pattern of the respective elongated elements which will be attached to said islands.

22. A multi-level heat spreader, as in claim 1, wherein one of the first and second heat conducting platforms is constructed to comprise at least one cooling device, wherein said cooling device utilizes the heat pipe cooling methods and principles, and wherein said cooling device is a heat pipe or vapor chamber, embedded in said platform.

23. A multi-level heat spreader, as in claim 22, wherein said cooling device is in the form of a vapor chamber, comprising wicking features, made of sintered material, wherein said sintered material is deposited onto inside wall surfaces of the vapor chamber, and at least one mound, said mound made of sintered material is provided within the vapor chamber, so that said mound would increase the rate of heat transfer of said vapor chamber, and wherein said vapor chamber allows additional fins to be attached to outside walls surfaces, so as to dispense heat outside the vapor chamber.

24. A multi-level heat spreader, as in claim 1, wherein the fist elongated elements are shaped to be curvilinear and parallel nested and oriented in a first orientation direction, and wherein the second elongated elements are also shaped to be curvilinear and parallel nested, and are oriented in a second orientation direction, wherein the second orientation direction is in a different orientation direction from the first orientation direction, so as to provide a certain degree of flexibility between the primary heat source and the final heat dissipating device, said certain degree of flexibility provides multi-directional degrees of freedom.

25. A multi-level heat spreader, as in claim 10, wherein the elongated elements are joined to their respective heat source and platform, by soldering or gluing, and wherein said elongated elements have a coating along their length, except for the foot and the head of said elongated elements, so that the coating material would not interfere with the process of joining said elongated elements to their respective heat source or platform.

26. A multi-level heat spreader, as in claim 22, wherein the vapor chamber comprises a serpentine coil, allowing certain coolant to flow through the serpentine coil, to enhance the cooling effect of the vapor chamber.

27. A multi-level heat spreader, as in claim 1, wherein at least one of the first level and second level heat spreader units comprises a flexible sleeve, wherein said flexible sleeve surrounds and encapsulates the first and second elongated elements, and a heat conductive fluid filler is inserted within the flexible sleeve, between the first, second heat conducting platforms and upper stage platforms and around the elongated elements, to further enhance the effectiveness of the heat spreader units.

28. A multi-level heat spreader, as in claim 1, wherein
at least one of the heat spreader units comprises a flexible sleeve, wherein said flexible sleeve contains a heat conducting gel-like material, wherein said gel-like material totally removes and replaces the elongated elements, to provide a greater amount of flexibility between the primary heat source and the final heat dissipating device, and wherein support means are provided to support the first level and second level heat spreader units, between the primary heat source and the final heat dissipating device.

* * * * *